(12) United States Patent  
Shaeffer et al.

(10) Patent No.: US 7,562,271 B2  
(45) Date of Patent: Jul. 14, 2009

(54) MEMORY SYSTEM TOPOLOGIES INCLUDING A BUFFER DEVICE AND AN INTEGRATED CIRCUIT MEMORY DEVICE

(75) Inventors: Ian Shaeffer, San Jose, CA (US); Ely Tsern, Los Altos, CA (US); Craig Hampel, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 152 days.

(21) Appl. No.: 11/697,572

(22) Filed: Apr. 6, 2007

(65) Prior Publication Data

US 2008/0080261 A1    Apr. 3, 2008

Related U.S. Application Data

(63) Continuation-in-part of application No. 11/460,899, filed on Jul. 28, 2006, which is a continuation-in-part of application No. 11/236,401, filed on Sep. 26, 2005, now Pat. No. 7,464,225.

(51) Int. Cl.  
*G01R 31/28* (2006.01)

(52) U.S. Cl. ........................... 714/724; 711/115

(58) Field of Classification Search ............... 714/724; 711/115, 167, 168, 169  
See application file for complete search history.

(56) References Cited

U.S. PATENT DOCUMENTS 4,621,339 A    11/1986    Wagner et al.  
4,631,666 A    12/1986    Harris et al.

(Continued)

FOREIGN PATENT DOCUMENTS

EP    0198429    10/1986

(Continued)

OTHER PUBLICATIONS

Notice of Allowance and Fee(s) Due, United States Patent & Trademark Office, U.S. Appl. No. 11/236,401, filed Sep. 26, 2005, Aug. 22, 2008.

(Continued)

*Primary Examiner*—Vu A Le  
(74) *Attorney, Agent, or Firm*—Vierra Magen Marcus & DeNiro LLP

(57) ABSTRACT

Systems, among other embodiments, include topologies (data and/or control/address information) between an integrated circuit buffer device (that may be coupled to a master, such as a memory controller) and a plurality of integrated circuit memory devices. For example, data may be provided between the plurality of integrated circuit memory devices and the integrated circuit buffer device using separate segmented (or point-to-point link) signal paths in response to control/address information provided from the integrated circuit buffer device to the plurality of integrated circuit buffer devices using a single fly-by (or bus) signal path. An integrated circuit buffer device enables configurable effective memory organization of the plurality of integrated circuit memory devices. The memory organization represented by the integrated circuit buffer device to a memory controller may be different than the actual memory organization behind or coupled to the integrated circuit buffer device. The buffer device segments and merges the data transferred between the memory controller that expects a particular memory organization and actual memory organization.

10 Claims, 38 Drawing Sheets

U.S. PATENT DOCUMENTS

| | | |
|---|---|---|
| 4,644,532 A | 2/1987 | George et al. |
| 4,667,305 A | 5/1987 | Dill et al. |
| 4,747,070 A | 5/1988 | Trottier et al. |
| 4,747,100 A | 5/1988 | Roach et al. |
| 4,858,107 A | 8/1989 | Fedele |
| 4,864,563 A | 9/1989 | Pavey et al. |
| 4,947,257 A | 8/1990 | Fernandez et al. |
| 4,965,799 A | 10/1990 | Green et al. |
| 4,977,498 A | 12/1990 | Rastegar et al. |
| 5,034,917 A | 7/1991 | Bland et al. |
| 5,068,650 A | 11/1991 | Fernandez et al. |
| 5,228,132 A | 7/1993 | Neal et al. |
| 5,228,134 A | 7/1993 | MacWilliams et al. |
| 5,243,703 A | 9/1993 | Farmwald et al. |
| 5,283,877 A | 2/1994 | Gastinel et al. |
| 5,301,278 A | 4/1994 | Bowater et al. |
| 5,307,320 A | 4/1994 | Farrer et al. |
| 5,325,493 A | 6/1994 | Herrell et al. |
| 5,355,467 A | 10/1994 | MacWilliams et al. |
| 5,371,880 A | 12/1994 | Bhattacharya |
| 5,392,407 A | 2/1995 | Hell et al. |
| 5,400,360 A | 3/1995 | Richards et al. |
| 5,408,646 A | 4/1995 | Olnowich et al. |
| 5,432,823 A | 7/1995 | Gasbarro et al. |
| 5,475,818 A | 12/1995 | Molyneaux et al. |
| 5,509,138 A | 4/1996 | Cash et al. |
| 5,511,224 A | 4/1996 | Tran et al. |
| 5,513,135 A | 4/1996 | Dell et al. |
| 5,513,377 A | 4/1996 | Capowski et al. |
| 5,537,394 A | 7/1996 | Abe et al. |
| 5,544,342 A | 8/1996 | Dean |
| 5,553,266 A | 9/1996 | Metzger et al. |
| 5,557,266 A | 9/1996 | Calvignac et al. |
| 5,574,945 A | 11/1996 | Elko et al. |
| 5,602,780 A | 2/1997 | Diem et al. |
| 5,604,735 A | 2/1997 | Levinson et al. |
| 5,606,717 A | 2/1997 | Farmwald et al. |
| 5,630,095 A | 5/1997 | Snyder |
| 5,638,334 A | 6/1997 | Farmwald et al. |
| 5,642,444 A | 6/1997 | Mostafavi |
| 5,644,541 A | 7/1997 | Siu |
| 5,655,113 A | 8/1997 | Leung et al. |
| 5,657,481 A | 8/1997 | Farmwald et al. |
| 5,659,710 A | 8/1997 | Sherman et al. |
| 5,701,313 A | 12/1997 | Purdham |
| 5,701,438 A | 12/1997 | Bains |
| 5,742,840 A | 4/1998 | Hansen et al. |
| 5,748,872 A | 5/1998 | Norman |
| 5,758,056 A | 5/1998 | Barr |
| 5,781,717 A | 7/1998 | Wu |
| 5,787,083 A | 7/1998 | Iwamoto et al. |
| 5,802,054 A | 9/1998 | Bellenger |
| 5,802,565 A | 9/1998 | McBride |
| 5,805,798 A | 9/1998 | Kearns et al. |
| 5,838,603 A | 11/1998 | Mori |
| 5,838,985 A | 11/1998 | Ohki |
| 5,845,108 A | 12/1998 | Yoo et al. |
| 5,848,145 A | 12/1998 | Gallagher et al. |
| 5,860,080 A | 1/1999 | James et al. |
| 5,867,180 A | 2/1999 | Katayama et al. |
| 5,867,422 A | 2/1999 | John |
| 5,883,839 A | 3/1999 | Tosaka et al. |
| 5,884,036 A | 3/1999 | Haley |
| 5,889,726 A | 3/1999 | Jeddeloh |
| 5,893,921 A | 4/1999 | Bucher et al. |
| 5,896,383 A | 4/1999 | Wakeland |
| 5,898,863 A | 4/1999 | Ofer et al. |
| 5,900,017 A | 5/1999 | Genduso et al. |
| 5,901,294 A | 5/1999 | Tran et al. |
| 5,911,052 A | 6/1999 | Singhal et al. |
| 5,913,044 A | 6/1999 | Tran et al. |
| 5,917,760 A | 6/1999 | Millar |
| 5,923,893 A | 7/1999 | Moyer et al. |
| 5,926,839 A | 7/1999 | Katayama |
| 5,953,215 A | 9/1999 | Karabatsos et al. |
| 5,982,238 A | 11/1999 | Soderquist |
| 5,987,576 A | 11/1999 | Johnson et al. |
| 6,006,318 A | 12/1999 | Hansen et al. |
| 6,016,282 A | 1/2000 | Keeth |
| 6,034,878 A | 3/2000 | Osaka et al. |
| 6,038,682 A | 3/2000 | Norman |
| 6,065,092 A | 5/2000 | Roy |
| 6,092,229 A | 7/2000 | Boyle et al. |
| 6,097,883 A | 8/2000 | Dell et al. |
| 6,104,417 A | 8/2000 | Nielsen et al. |
| 6,108,731 A | 8/2000 | Suzuki et al. |
| 6,125,419 A | 9/2000 | Umemura et al. |
| 6,142,830 A | 11/2000 | Loeffler |
| 6,151,648 A | 11/2000 | Haq |
| 6,154,821 A | 11/2000 | Barth et al. |
| 6,154,826 A | 11/2000 | Wulf et al. |
| 6,154,855 A | 11/2000 | Norman |
| 6,160,423 A | 12/2000 | Haq |
| 6,185,644 B1 | 2/2001 | Farmwald et al. |
| 6,185,654 B1 | 2/2001 | Van Doren |
| 6,208,273 B1 | 3/2001 | Dye et al. |
| 6,226,723 B1 | 5/2001 | Gustavson et al. |
| 6,247,100 B1 | 6/2001 | Drehmel et al. |
| 6,255,859 B1 | 7/2001 | Haq |
| 6,263,413 B1 | 7/2001 | Motomura et al. |
| 6,263,448 B1 | 7/2001 | Tsern et al. |
| 6,266,252 B1 | 7/2001 | Karabatsos |
| 6,272,609 B1 | 8/2001 | Jeddeloh |
| 6,276,844 B1 | 8/2001 | Coteus et al. |
| 6,292,877 B1 | 9/2001 | Ryan |
| 6,317,252 B1 | 11/2001 | Vahala et al. |
| 6,317,352 B1 | 11/2001 | Halbert et al. |
| 6,321,282 B1 | 11/2001 | Horowitz et al. |
| 6,327,205 B1 | 12/2001 | Haq |
| 6,330,667 B1 | 12/2001 | Klein |
| 6,330,687 B1 | 12/2001 | Griffith |
| 6,345,321 B1 | 2/2002 | Litaize et al. |
| 6,349,051 B1 | 2/2002 | Klein |
| 6,369,605 B1 | 4/2002 | Bonella et al. |
| 6,401,167 B1 | 6/2002 | Barth et al. |
| 6,408,402 B1 | 6/2002 | Norman |
| 6,414,868 B1 | 7/2002 | Wong et al. |
| 6,414,904 B2 | 7/2002 | So et al. |
| 6,425,064 B2 | 7/2002 | Soderquist |
| 6,434,035 B2 | 8/2002 | Miersch et al. |
| 6,442,057 B1 | 8/2002 | Song et al. |
| 6,442,644 B1 | 8/2002 | Gustavson et al. |
| 6,446,158 B1 | 9/2002 | Karabatsos |
| 6,449,213 B1 | 9/2002 | Dodd et al. |
| 6,449,679 B2 | 9/2002 | Ryan et al. |
| 6,449,703 B2 | 9/2002 | Jeddeloh |
| 6,449,727 B1 | 9/2002 | Toda |
| 6,477,592 B1 | 11/2002 | Chen et al. |
| 6,477,614 B1 | 11/2002 | Leddige et al. |
| 6,480,409 B2 | 11/2002 | Park et al. |
| 6,480,927 B1 | 11/2002 | Bauman |
| 6,487,102 B1 | 11/2002 | Halbert et al. |
| 6,493,250 B2 | 12/2002 | Halbert et al. |
| 6,502,161 B1 | 12/2002 | Perego et al. |
| 6,510,503 B2 | 1/2003 | Gillingham et al. |
| 6,513,080 B1 | 1/2003 | Haq |
| 6,513,091 B1 | 1/2003 | Blackmon et al. |
| 6,516,365 B2 | 2/2003 | Horotwitz et al. |
| 6,526,469 B1 | 2/2003 | Drehmel et al. |
| 6,530,006 B1 | 3/2003 | Dodd et al. |
| 6,530,033 B1 | 3/2003 | Raynham et al. |
| 6,553,450 B1 | 4/2003 | Dodd et al. |
| 6,557,069 B1 | 4/2003 | Drehmel et al. |
| 6,587,912 B2 | 7/2003 | Leddige et al. |

| | | | |
|---|---|---|---|
| 6,604,180 B2 | 8/2003 | Jeddeloh |
| 6,622,224 B1 | 9/2003 | Cloud |
| 6,625,687 B1 | 9/2003 | Halbert et al. |
| 6,633,947 B1 | 10/2003 | Holman et al. |
| 6,639,820 B1 | 10/2003 | Khandekar et al. |
| 6,643,752 B1 | 11/2003 | Donnelly et al. |
| 6,684,263 B2 | 1/2004 | Horotwitz et al. |
| 6,690,191 B2 | 2/2004 | Wu et al. |
| 6,690,726 B1 | 2/2004 | Yavits et al. |
| 6,701,446 B2 | 3/2004 | Tsern et al. |
| 6,708,248 B1 | 3/2004 | Garrett, Jr. et al. |
| 6,714,433 B2 | 3/2004 | Doblar et al. |
| 6,720,643 B1 | 4/2004 | Fox et al. |
| 6,742,098 B1 | 5/2004 | Halbert et al. |
| 6,754,117 B2 | 6/2004 | Jeddeloh |
| 6,820,163 B1 | 11/2004 | McCall et al. |
| 6,842,864 B1 | 1/2005 | Barth et al. |
| 6,853,938 B2 | 2/2005 | Jeddeloh |
| 6,854,042 B1 | 2/2005 | Karabatsos |
| 6,877,079 B2 | 4/2005 | Yoo et al. |
| 6,889,284 B1 | 5/2005 | Nizar et al. |
| 6,968,419 B1 | 11/2005 | Holman |
| 6,970,968 B1 | 11/2005 | Holman |
| 7,007,130 B1 | 2/2006 | Holman |
| 7,010,629 B1 | 3/2006 | Frame et al. |
| 7,110,400 B2 | 9/2006 | Hronik |
| 7,275,189 B2 | 9/2007 | Ruckerbauer et al. |
| 7,320,047 B2 | 1/2008 | Perego et al. |
| 7,321,997 B2 | 1/2008 | Zimmerman et al. |
| 2001/0039606 A1 | 11/2001 | Jeddeloh |
| 2002/0024834 A1 | 2/2002 | Jeon et al. |
| 2002/0083287 A1 | 6/2002 | Zumkehr et al. |
| 2002/0112119 A1 | 8/2002 | Halbert |
| 2002/0124153 A1 | 9/2002 | Litaize et al. |
| 2002/0135394 A1 | 9/2002 | Ahn et al. |
| 2002/0144071 A1 | 10/2002 | Williams et al. |
| 2002/0184462 A1 | 12/2002 | Jeddeloh |
| 2003/0012229 A1 | 1/2003 | Braun |
| 2003/0018880 A1 | 1/2003 | Litaize et al. |
| 2003/0074490 A1 | 4/2003 | Pochmuller |
| 2003/0090879 A1 | 5/2003 | Doblar et al. |
| 2003/0120895 A1 | 6/2003 | Litaize et al. |
| 2003/0177313 A1 | 9/2003 | Iyer et al. |
| 2004/0015650 A1 | 1/2004 | Zumkehr et al. |
| 2004/0085795 A1 | 5/2004 | Braun et al. |
| 2004/0095838 A1 | 5/2004 | Li |
| 2004/0105292 A1 | 6/2004 | Matsui |
| 2004/0133736 A1 | 7/2004 | Kyung |
| 2004/0143773 A1 | 7/2004 | Chen |
| 2004/0145935 A1 | 7/2004 | Jakobs |
| 2004/0221106 A1 | 11/2004 | Perego |
| 2004/0246767 A1 | 12/2004 | Vogt |
| 2004/0246785 A1 | 12/2004 | Vogt |
| 2004/0246786 A1 | 12/2004 | Vogt |
| 2004/0250024 A1 | 12/2004 | Vogt |
| 2004/0250153 A1 | 12/2004 | Vogt |
| 2004/0250181 A1 | 12/2004 | Vogt et al. |
| 2004/0256638 A1 | 12/2004 | Perego |
| 2004/0257847 A1 | 12/2004 | Matsui |
| 2004/0260991 A1 | 12/2004 | Vogt et al. |
| 2004/0267481 A1 | 12/2004 | Resnick et al. |
| 2006/0095592 A1 | 5/2006 | Borkenhagen |
| 2007/0070669 A1 | 3/2007 | Tsern |

FOREIGN PATENT DOCUMENTS

| | | |
|---|---|---|
| EP | 0282070 B1 | 8/1994 |
| EP | 0811916 A2 | 12/1997 |
| EP | 0813204 A2 | 12/1997 |
| EP | 1069509 A2 | 1/2001 |
| GB | 2383656 A | 7/2003 |
| JP | 2004139552 A2 | 5/2004 |
| WO | 9930240 | 6/1999 |
| WO | 9941666 | 8/1999 |
| WO | 9941667 | 8/1999 |
| WO | 200225454 A2 | 3/2002 |
| WO | WO2004111856 A1 | 12/2004 |
| WO | 2005066965 A2 | 7/2005 |
| WO | 2007028109 A2 | 3/2007 |

OTHER PUBLICATIONS

Amendment Under 37 CFR 1.114 Submitted With RCE, U.S. Appl. No. 11/236,401, filed Sep. 26, 2005, Jul. 24, 2008.

Notice of Allowance and Fee(s) Due, United States Patent & Trademark Office, U.S. Appl. No. 11/236,401, filed Sep. 26, 2005, May 8, 2008.

Response to Restriction Requirement, U.S. Appl. No. 11/236,401, filed Sep. 26, 2005, Feb. 12, 2008.

Kristiansen, et al., "Scalable Coherent Interface," Feb. 1989.

Doettling, et al., "S/390 Parallel Enterprise Server Generation 3: A Balanced System and Cache Structure," IBM J. Res. Develop., vol. 41 (No. 4/5), Jul./Sep. 1997, pp. 405-428.

JEDEC Standard-"FBDIMM Specification: High Speed Differential PTP Link at 1.5V," JESDS-18, Sep. 2006, available at "http://www.jedec.org/download/search/JESD8-18.pdf".

European Search Report, E05001769 dated May 18, 2006.

International Search Report dated May 2, 2007 in International Application No. PCT/US2006/036894.

Intel Developer Forum, "DDR2 Memory In 2004 Servers—Recipes For Successful Designs", Sep. 2003.

QBM Alliance, Platform Conference, Quad Band Memory (QBM tm): DDR 200/266/333 devices producing DDR400/533/667, Jan. 23-24, 2002.

Karabatsos, C., "Quad Band Memory (QBM) Technology", Kentron Technologies, Inc., Apr. 2001.

Quad Band Memory (QBM), "The 'QBM Enabled' VIA PT880/PM880 Chipset Solutions with the Fastest Memory".

Weber, F., "The AMD Athlon Processor: Future Directions", AMD.

Intel 82804AA Memory Repeater Hub for SDRAM (MRH-S) Datasheet, Intel Corp., pp. 2-48 (Nov. 1999).

"Intel 82805AA Memory Translater Hub (MTH) Datasheet", Intel Corp., pp. 1-48 (Nov. 1999).

Cataldo, A., "TI Fields DSP-Based Media Processor on a DIMM", EE Times (Jan. 2000).

Mac Williams, P., "PC Memory Directions For 1999 and Beyond", Intel Developer Forum, pp. 1-10 (Sep. 1998).

Johnson, B., "Direct RDRAM Basic Architecture and Program Overview", Intel Developer Forum, pp. 1-14 (Sep. 1998).

Gillingham, P., "SLDRAM Architectural and Functional Overview", SLDRAM Consortium, SLDRAM Inc., pp. 1-14 (Aug. 1997).

Draft Standard for a High-Speed Memory Interface (Synclink), Draft 0.99 IEEE P1596.7-199X, IEEE Inc., pp. 1-51 (1996).

Wiggers, H., "SyncLink A Proposal for an Implementation of IEEE P1596.4", Hewlett Packard, pp. 1-20 (Mar. 1995).

"KMM377S1620CT2 SDRAM Module Datasheet", Samsung Electronics Inc., pp. 1-2 (Nov. 1998).

"SLD4M18DR400 4MEG×18 SLDRAM Datasheet", SLDRAM Inc., pp. 1-69 (Jul. 1998).

Poulton, J., "Signaling in High Performance Memory Systems", IEEE Solid State Circuits Conference, slides 1-59 (Feb. 1999).

"SLDRAM 400Mb/s/pin Command/Address Repeater", SLD10400 Rev .5, SLDRAM Consortium, pp. 1-12 (Jan. 7, 1998).

Minutes of meeting No. 75 JEDEC JC-42.3 Committee on RAM Memories, and referenced attachment "Y" of the presentation titled "SyncLink", May 24, 1995, New Orleans.

Intel Developer Forum, "Fully Buffered DIMM (FB-DIMM) Server Memory Architecture: Capacity, Performance, Reliability, and Longevity", Feb. 18, 2004.

Intel Developer Forum, "Fully Buffered DIMM (FB-DIMM) Design Considerations", Feb. 18, 2004.

IEEE Standard for Scalable Coherent Interface (SCI), "Microprocessor and Microcomputer Standards Subcommittee of the IEEE Computer Society", IEEE Std 1596-1992.

SCI, "P1596: SCI, A Scalable Coherent Interface", Nov. 28, 1988.

Gustavson et al., Draft "The Scalable Coherent Interface Project (SuperBus)", SCI, Aug. 22, 1988, Rev. 14.
Schanke, "Proposal for Clock Distribution in SCI", SCI, May 5, 1989.
James, "Scalable I/O Architecture for Buses", COMPCON Spring 1989, SCI, Nov. 28, 1988.
Volz et al., "Position Paper On Global Clock For the Futurebus +", SCI, 1989.
Kristiansen et al., "Scalable Coherent Interface", to appear in Eurobus Conference Proceedings, May 1989.
Gustavson et al., "Macintosh HD:Desktop Folder:SLDRAMrepeaterConcerns", Sunday, Nov. 23, 1997, 4 pages.
Jeddeloh, Joe, "Fully Buffered DIMM (FB-DIMM)", Advanced Systems Technology, Micron Technology, Inc. Apr. 15-16, 2004.
PCT International Search Report (Jun. 27, 2001) 4 pages.
U.S. Appl. No. 10/713,868, filed Nov. 14, 2003 by Pete D. Vogt.
U.S. Appl. No. 10/714,025, filed Nov. 14, 2003 by Pete D. Vogt.
U.S. Appl. No. 10/714,026, filed Nov. 14, 2003 by Pete D. Vogt.
U.S. Appl. No. 10/883,474, filed Jun. 30, 2004 by Pete D. Vogt.
U.S. Appl. No. 10/882,999, filed Jun. 30, 2004 by Pete D. Vogt.
U.S. Appl. No. 10/859,438, filed May 31, 2004 by Pete D. Vogt.
U.S. Appl. No. 10/858,850, filed May 31, 2004 by Pete D. Vogt.
U.S. Appl. No. 10/859,060, filed May 31, 2004 by Pete D. Vogt.
Ng, R. (Sun Microsystems Inc.), "Fast computer memories", IEEE Spectrum, Oct. 1992, pp. 36-39.
Salters, R.H.W. (Philips Research Laboratories), "Fast DRAMS for sharper TV", IEEE Spectrum, Oct. 1992, pp. 40-42.
Jones, F (United Memories, Inc.), "A new era of fast dynamic RAMs", IEEE Spectrum, Oct. 1992, pp. 43-49.
Farmwald, M. et al. (Rambus Inc.), "A fast path to one memory", IEEE Spectrum, Oct. 1992, pp. 50-51.
Gjessing, S. (University of Oslo), Gustavson, D.B (Stanford Linear Accelerator Center), James, D. et al. (Apple Computer Inc.), Wigger, H. (Hewlett-Packard Co.), "A RAM link for high speed", IEEE Spectrum, Oct. 1992, pp. 52-53.
The Institute of Electrical and Electronics Engineering , Inc., "IEEE Standard for High-Bandwidth Memory Interface Based on Scalable Coherent Interface (SCI) Signaling Technology (RamLink)", 1996, pp. 1-91.
Microsolft Press Computer Dictionary, 3rd Ed., 1997, pp. 48 and 68.
JEDEC Standard No. 21-C, pp. 4.20.4-1 through 4.20.4-69, 4.20.4-184 PIN, PC1600/2100 DDR SDRAM Registered DIMM Design Specificationm, Revision 1.2.
Micron, 240-Pin 256MB, 512MB, 1GB DDR2 SDRAM FBDIMM (SR, FB×72) Features, Micron Technology, Inc., 2004, pp. 1-36.
Micron, 256MB, 512MB, 1GB:(×72, ECC, DR) 168-Pin SDRAM RDIMM, Synchronous DRAM Module, Micron Technology, Inc., 2001, pp. 1-28.
Lizy Kurian John, "VaWiRAM: A Variable Width Random Access Memory Module", 9th International Conference on VLSI Design, Jan. 1996, pp. 219-224, 1995 IEEE.
Rambus Inc. Data Sheet, "16/18Mbit (2M×8/9) & 64/72Mbit (8M×8/9) Concurrent RDAM", Jul. 1996, pp. 1-61.
Rambus Inc. Data Sheet, "16/18Mbit (2M8/9) Concurrent RDRAM," Mar. 1996, 33 pages.
Rambus Inc. Data Sheet, "8/9-Mbit (1M×8/9) and 16/18-Mbit (2M×8/9) RDRAM", Mar. 1996, pp. 1-30.
IBM, "184 Pin DIMM Design Updates/Ramifications for Unbuffered and Registered DDR DIMMS", jc-42.5 Dec. 1999, pp. 1-12.
Nakase et al., "Source-Synchronization and Timing Vernier Techniques for 1.2-GB/s SLDRAM Interface," IEEE Journal of Solid-State Circuits, vol. 34, No. 4, Apr. 1999.
Preliminary publication of JEDEC Semiconductor Memory Standards, 64 MEG: x4, x8, x16 DDR SDRAM, Double Data Rate (DDR) SDRAM, Aug. 1999, pp. 1-72.
IBM, Micron Technology, and Reliance Computer Corporation, "DDR SDRAM Registered DIMM," Design Specification Revision 0.6, Nov. 1999, pp. 1-58.
IBM, "ApplicationNote DDR SDRAM Module Serial Presence Detect Definitions," Oct. 1999, pp. 1-34.
Desi Rhoden, Advanced Memory International, Inc., Platform99, Standard DRAM Futures and DDR Infrastructures, Jul. 21 & 22, 1999.
Lluis Paris et al., Mosaid Technologies Inc., A 800MB/s 72Mb SLDRAM with Digitally-Calibrated DLL, 1999 IEEE International Solid-State Circuits Conference.
Graham Allan, Mosaid Technologies Inc., "DDR SDRAM/SGRAM An Interpretation of the JEDEC Standard," Sep. 25, 1998.
Minutes of Meeting No. 33, JC-16 Committee on Voltage Level and Interface, Mar. 2, 1999.
Rambus Inc., "Direct RDRAM 256/288-Mbit (512K×16/18×32s)," Aug. 1999, pp. 1-66.
Peter Gillingham et al., "SLDRAM: High-Performance, Open-Standard Memory," IEEE Micro, Nov./Dec. 1997, pp. 29-39.
Rambus Inc., RDRAM Annotated Specification 4.1.2 , 1997.
International Search Report & The Written Opinion of the International Searching Authority, Patent Cooperation Treaty, Application No. PCT/US2008/059268 filed on Apr. 3, 2008, Sep. 23, 2008.
Preliminary Amendment, U.S. Appl. No. 11/236,401, filed Nov. 9, 2007.

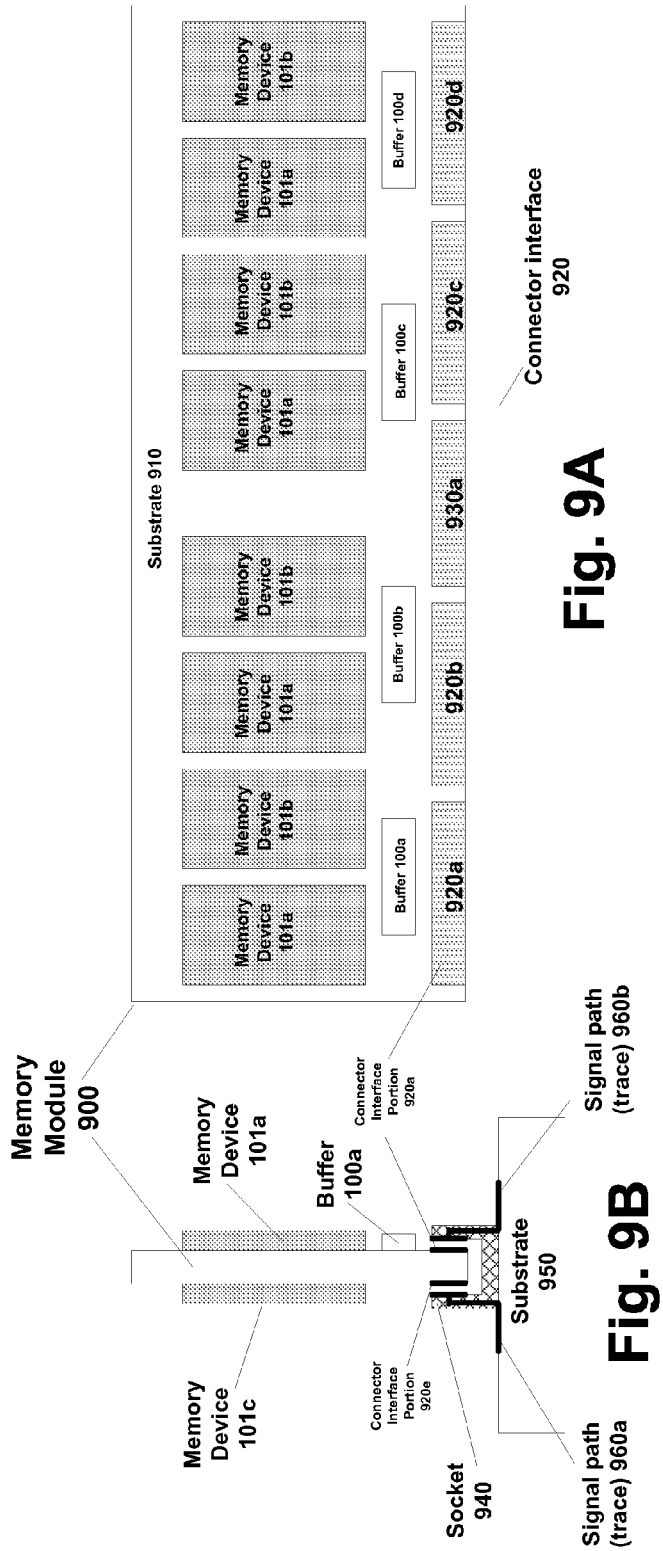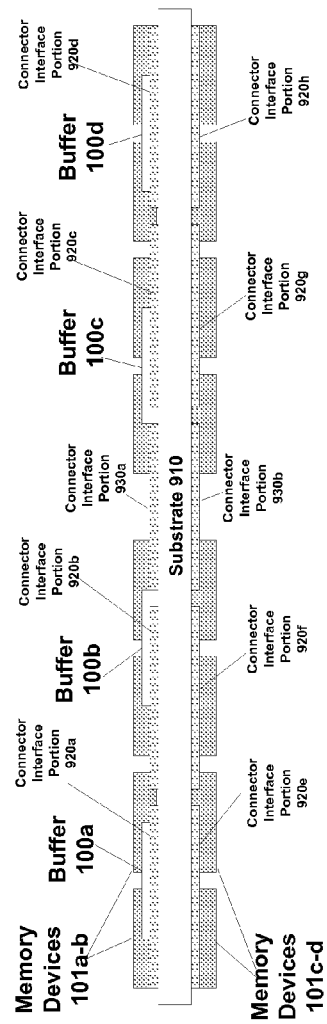
Fig. 9A
Fig. 9B
Fig. 9C

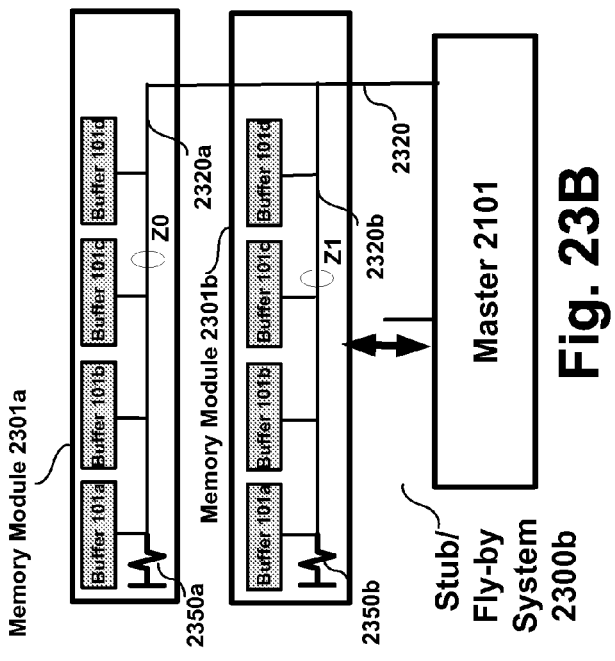
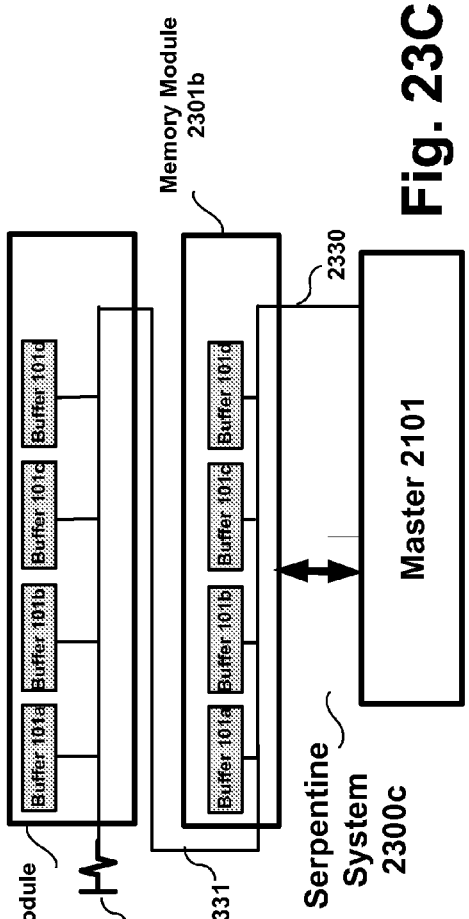
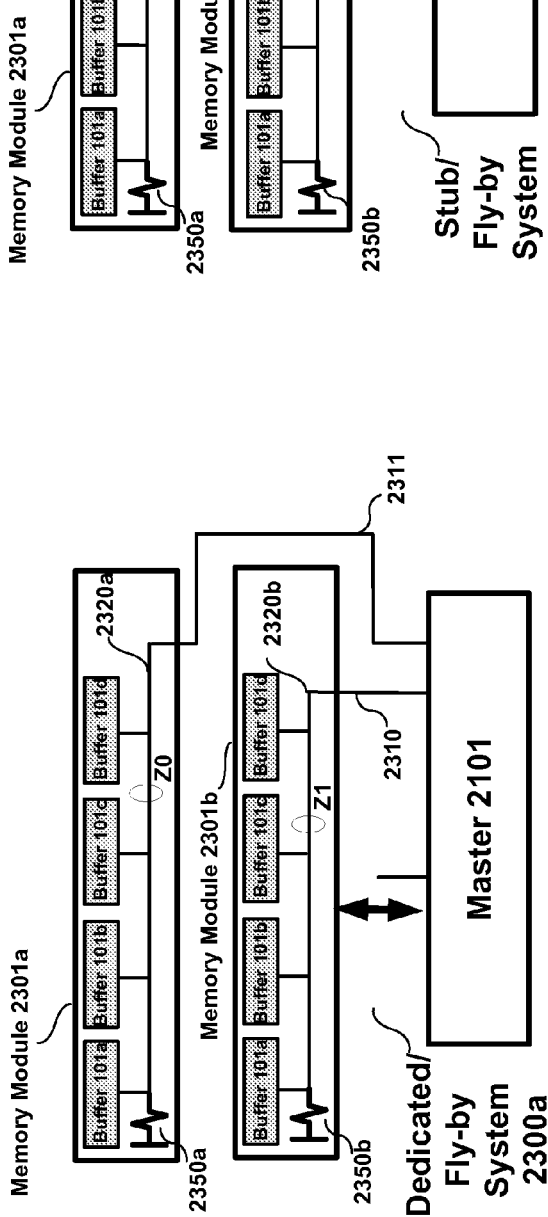

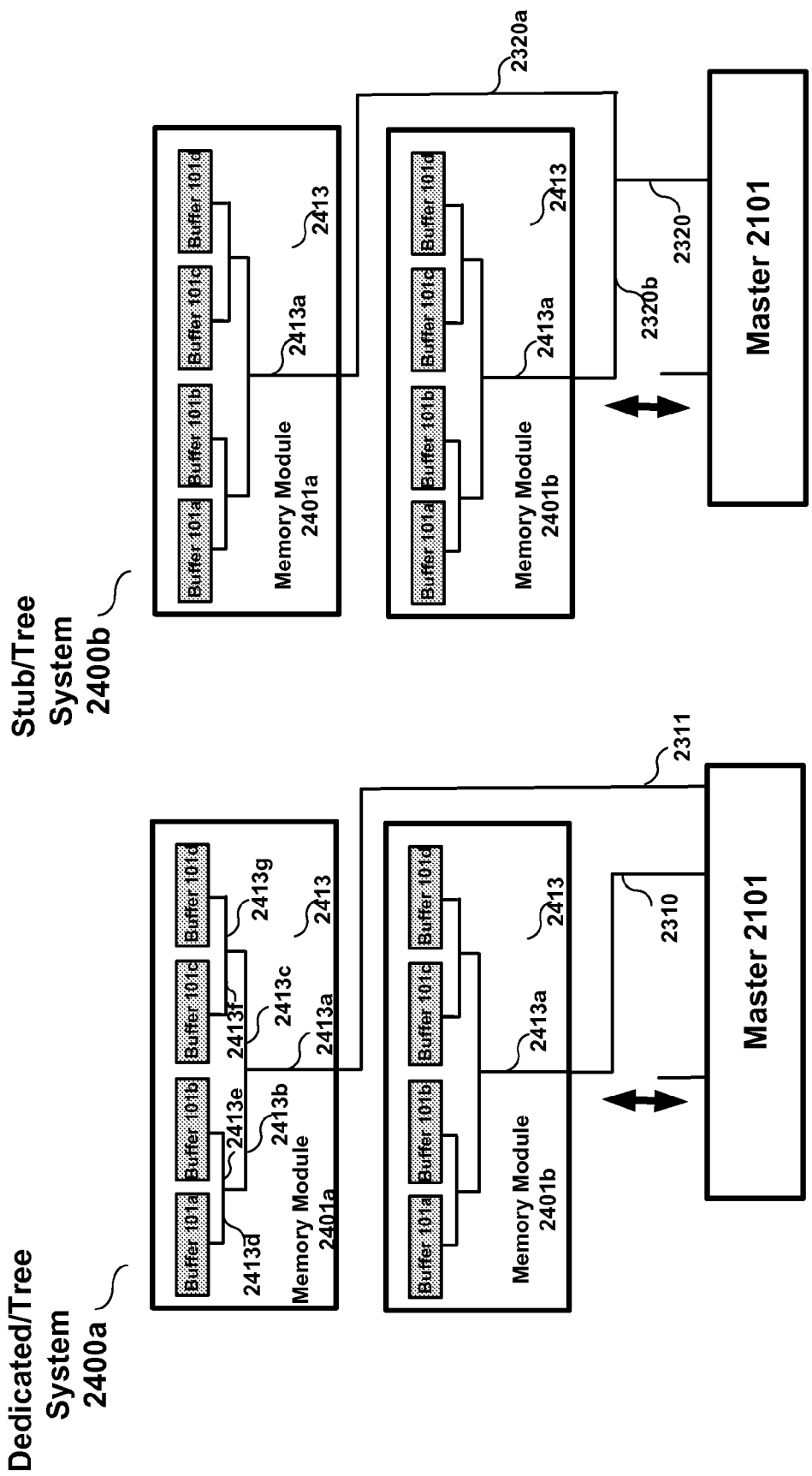

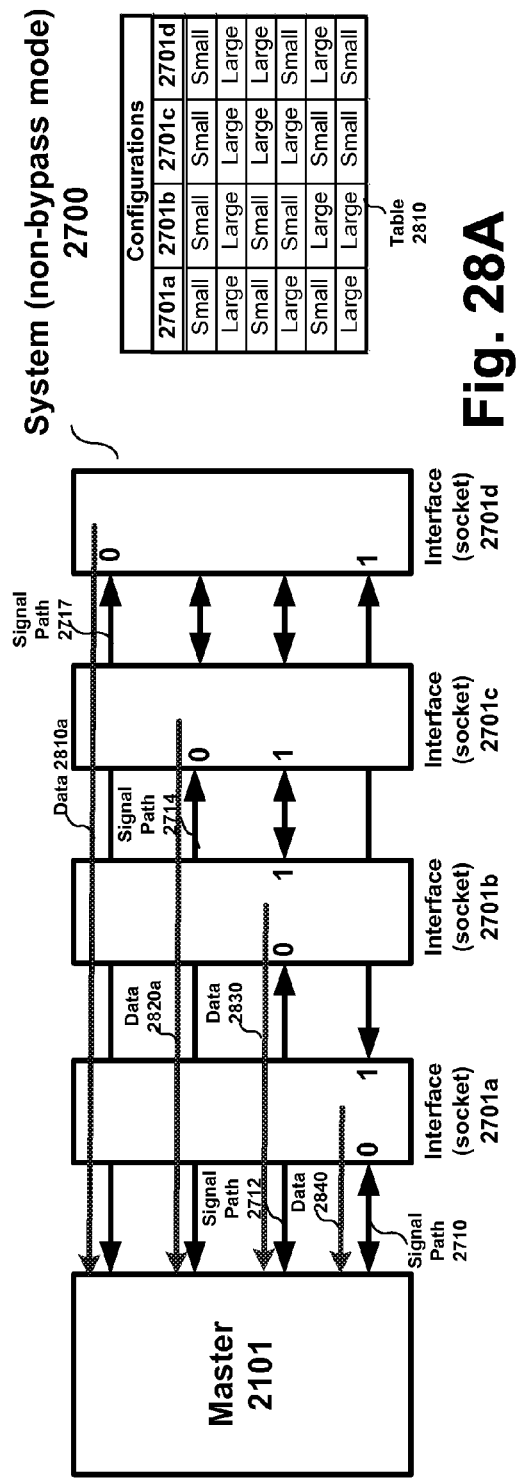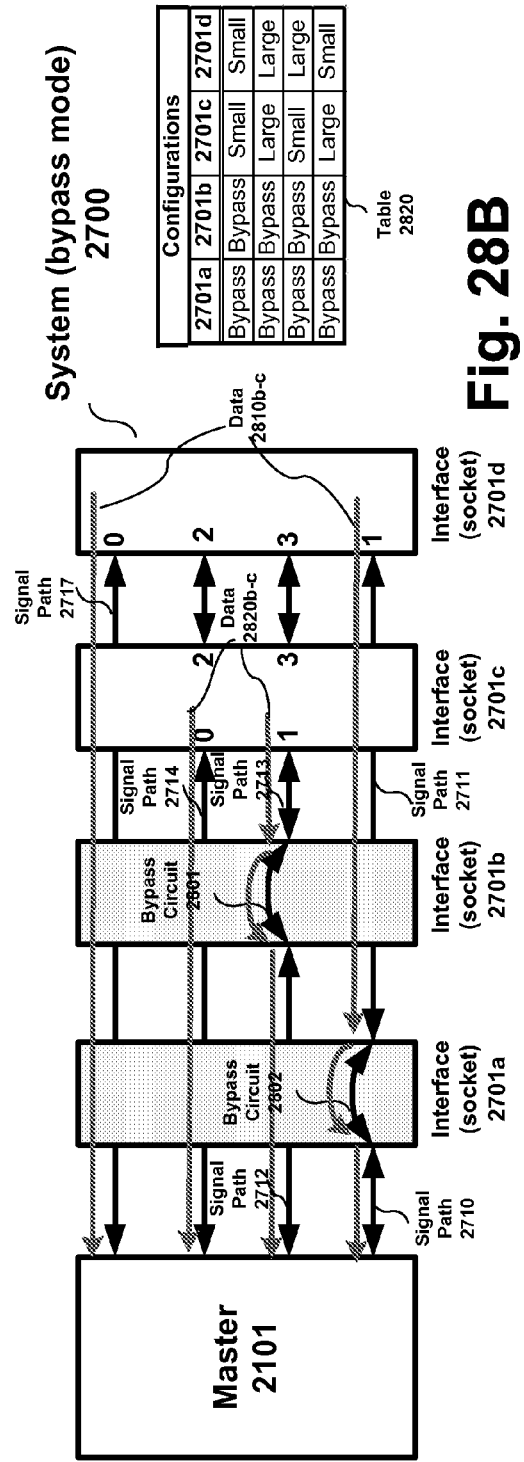
Fig. 28A
Fig. 28B

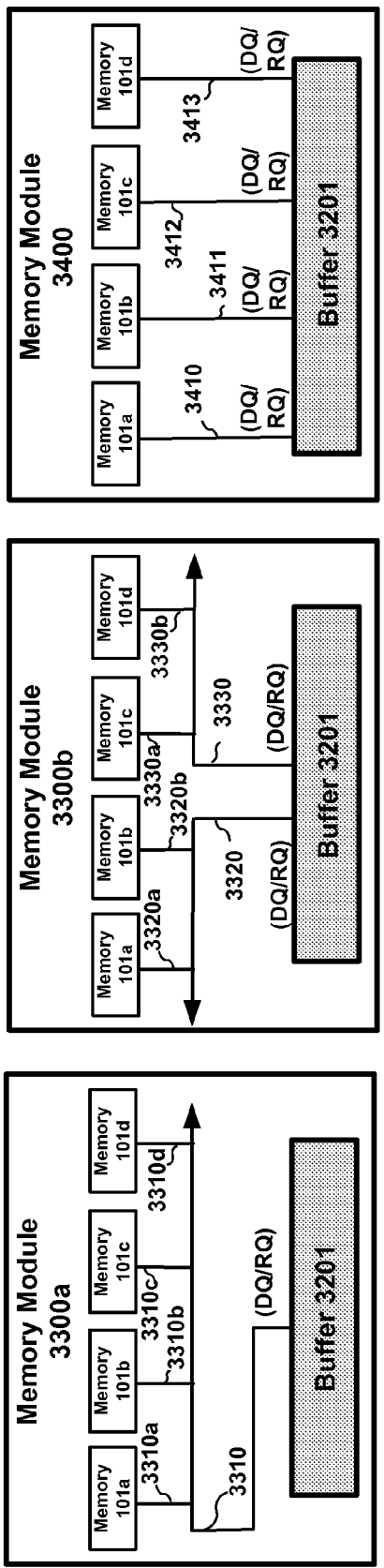
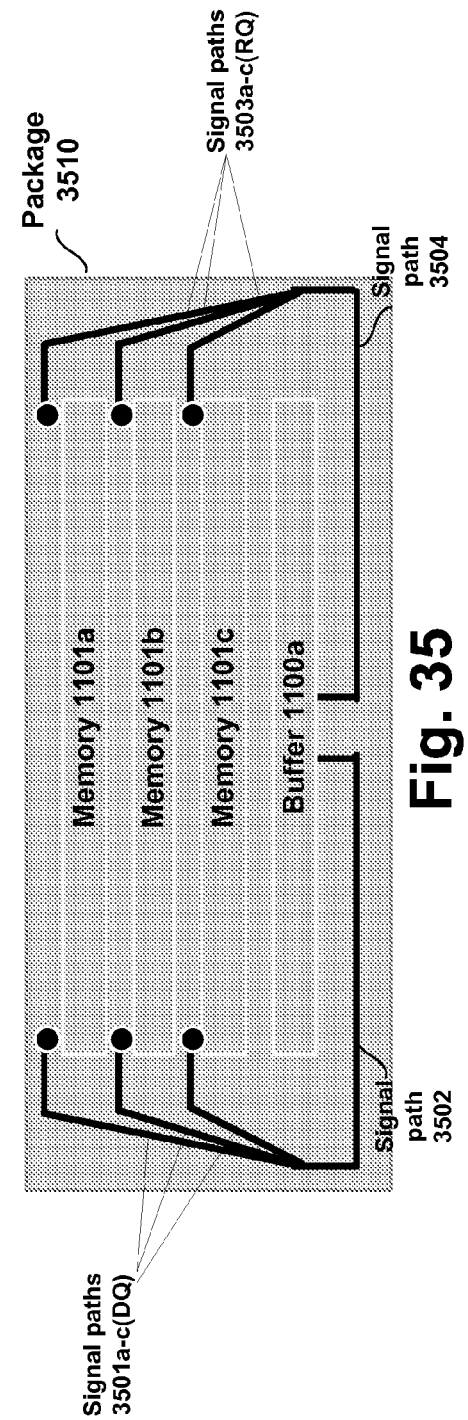
Fig. 33A
Fig. 33B
Fig. 34
Fig. 35

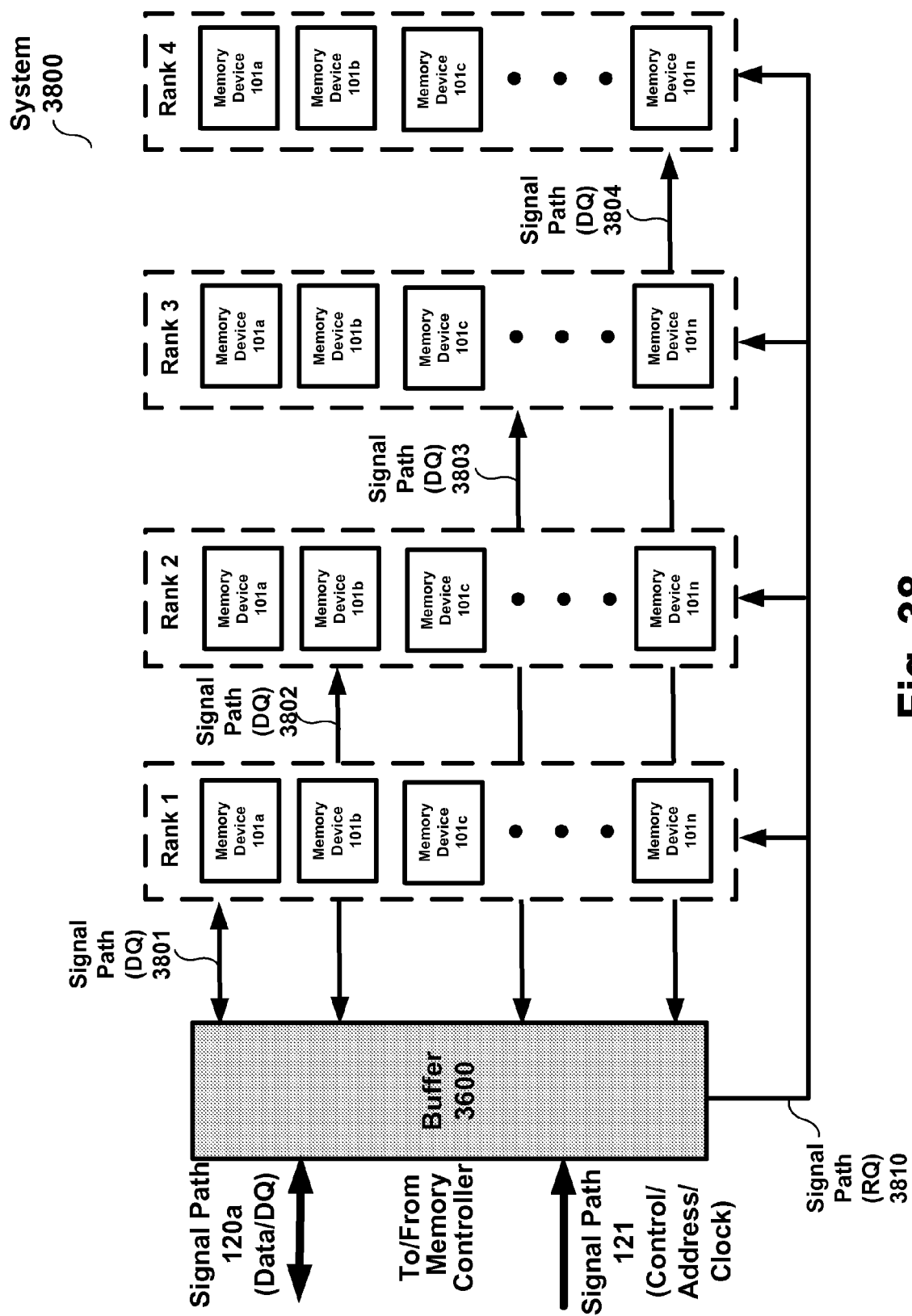

MEMORY SYSTEM TOPOLOGIES INCLUDING A BUFFER DEVICE AND AN INTEGRATED CIRCUIT MEMORY DEVICE

RELATED APPLICATION

This application is a continuation-in-part of U.S. patent application Ser. No. 11/460,899 filed on Jul. 28, 2006 (still pending) which is a continuation-in-part of U.S. patent application Ser. No. 11/236,401 filed on Sep. 26, 2005 (still pending).

FIELD OF THE INVENTION

The present invention generally relates to integrated circuit devices, high speed signaling of such devices, memory devices, and memory systems.

BACKGROUND

Some contemporary trends predict that processors, such as general purpose microprocessors and graphics processors, will continue to increase system memory and data bandwidth requirements. Using parallelism in applications such as multi-core processor architectures and multiple graphics pipelines, processors should be able to drive increases in system bandwidths at rates some predict will be doubled every three years for the next ten years. There are several major trends in dynamic random access memory ("DRAM") that may make it costly and challenging to keep up with increasing data bandwidth and system memory requirements. For example, transistor speed relative to feature size improvements in a given DRAM technology node, and the rising costs of capital investment required to move DRAM technology to greater memory densities for a given DRAM die adversely affect the rate at which DRAM technology can keep pace with the increasing data bandwidth and system capacity requirements.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 9A illustrates a top view of a memory module topology including a plurality of integrated circuit memory devices and a plurality of integrated circuit buffer devices;

FIG. 9B illustrates a side view of a memory module topology including a plurality of integrated circuit memory devices and a plurality of integrated circuit buffer devices;

FIG. 9C illustrates a bottom view of a memory module topology including a plurality of integrated circuit memory devices and a plurality of integrated circuit buffer devices;

FIGS. 23A-C and 24A-B illustrate memory system topologies including a master to provide control/address information to a plurality of integrated circuit buffer devices;

FIGS. 28A-B illustrate memory systems including a master and four memory modules operating during a first mode and second mode of operation (bypass mode);

FIGS. 33A-B illustrate fly-by topologies (data and/or control/address information) between an integrated circuit buffer device and a plurality of integrated circuit memory devices;

FIG. 34 illustrates point-to-point (also known as segmented) topology (data and/or control/address information) between an integrated circuit buffer device and a plurality of integrated circuit memory devices;

FIG. 35 illustrates an MCP (or system-in-a-package ("SIP") topology (data and/or control/address information) between an integrated circuit buffer die and a plurality of integrated circuit memory dies;

FIG. 38 illustrates a buffer device and a plurality of integrated circuit memory devices in different ranks;

DETAILED DESCRIPTION

Figure 1:
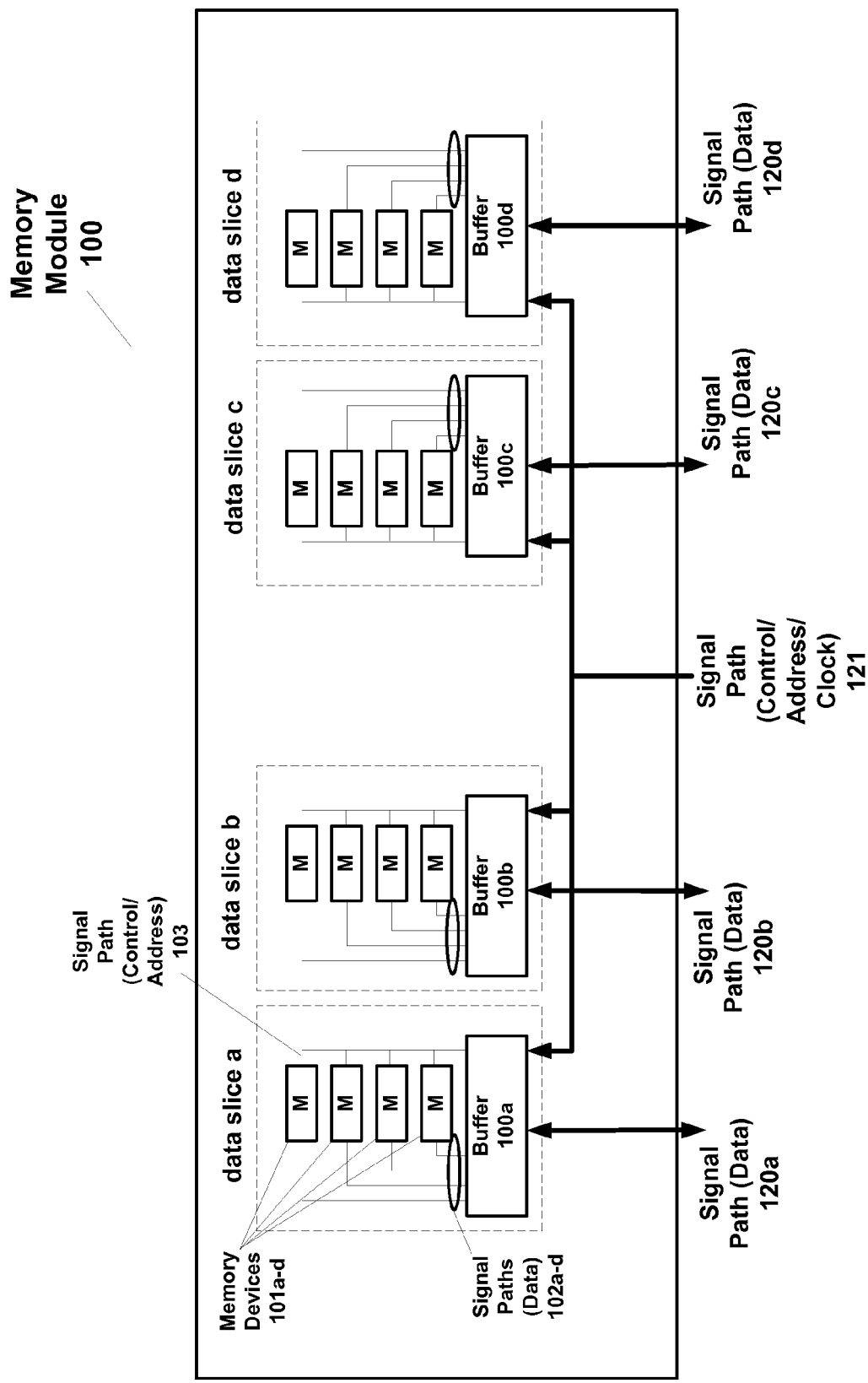
FIG. 1 illustrates a memory module topology including a plurality of integrated circuit memory devices and a plurality of integrated circuit buffer devices.

Systems, among other embodiments, include topologies for transferring data and/or control/address information between an integrated circuit buffer device (that may be coupled to a master, such as a memory controller) and a plurality of integrated circuit memory devices. For example, data may be provided between the plurality of integrated circuit memory devices and the integrated circuit buffer device using separate segmented (or point-to-point link) signal paths in response to control/address information provided from the integrated circuit buffer device to the plurality of integrated circuit buffer devices using a single fly-by (or bus) signal path. Other topology types may include forked, star, fly-by, segmented and topologies used in SIP or MCP embodiments.

An integrated circuit buffer device enables configurable effective memory organization of a plurality of integrated circuit memory devices. The memory organization represented by the integrated circuit buffer device to a memory controller may be different than the actual memory organization behind or coupled to the integrated circuit buffer device. For example, control/address information may be provided to the buffer device from a memory controller that expects a memory organization having a predetermined number of memory devices and memory banks as well as page size and peak bandwidth, but the actual memory organization coupled to the buffer device is different. The buffer device segments and/or merges the data transferred between the memory controller that expects a particular memory organization and the actual memory organization. The integrated circuit buffer device may merge read data from separate memory devices into a stream of read data. Likewise, the integrated circuit memory device may segment a write data into write data portions that are stored on a plurality of memory devices.

An integrated circuit buffer device may include data path, address translation, data path router, command decode and control (or register set) circuits. The buffer device also includes an interface that may be configured into at least three different segmentation modes: 1) Four 4-bit interfaces (4×4), 2) Two 4-bit interfaces (2×4) or 3) Two 8-bit interfaces (2×8). The different configurations allow flexibility in memory module or memory stack configurations. The buffer device may also include a pattern generator and internal memory array circuit to emulate storing and retrieving data from the plurality of integrated circuit memory devices.

The buffer device may increase memory system performance by; for example, eliminating a "time bubble" or idle time for a signal path (bus) turnaround between memory transactions to different ranks of integrated circuit memory devices coupled to segmented data signal paths. A memory rank may also include a single integrated circuit memory device. Eliminating the need for the memory controller to track memory rank access and inserting time bubbles may reduce memory controller complexity. Memory modules or memory rank capacity may be expanded using segmented data signal paths without decreasing bandwidth caused by bubble time insertion. Memory modules may include more memory devices or dies while still emulating a single rank memory module.

According to embodiments, a system includes a master device and a first memory module having a plurality of integrated circuit memory devices and a plurality of integrated circuit buffer devices that operate in first and second modes of operation (bypass mode). In a first mode of operation, a first memory module provides read data from the plurality of integrated circuit memory devices (via an integrated circuit buffer device) on a first signal path to the master and a second memory module simultaneously provides read data from its plurality of integrated circuit memory devices (via another integrated circuit buffer device on the second module) on a third signal path coupled to the master device. In a second mode of operation, the first memory module provides first read data from its plurality of integrated circuit memory devices (via the integrated circuit buffer device) on the first signal path and second read data from its plurality of integrated circuit memory devices (via the integrated circuit buffer device) on a second signal path that is coupled to a second memory module. An integrated circuit buffer device in the second memory module then bypasses the second read data from the second signal path and provides the second read data on a third signal path coupled to the master device. The first memory module may have a larger address space or capacity, such as twice as large, as compared to the second memory module.

Similarly, write data may be provided from the master device to the first and second memory modules during the first and second modes of operation.

According to embodiments, the second memory module includes a bypass circuit (such as in the integrated circuit buffer device, interface or in continuity memory module) to transfer the second read data from the second signal path to the third signal path. The bypass circuit may include a jumper, signal trace and/or semiconductor device. The bypass circuit may also include delay circuits for adding delay in outputting the read data (or levelizing) from a memory module.

According to embodiments, a system includes a master device and at least four memory modules wherein at least two memory modules have different capacities than the other two memory modules. The four memory modules are coupled to a plurality of signal paths. The system may operate in a bypass mode in which one or more memory modules use a bypass circuit to provide read data from at least one larger capacity memory module to a master device.

According to embodiments, a system includes a master and a plurality of memory modules that may be disposed in a variety of topologies, such as point-to-point or daisy chain topologies. Memory modules may include a plurality of integrated circuit buffer devices that are coupled using a variety of topologies to receive control information, such as dedicated, fly-by, stub, serpentine or tree topologies, singly or in combination.

According to embodiments, a method determines a mode of operation of a system including a master and a plurality of memory modules. In a bypass mode of operation, delays are provided to read data from at least one memory module to levelize or ensure that read data from different capacity memory modules using different signal paths arrive at the master at approximately the same time.

According to embodiments, a memory module includes a plurality of signal paths that provide data to a memory module connector from a plurality of respective integrated circuit buffer devices (or dies) that access the data from an associated plurality of integrated circuit memory devices (or dies). In a specific embodiment, each integrated circuit buffer device is also coupled to a bussed signal path that provides control and/or address information that specifies an access to at least one integrated circuit memory device associated with the respective integrated circuit buffer device.

According to embodiments, a memory module connector includes a control/address interface portion and a data interface portion. A control/address bus couples a plurality of integrated circuit buffer devices to the control/address interface portion. A plurality of data signal paths couple the plurality of respective integrated circuit buffer devices to the data interface portion. Each integrated circuit buffer device includes 1) an interface to couple to at least one integrated circuit memory device, 2) an interface to couple to the control/address bus and 3) an interface to couple to a data signal path in the plurality of data signal paths.

According to embodiments, a memory module may include a non-volatile memory location, for example using an electrically erasable programmable read only memory ("EEPROM") (also known as a Serial Presence Detect ("SPD") device), to store information regarding parameters and configuration of the memory module. In embodiments, at least one integrated circuit buffer device accesses information stored in the SPD device.

In a package embodiment, a package houses an integrated circuit buffer die and the plurality of integrated circuit memory dies. In the package, a plurality of signal paths transfer data (read and/or write data) between the integrated circuit buffer die and the plurality of integrated circuit memory dies. The integrated circuit buffer die provides control signals from an interface of the package to the plurality of integrated circuit memory dies. Data stored in memory arrays of the plurality of integrated circuit memory dies is provided to a signal path disposed on the memory module via the integrated circuit buffer die in response to the control signals. In an embodiment, the package may be a multichip package ("MCP"). In an embodiment, the plurality of integrated circuit memory dies may be housed in common or separate packages. In an embodiment described below, the memory module may include a series of integrated circuit dies (i.e., memory die and buffer die) stacked on top of one another and coupled via a signal path.

As described herein, an integrated circuit buffer device is also referred to as a buffer or buffer device. Likewise, an integrated circuit memory device is also referred to as a memory device. A master device is also referred to as a master.

In an embodiment, an integrated circuit memory device is distinguished from a memory die in that a memory die is a monolithic integrated circuit formed from semiconductor materials for storing and/or retrieving data or other memory functions, whereas an integrated circuit memory device is a memory die having at least some form of packaging or interface that allows the memory die to be accessed.

Likewise in an embodiment, an integrated circuit buffer device is distinguished from a buffer die in that a buffer die is a monolithic integrated circuit formed from semiconductor materials and performs at least one or more buffer functions described herein, whereas an integrated circuit buffer device is a buffer die having at least some form of packaging or interface that allows communication with the buffer die.

Figure 10:
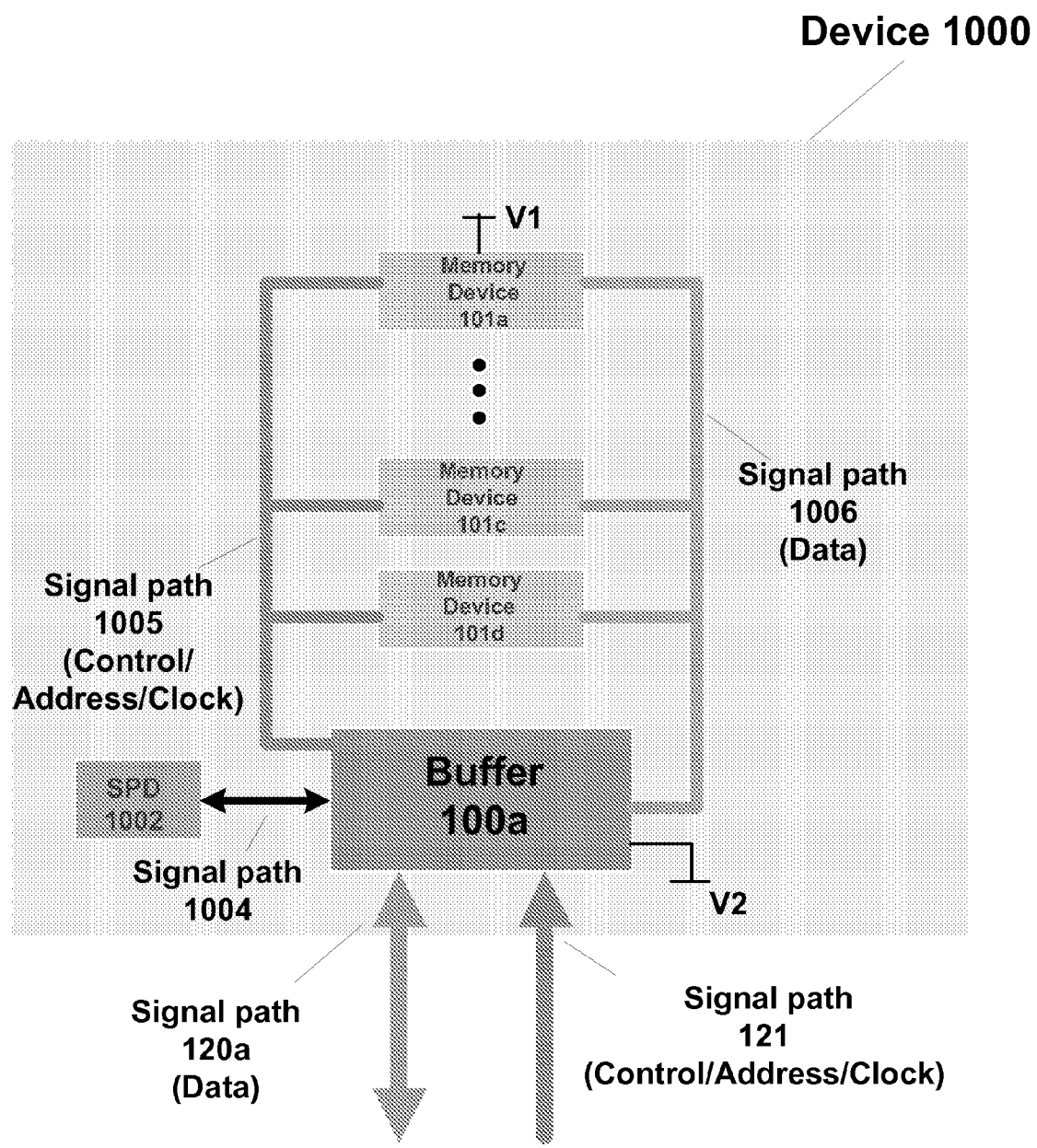
FIG. 10 is a block diagram illustrating a topology of a device having a plurality of integrated circuit memory dies and an integrated circuit buffer die.
Figure 18:
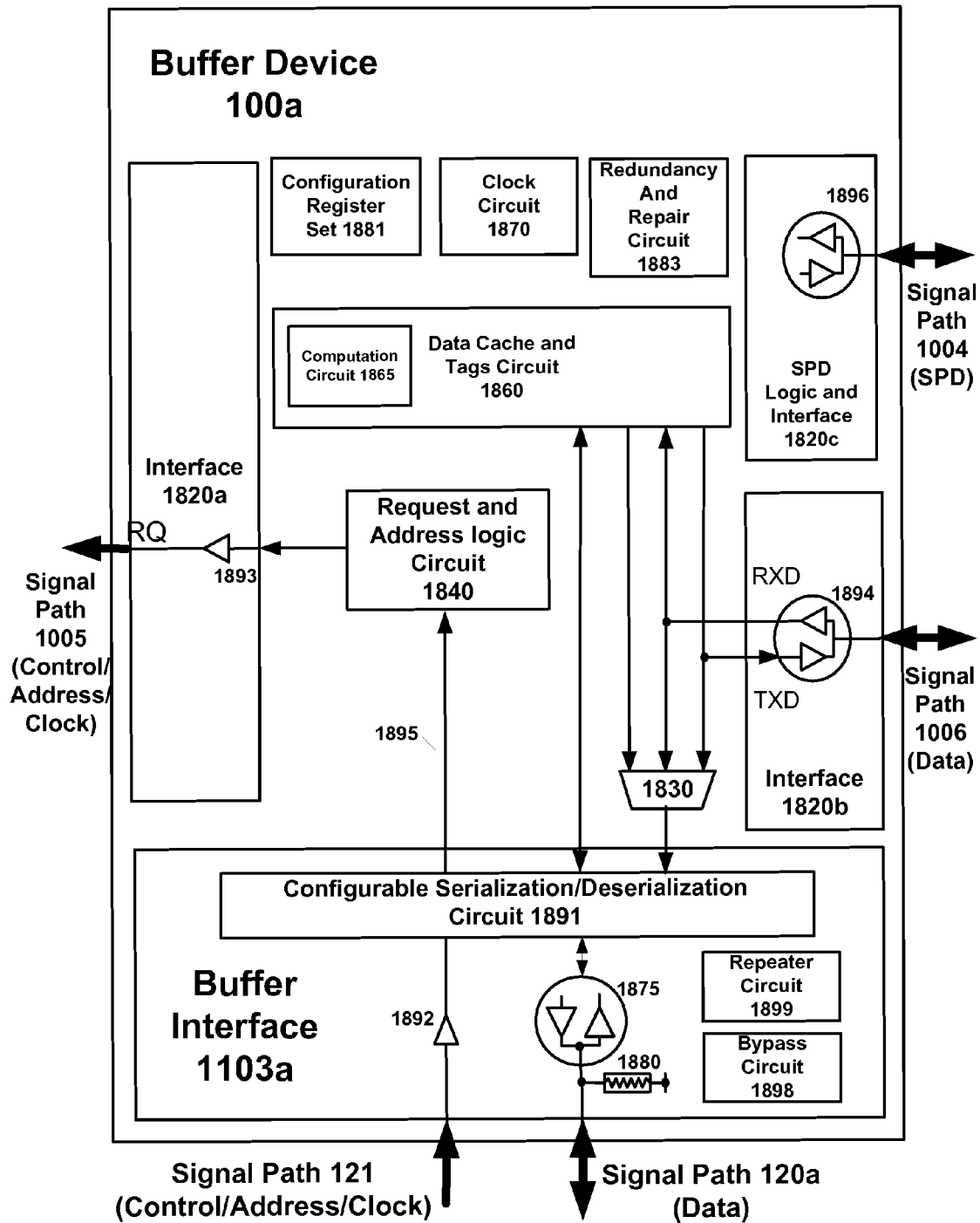
FIG. 18 is a block diagram of an integrated circuit buffer die.
Figure 19:
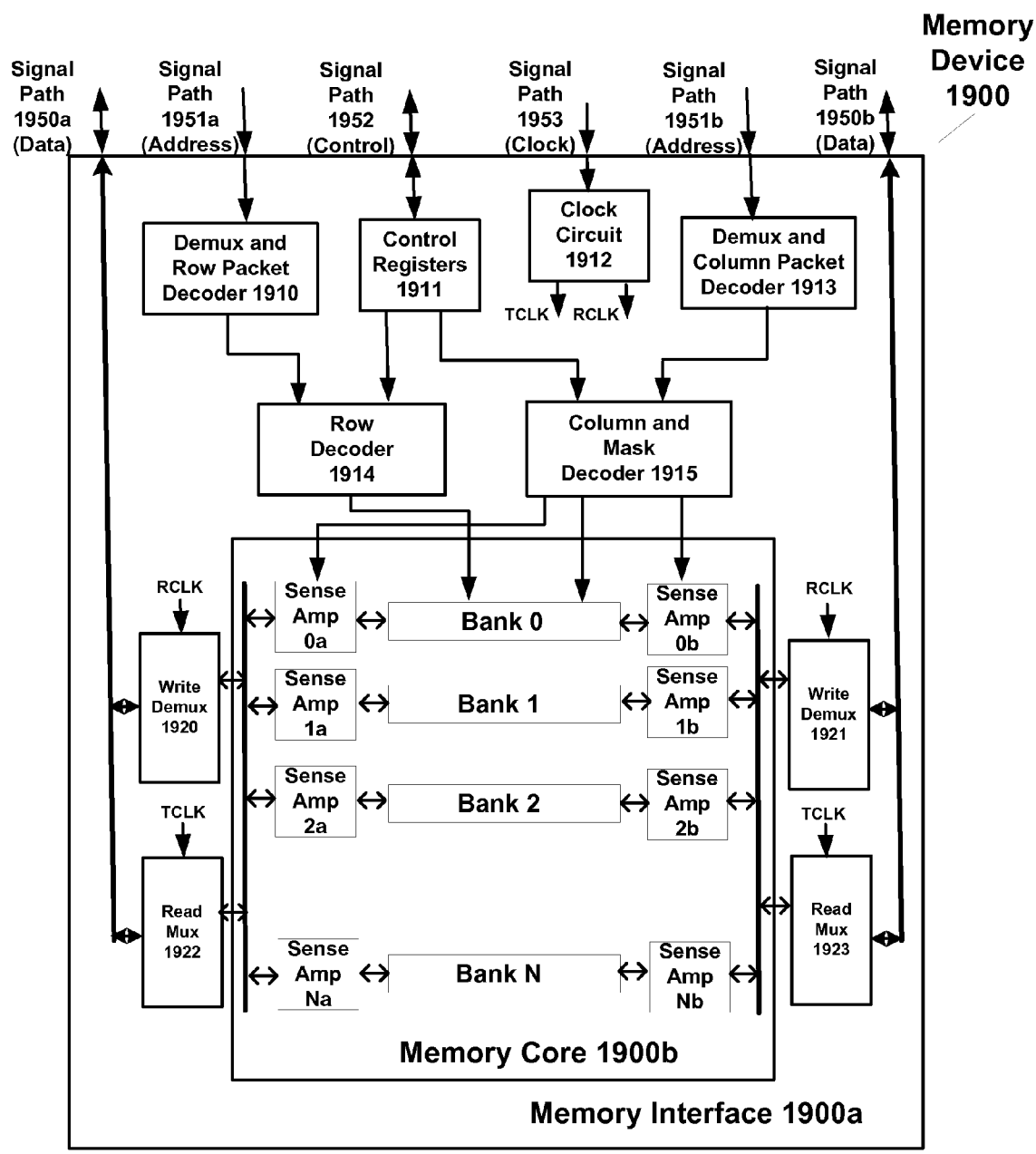
FIG. 19 is a block diagram of a memory device.
Figure 36:
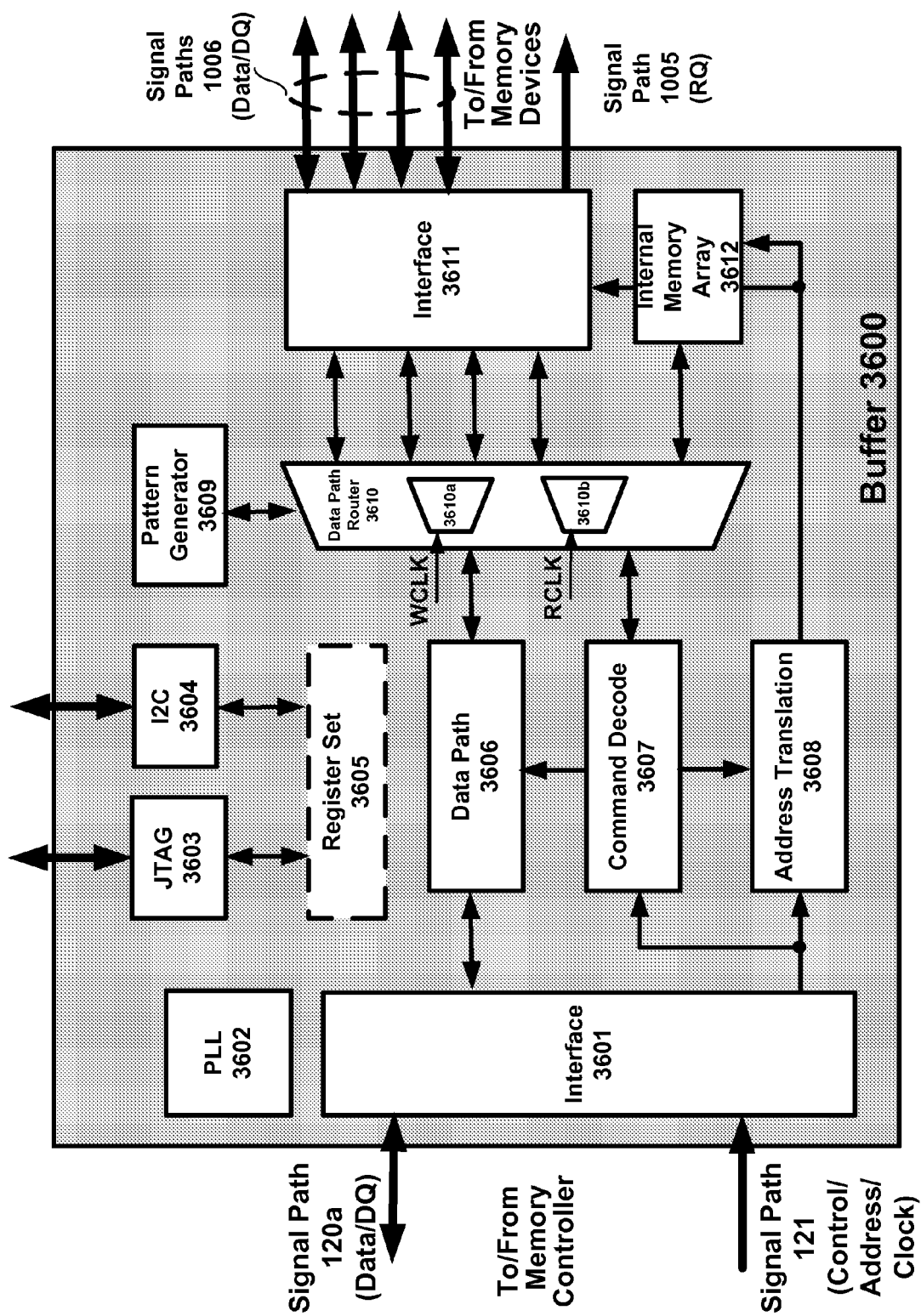
FIG. 36 is a block diagram of an integrated circuit buffer device.
Figure 37A:
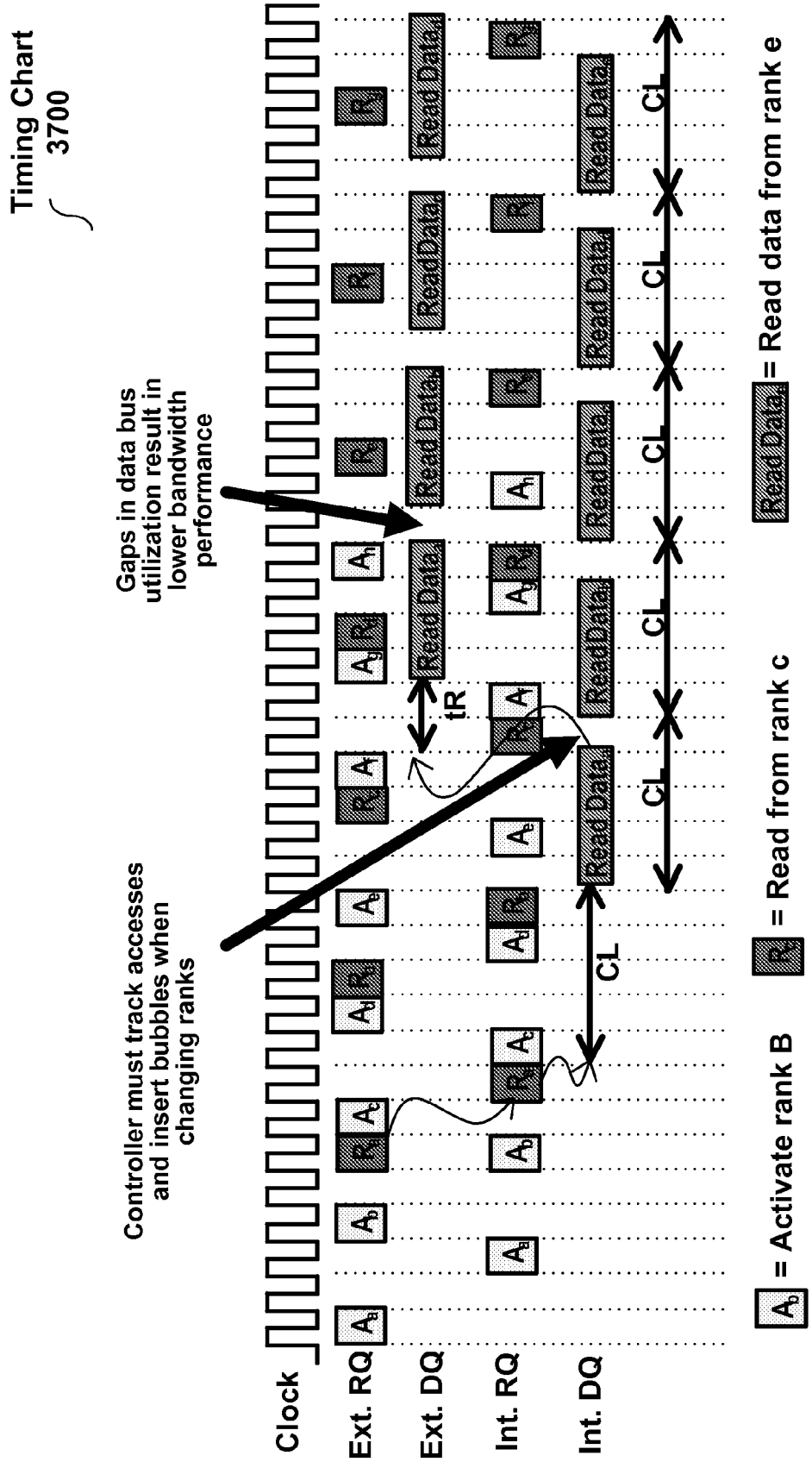
FIGS. 37A-B illustrate timing diagrams of an integrated circuit buffer device.
Figure 37B:
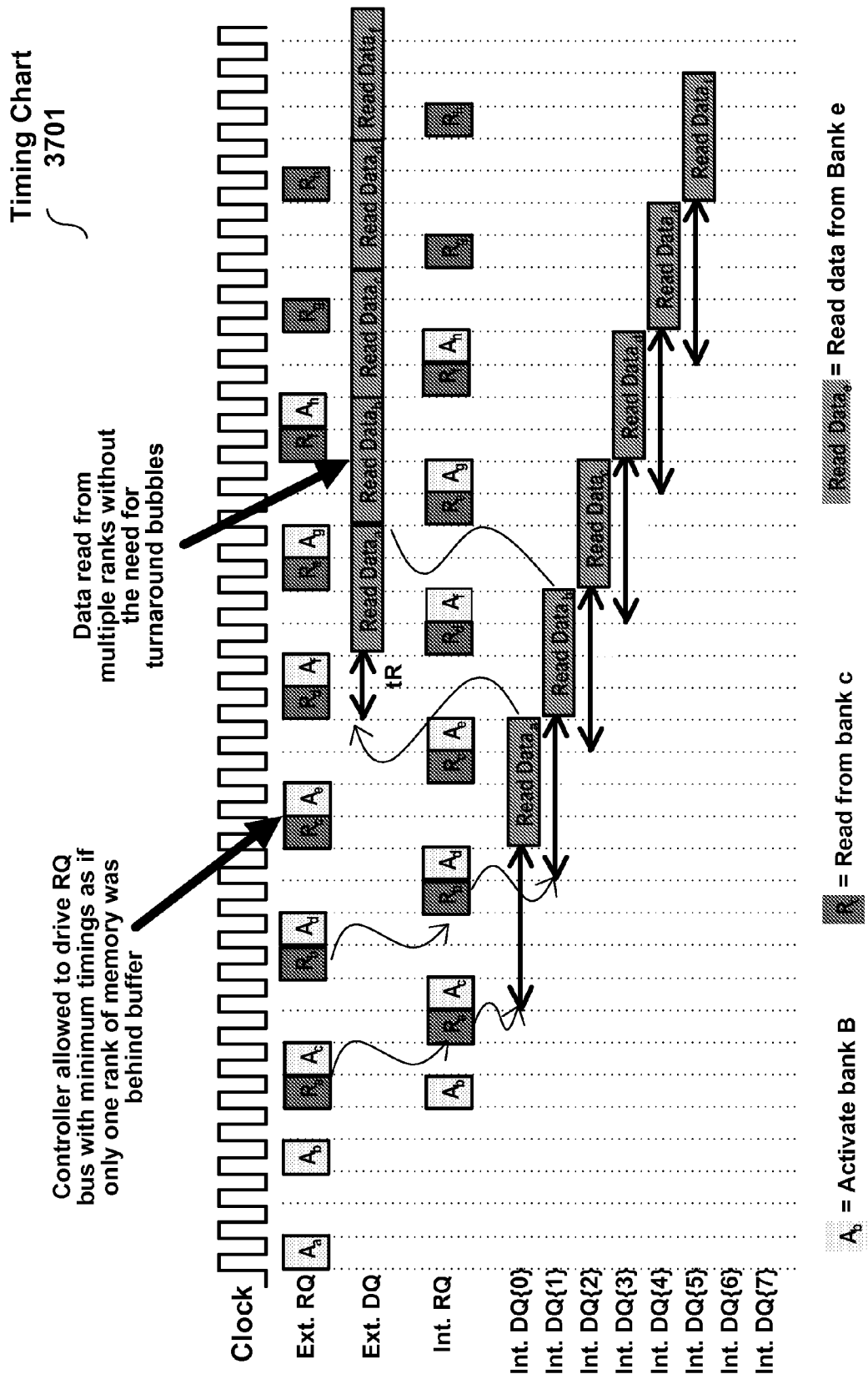
Figure 39:
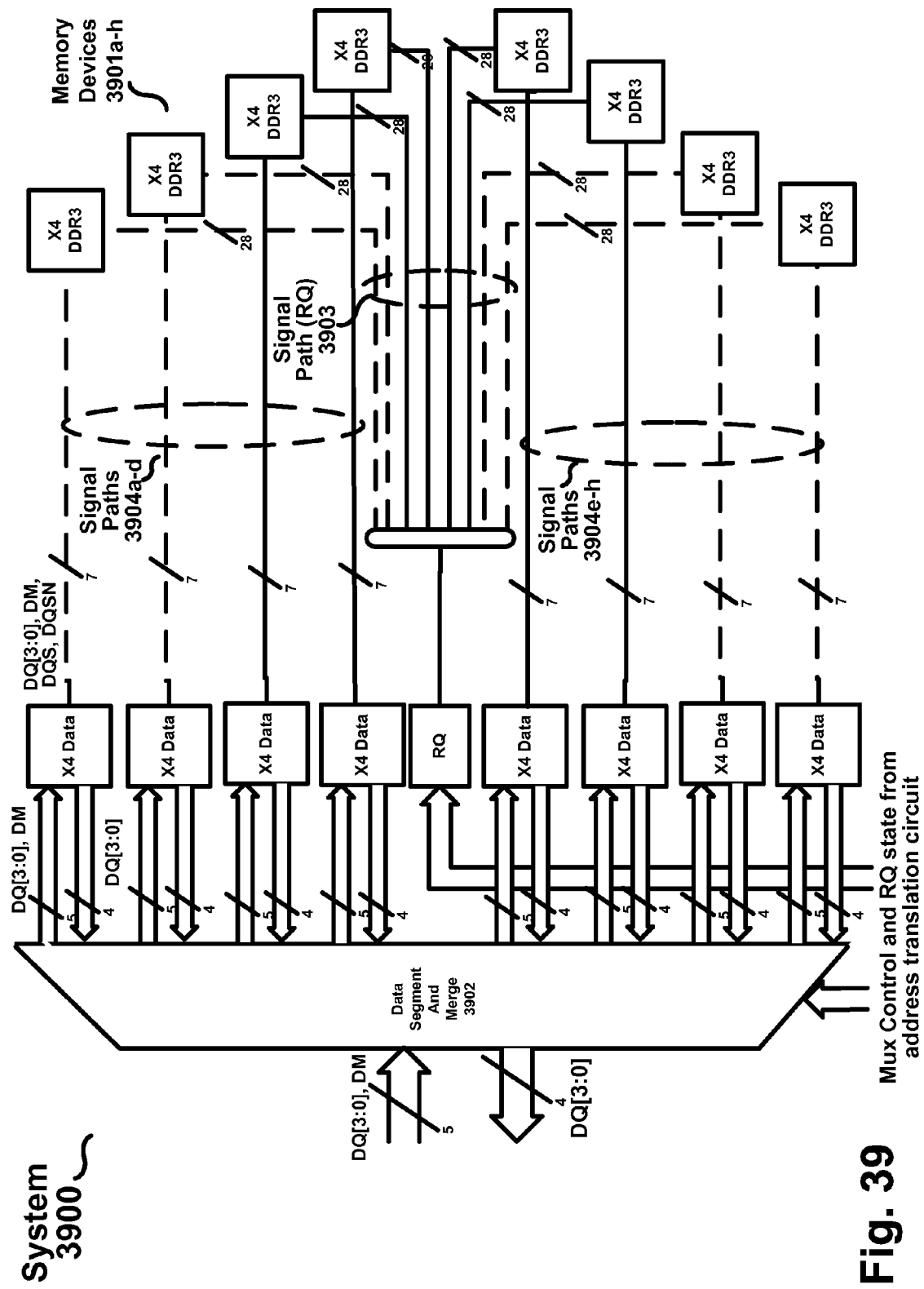
FIG. 39 illustrates a system for accessing individual memory devices that function as respective memory ranks.
Figure 40:
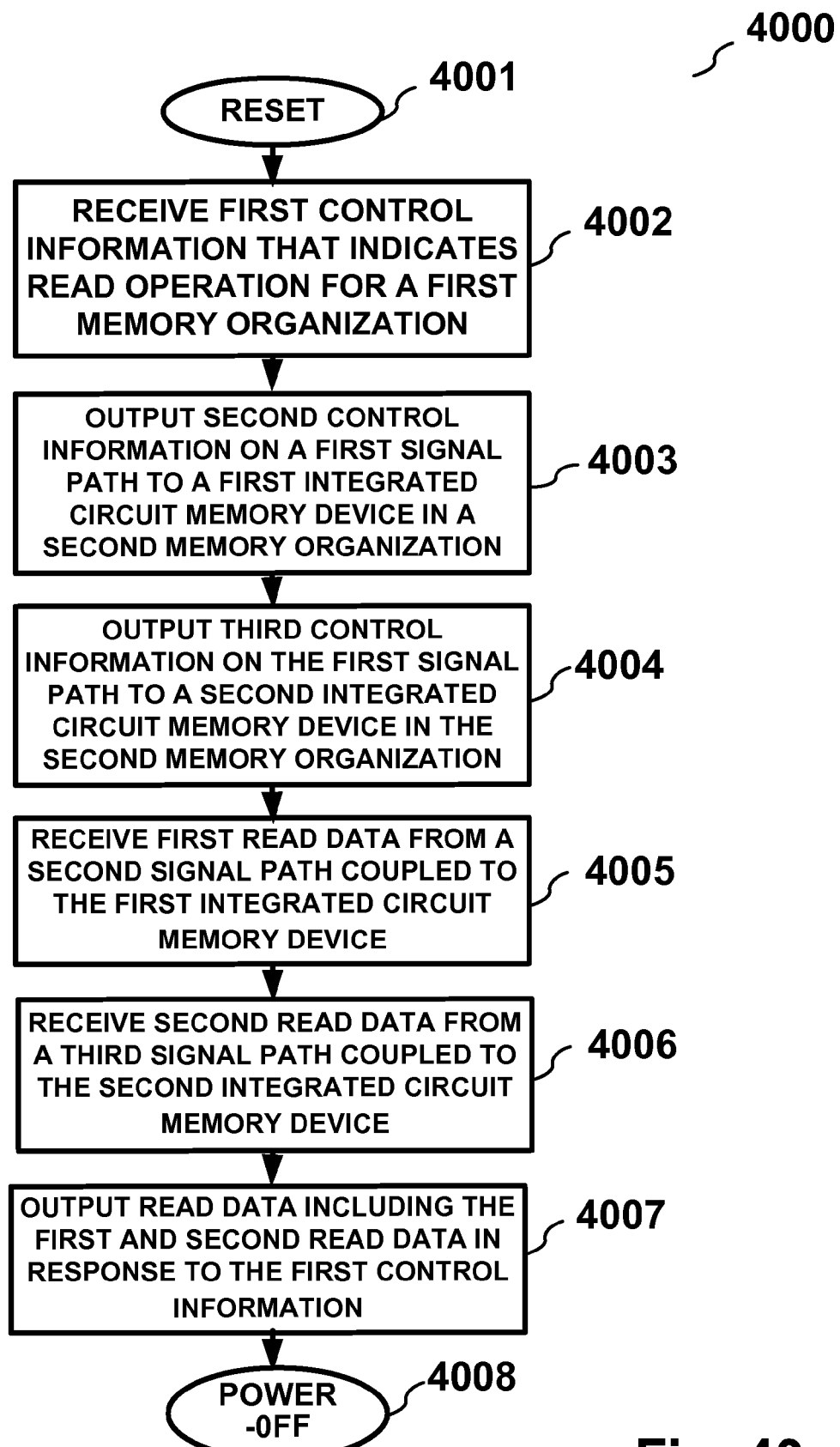
FIG. 40 illustrates a method of operation in an integrated circuit buffer device.

In the embodiments described in more detail below, FIGS. 1-8 illustrate control/address and data signal path topologies including a plurality of integrated circuit memory devices (or dies) and a plurality of integrated circuit buffer devices (or dies) situated on a memory module. FIGS. 10, 18, and 19 also illustrate signal path topologies including integrated circuit memory devices (or dies) and integrated circuit buffer devices (or dies) situated on a memory module as well as the operation of an integrated circuit buffer device (or die) and memory device (or die) in embodiments among other things. FIGS. 21A-D, 22A-C, 23A-C and 24A-B illustrate system topologies. FIGS. 26A-B, 28A-B and 31 illustrate operating a memory system in a first and second mode of operation (bypass mode). FIGS. 32A-E, 33A-B, 34 and 35 illustrate topologies between an integrated circuit buffer device and a plurality of integrated circuit memory devices. FIG. 36 is a block diagram of an integrated circuit buffer device and FIGS. 37A-B illustrates timing diagrams of an integrated circuit buffer device. FIGS. 38 and 39 illustrate a buffer device and a plurality of integrated circuit memory devices in different memory ranks. FIG. 40 illustrates a method of operation in an integrated circuit buffer device.

FIG. 1 illustrates a memory module topology including a plurality of integrated circuit memory devices and a plurality of associated integrated circuit buffer devices. In an embodiment, a memory module 100 includes a plurality of buffer devices 100a-d coupled to a common address/control signal path 121. Each buffer device of the plurality of buffer devices 100a-d provides access to a plurality of respective integrated circuit memory devices 101a-d via signal paths 102a-d and 103. In an embodiment, respective data slices a-d are formed by one of buffers 100a-d and sets of memory devices 101a-d. Buffer devices 100a-d are coupled to signal paths 120a-d, respectively, that transfer data (read and write data) between the buffer devices 100a-d and a memory module connector interface. In an embodiment, mask information is transferred to buffer devices 100a-d from a memory module connector interface using signal paths 120a-d, respectively.

In an embodiment, a data slice is a portion of the memory module data signal path (or bus) that is coupled to the respective integrated circuit buffer device. The data slice may include the full data path or portions of data paths to and from a single memory device disposed on the memory module.

Integrated circuit memory devices may be considered as a common class of integrated circuit devices that have a plurality of storage cells, collectively referred to as a memory array. A memory device stores data (which may be retrieved) associated with a particular address provided, for example, as part of a write or read command. Examples of types of memory devices include dynamic random access memory ("DRAM"), including single and double data rate synchronous DRAM, static random access memory ("SRAM"), and flash memory. A memory device typically includes request or command decode and array access logic that, among other functions, decodes request and address information, and controls memory transfers between a memory array and signal path. A memory device may include a transmitter circuit to output data, for example, synchronously with respect to rising and falling edges of a clock signal, (e.g., in a double data rate type of memory device). Similarly, the memory device may include a receiver circuit to receive data, for example, synchronously with respect to rising and falling edges of a clock signal or outputs data with a temporal relationship to a clock signal in an embodiment. A receiver circuit also may be included to receive control information synchronously with respect to rising and falling edges of a clock signal. In an embodiment, strobe signals may accompany the data propagating to or from a memory device and that data may be captured by a device (e.g., memory device or buffer, or controller) using the strobe signal.

In an embodiment, an integrated circuit buffer device is an integrated circuit that acts as an interface between a memory module connector interface and at least one integrated circuit memory device. In embodiments, the buffer device may store and/or route data, control information, address information and/or a clock signal to at least one integrated circuit memory device that may be housed in a common or separate package. In an embodiment, the buffer isolates, routes and/or translates data, control information and a clock signal, singly or in combination, between a plurality of memory devices and a memory module connector interface. An embodiment of a memory module connector interface is described below and shown in FIGS. 9A-C.

At least one signal path 121, as shown in FIG. 1, disposed on memory module 100, transfers control and/or address (control/address) information between at least one of the buffer devices 100a-d and a memory module connector interface in various embodiments. In an embodiment, signal path 121 is a multi-drop bus. As illustrated in FIGS. 2-8 and described below, alternate topologies for transferring control/address information, data and clock signals between one or more buffer devices 100a-d and a memory module connector interface may be used in alternate embodiments. For example, a split multi-drop control/address bus, segmented multi-drop control/address bus, and point-to-point and/or daisy chain topologies for a data bus may be employed.

In an embodiment, clock signals and/or clock information may be transferred on at least one signal line in signal path 121. These clock signal(s) provide one or more clock signals having a known frequency and/or phase. In an embodiment, a clock signal is synchronized with or travels along side the control/address information. In an embodiment, an edge of the clock signal has a temporal relationship with an edge of a control/address signal representing the control/address information. In an embodiment, a clock signal is generated by a clock source, master device (e.g., controller device) and/or buffer device.

In an embodiment, a clock signal and/or clock information may be transferred on at least one signal line in respective signal paths 120a-d. Buffer devices 100a-d may receive and/or transmit a clock signal with data on signal paths 120a-b. In an embodiment, write data is provided to buffer devices 100a-d on signal paths 120a-d and a clock signal is provided on signal paths 120a-d along side write data. In an embodiment, a clock signal (such as a clock-to-master ("CTM")) is provided from buffer devices 100a-d on signal paths 120a-d along side read data on signal paths 120a-d. In an embodiment, a clock signal is synchronized with or travels along side the write and/or read data. An edge of the clock signal has a temporal relationship or is aligned with an edge of a data signal representing write and/or read data. Clock information can be embedded in data, eliminating the use of separate clock signals along with the data signals.

In an embodiment, a read, write and/or bidirectional strobe signal may be transferred on at least one signal line in respective signal paths 120a-d. Buffer devices 100a-d may receive and/or transmit a strobe signal with data on signal paths 120a-b. In an embodiment, write data is provided to buffer devices 100a-d on signal paths 120a-d and a strobe signal is provided on signal paths 120a-d along side write data. In an embodiment, a strobe signal is provided from buffer devices 100a-d on signal paths 120a-d along side read data on signal paths 120a-d. In an embodiment, a strobe signal is synchronized with or travels along side the write and/or read data. An edge of the strobe signal has a temporal relationship or is aligned with an edge of a data signal representing write and/or read data.

In an embodiment, addresses (for example, row and/or column addresses) for accessing particular memory locations in a particular integrated circuit memory device and/or commands are provided on signal path 121 from a memory module connector interface. In an embodiment, a command relates to a memory operation of a particular integrated circuit memory device. For example, a command may include a write command to store write data at a particular memory location in a particular integrated circuit memory device and/or a read command for retrieving read data stored at a particular memory location from a particular integrated circuit memory device. Also, multiple memory devices in different data slices can be accessed simultaneously. In embodiments, a command may include row commands, column commands such as read or write, mask information, precharge and/or sense command. In an embodiment, control information is transferred on signal path 121 over a common set of lines in the form of a time multiplexed packet where particular fields in the packet are used for including command operation codes and/or addresses. Likewise, packets of read data may be transferred from integrated circuit memory devices via buffers 100a-d on respective signal paths 120a-d to a memory module connector interface. In an embodiment, a packet represents one or more signals asserted at particular bit windows (or a time interval) for asserting a signal on particular signal lines.

In an embodiment, chip select information may be transferred on one or more signal lines in signal path 121. In an embodiment, chip select information may be one or more chip select signals on respective signal lines having predetermined voltage values or states (or logic values) that select and enable operation of a "chip" or integrated circuit memory device/buffer device.

In embodiments, memory module 100 communicates (via a memory module connector interface) with a master device (e.g., a processor or controller).

Figure 2:
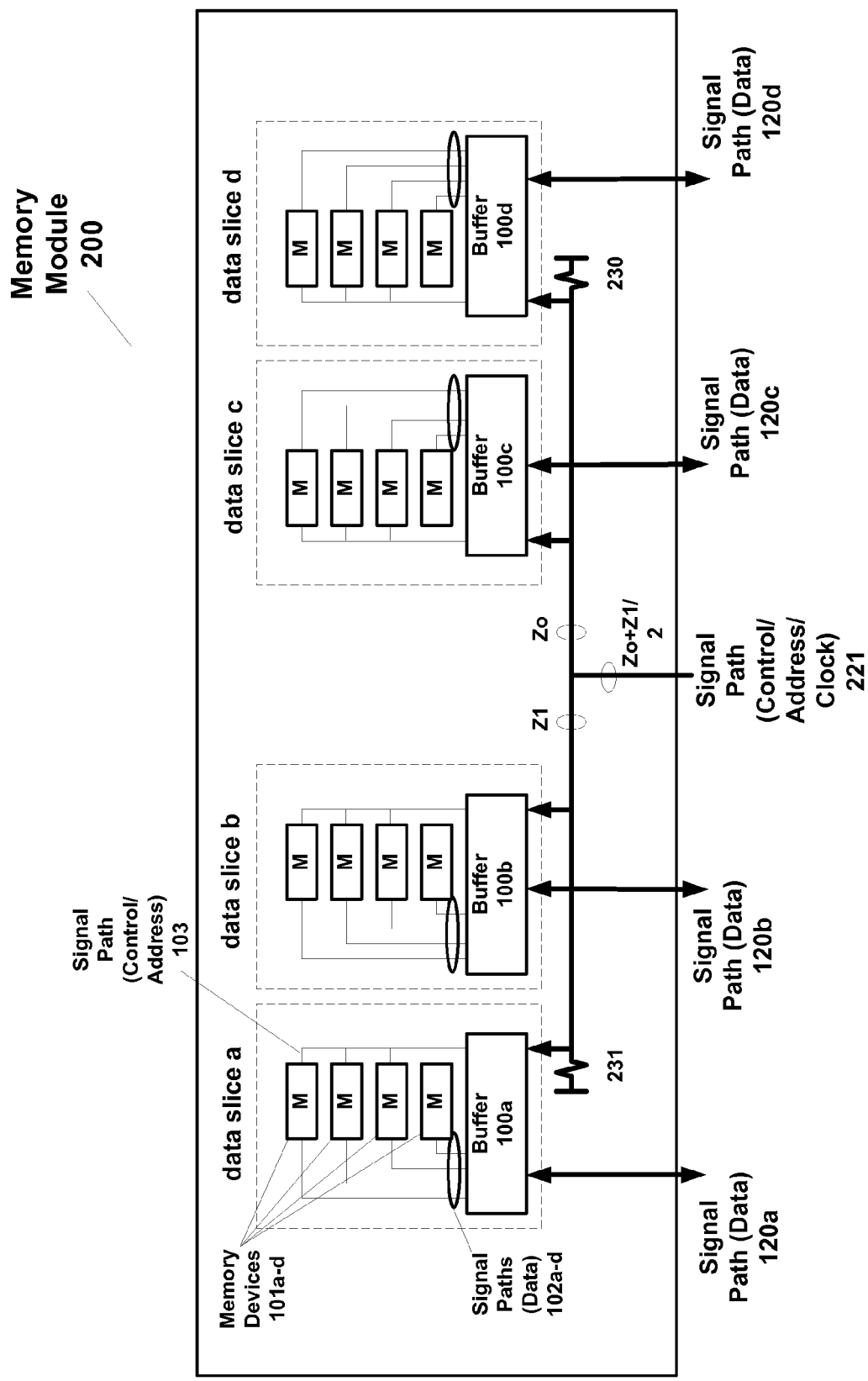
FIG. 2 illustrates a memory module topology having a split multi-drop control/address bus.

FIG. 2 illustrates an embodiment of a memory module topology having a split multi-drop control/address/clock bus. In particular, memory module 200 includes a split multi-drop control/address bus 221 coupled to buffers 100a-d and a memory module connector interface. With reference to FIG. 2, a first portion of bus 221 is terminated by termination 230 and a second portion of bus 221 is terminated by termination 231. In an embodiment, the impedance of termination 230 matches the impedance of the first portion of bus 221 (Z0) coupled to buffers 100c-d and the impedance of termination 231 matches the impedance of the second portion of bus 221 (Z1) coupled to buffers 100a-b. In an embodiment, impedance Z0 equals impedance Z1. In embodiments, terminations 230 and 231, singly or in combination, are disposed on memory module 100, buffer devices 100a and 100d or packages used to house buffer devices 100a and 100d.

Figure 3:
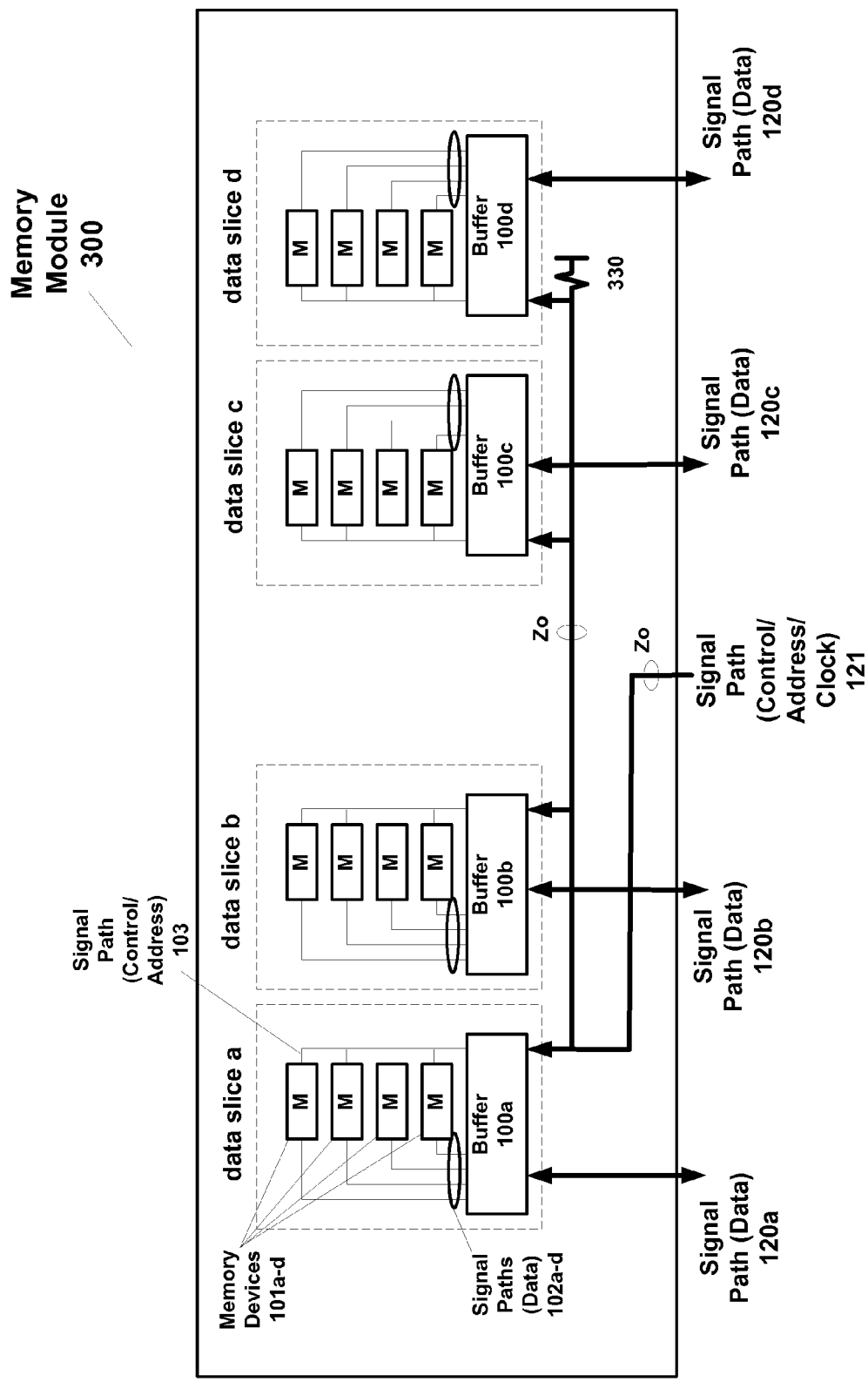
FIG. 3 illustrates a memory module topology having a single multi-drop control/address bus.

FIG. 3 illustrates a memory module topology having a single multi-drop control/address/clock bus terminated by termination 330. In an embodiment, the impedance of termination 330 matches the impedance of signal path 121 (or control/address/clock bus). In embodiments, termination 330, singly or in combination, is disposed on memory module 300 or on buffer device 100d.

Figure 4:
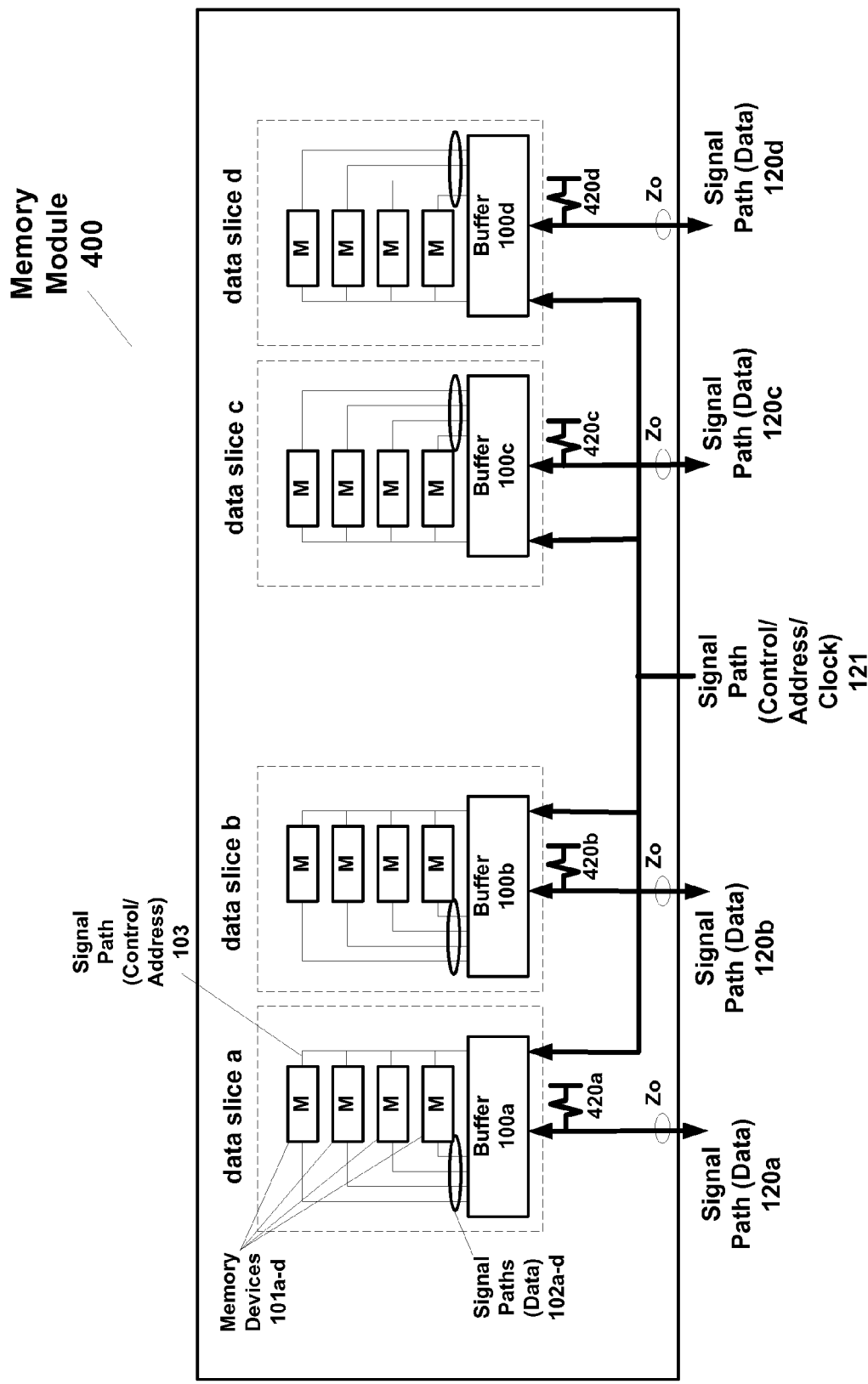
FIG. 4 illustrates a memory module topology that provides data between each integrated circuit buffer device and a memory module connector interface.

FIG. 4 illustrates a memory module topology that provides data between each integrated circuit buffer device and a memory module connector interface. In an embodiment, each signal path 120a-d is terminated by an associated termination 420a-d, respectively. In an embodiment, terminations 420a-d have respective impedances that match the impedance Z0 of each of the signal paths 120a-d. In embodiments, terminations 420a-d, singly or in combination, are disposed on memory module 400, each of buffer devices 100a-d or packages used to house buffer devices 100a-d.

Referring to FIG. 1, a control/address signal rate ratio of signal path 121 to signal path 103 may be 2:1 (or other multiples such as 4:1, 8:1, etc.) so that a memory module connector interface is able to operate as fast as specified while memory devices 101a-d may operate at half (quarter, eighth, etc.) the control/address signaling rate so that relatively lower cost memory devices may be used. Similarly, a data signal rate of one of signal paths 102a-d to one of signal paths 120a-d may be 2:1 (or other multiple such as 4:1, 8:1, etc.) so that a memory module connector interface is able to operate as fast as specified while memory devices 101a-d may operate at half (quarter, eighth, etc.) the data signaling rate so that relatively lower cost memory devices may be used.

Figure 5:
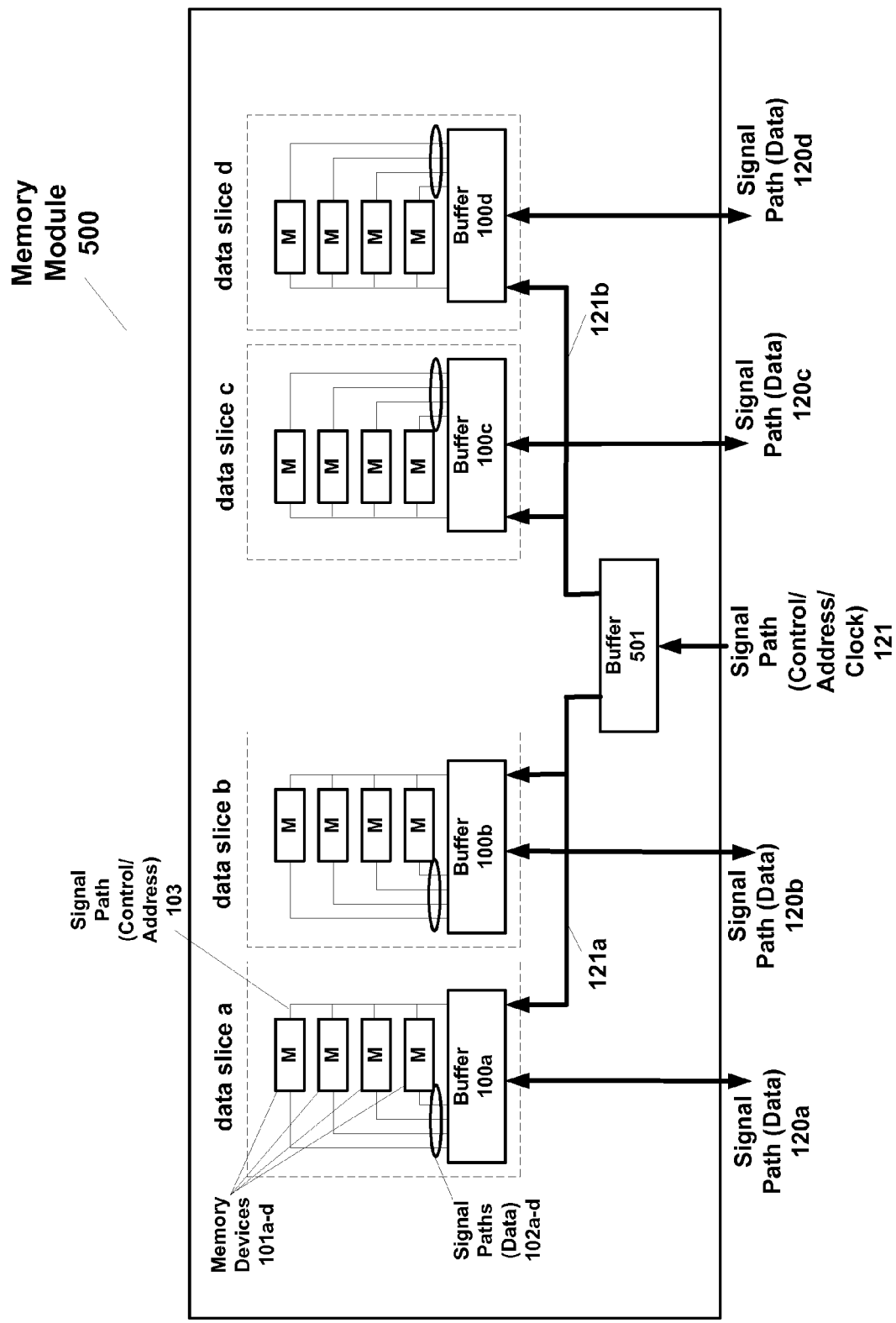
FIG. 5 illustrates a memory module topology including a plurality of integrated circuit memory devices and a plurality of integrated circuit buffer devices with an integrated circuit buffer device for control and address information.

FIG. 5 illustrates a memory module topology including a plurality of integrated circuit memory devices and a plurality of integrated circuit buffer devices with an integrated circuit buffer device 501 for control, address and/or clock information. Memory module 500 is similar to memory module 100 except that buffer device 501 is coupled to signal paths 121 and 121a-b. Buffer device 501 outputs control, address and/or clock information to buffer devices 100a-b on signal path 121a and to buffer devices 100c-d on signal path 121b. In an embodiment buffer device 501 copies control, address and/or clock information received on signal path 121 and repeats the control, address and/or clock information on signal paths 121a-b. In an embodiment, buffer device 501 is a clocked buffer device that provides a temporal relationship with control and address information provided on signal paths 121a-b. In an embodiment, signal paths 121a-b include at least one signal line to provide a clock signal and/or clock information. In an embodiment, buffer device 501 includes a clock circuit 1870 as shown in FIG. 18. In an embodiment, buffer device 501 receives control information, such as a packet request, that specifies an access to at least one of the integrated circuit memory devices 101a-d and outputs a corresponding control signal (on signal path 121a and/or 121b) to the specified integrated circuit memory device.

Figure 6:
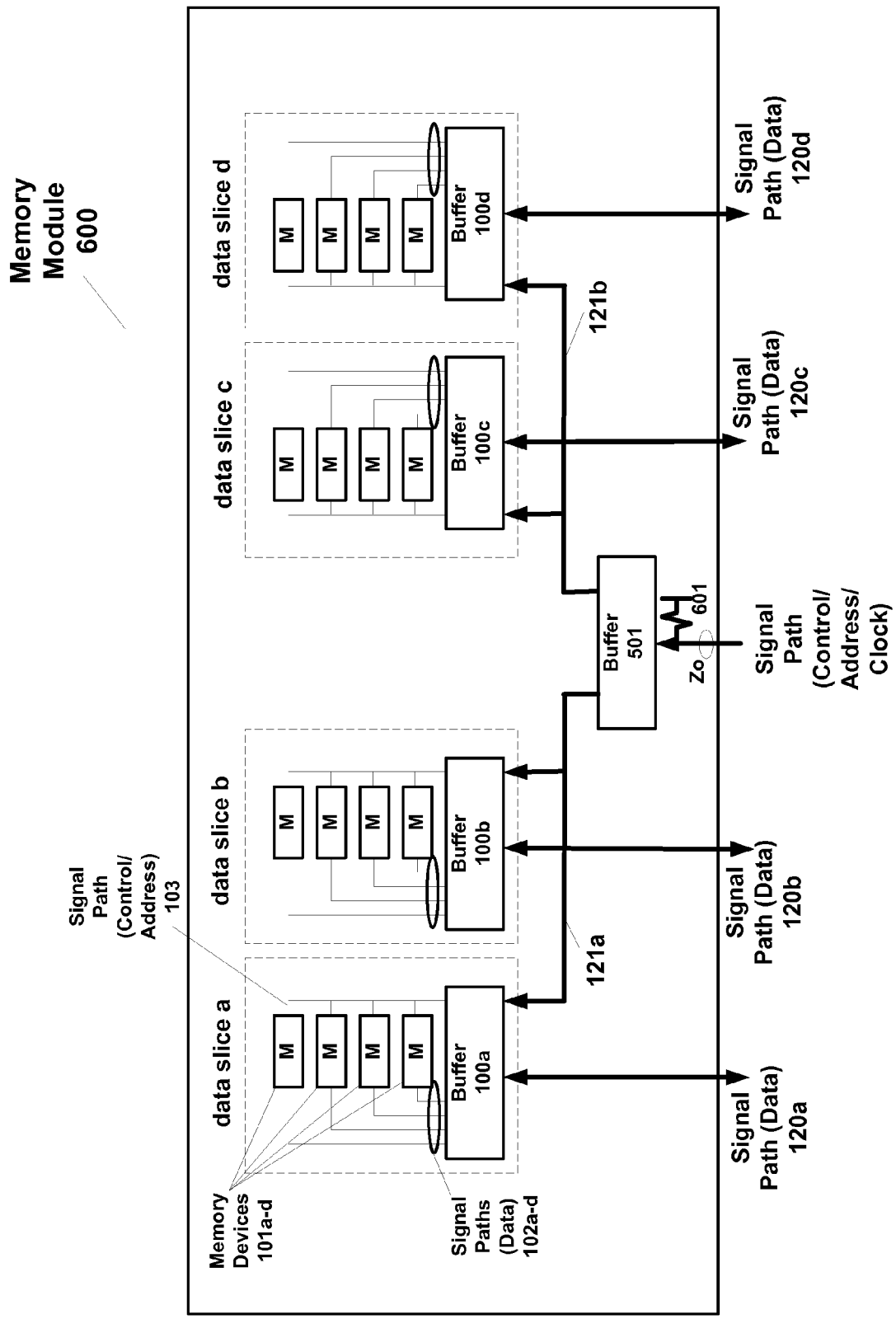
FIG. 6 illustrates termination of a control/address signal path in a memory module topology of FIG. 5.

FIG. 6 illustrates a memory module topology similar to that illustrated in FIG. 5 except that a termination 601 is coupled to signal path 121 on memory module 600. In an embodiment, the impedance of termination 601 matches the impedance Z0 of signal path 121. In embodiments, termination 601 is disposed on memory module 600, buffer device 501 or a package used to house buffer device 501.

Figure 7:
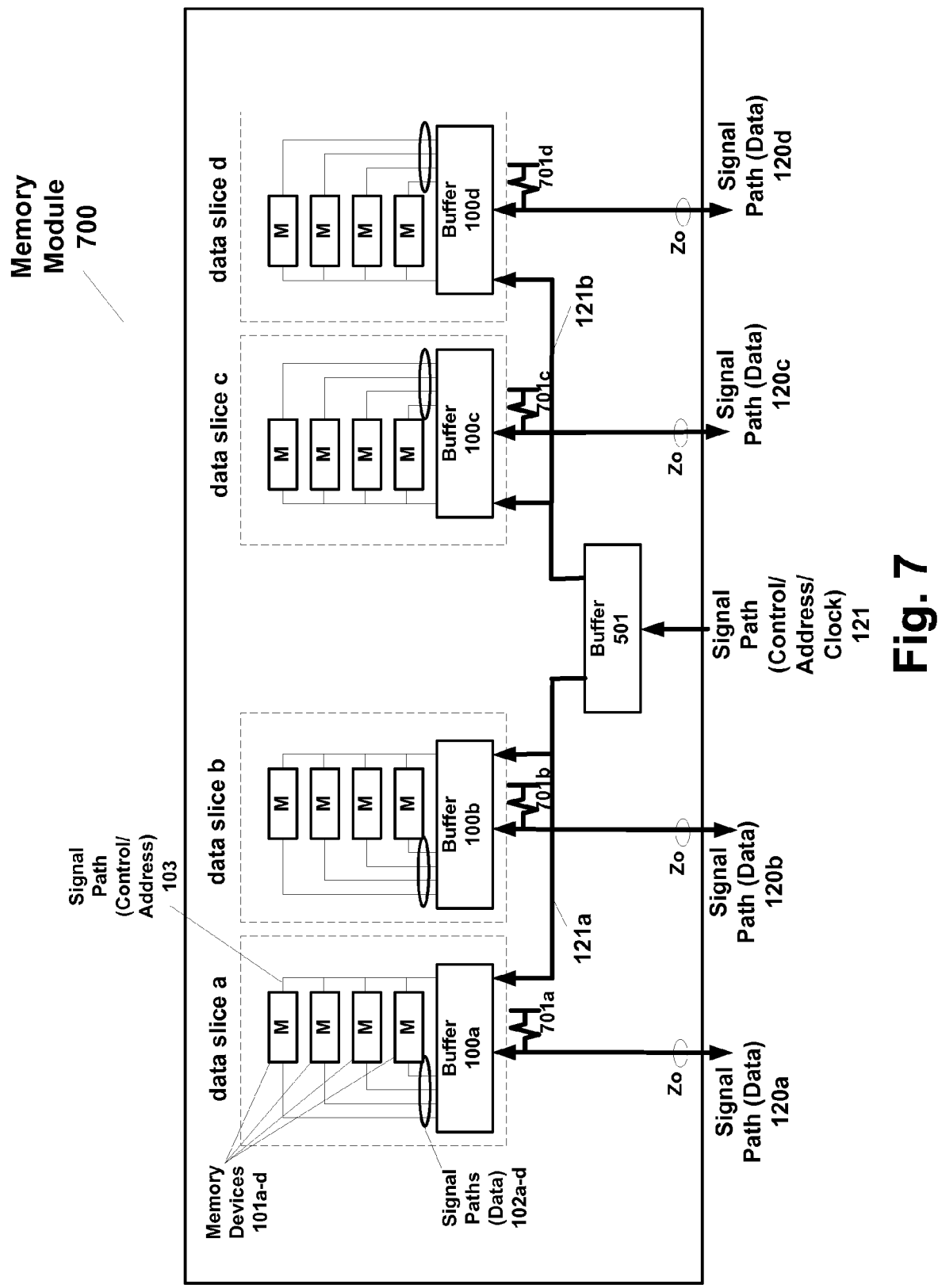
FIG. 7 illustrates termination of data signal paths in a memory module topology of FIG. 5.

FIG. 7 illustrates a memory module topology that provides data to and/or from each integrated circuit buffer device and terminations coupled to signal paths. In an embodiment, each signal path 120a-d is terminated by associated terminations 701a-d, respectively. In an embodiment, terminations 701a-d have respective impedances that match the impedance Z0 of each of the signal paths 120a-d. In embodiments, terminations 701a-d, singly or in combination, are disposed on memory module 700, buffer devices 100a-d or packages used to house buffer devices 100a-d.

Figure 8:
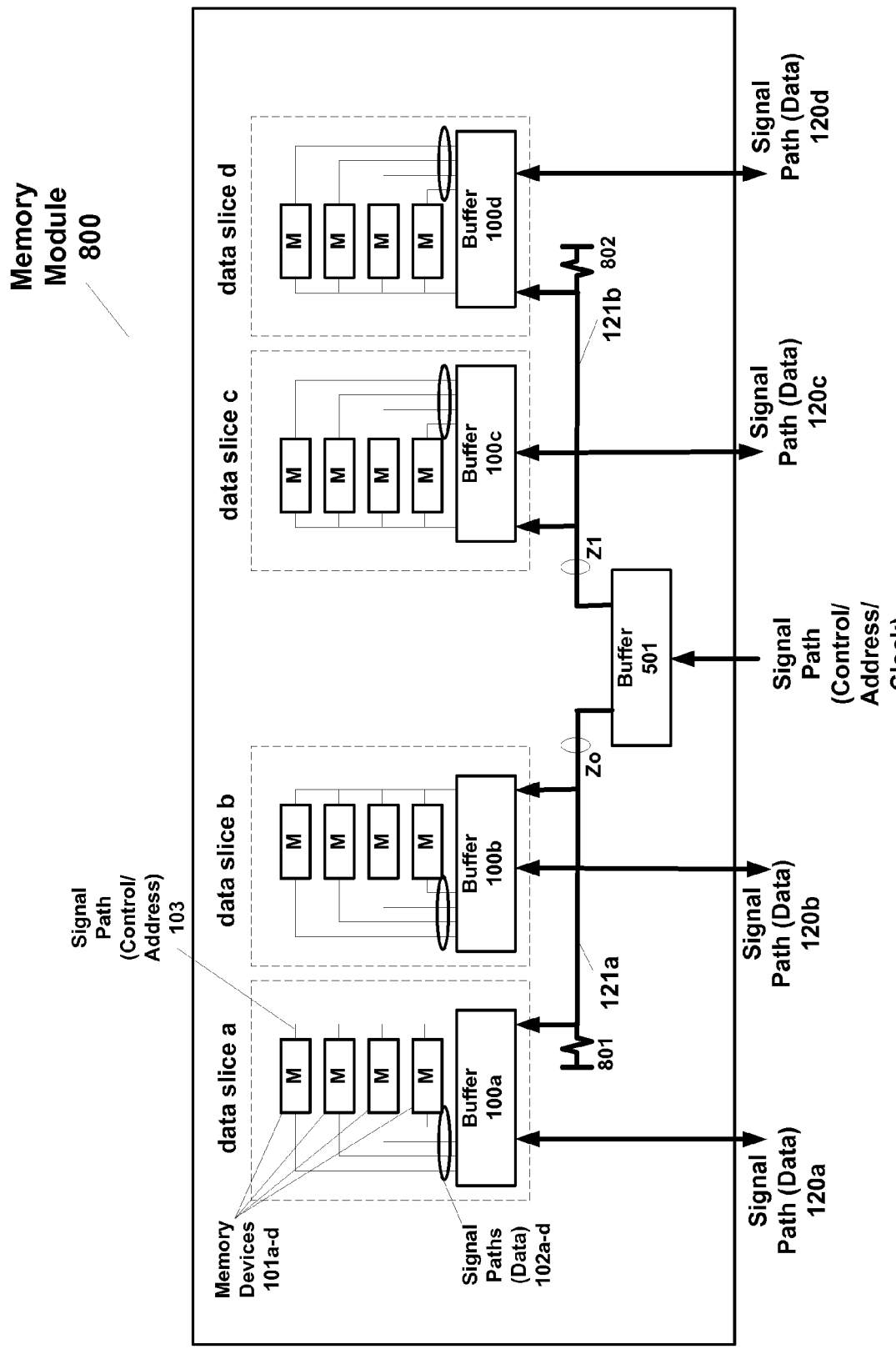
FIG. 8 illustrates termination of a split control/address signal path in a memory module topology of FIG. 5.

FIG. 8 illustrates a memory module topology having a split multi-drop signal path between a buffer device for control, address and/or clock information and the plurality of buffer devices. In particular, memory module 800 includes a split multi-drop control/address bus 121a-b coupled to buffers 100a-d and a buffer device 501. In an embodiment, a first portion of bus 121a is terminated by termination 801 and a second portion of bus 121b is terminated by termination 802. In an embodiment, the impedance of termination 801 matches the impedance of the first leg (Z0) and the impedance of termination 802 matches the impedance of the second leg (Z1). In an embodiment, impedance Z0 equals impedance Z1. In embodiments, terminations 801 and 802, singly or in combination, are disposed on memory module 800, buffer devices 100a and 100d or packages used to house buffer devices 100a and 100d.

Referring to FIG. 5, a control/address signal rate ratio of signal path 121 to signal path 121a (or 121b) to signal path 103 may be 2:1:1 (or other multiples such as 4:1:1, 8:1:1, etc.) so that other multi-drop bus topology embodiments using signal paths 121a (or 121b) and signal path 103 do not have to necessarily operate as high a signal rate as an embodiment that uses signal path 121 as shown in FIG. 1. Also like FIG. 1, a control/address signal rate ratio of signal path 121 to signal path 103 may be 2:1 (or other multiples such as 4:1, 8:1, etc.) so that a memory module connector interface is able to operate as fast as specified while memory devices 101a-d may operate at half (or quarter, eighth, etc.) the control/address signaling rate so that relatively lower cost memory devices may be used. Similarly, a data signal rate of one of signal paths 102a-d to one of signal paths 120a-d may be 2:1 (or other multiple such as 4:1, 8:1, etc.) so that a memory module connector interface is able to operate as fast as the specified signaling rate while memory devices 101a-d may operate at half (or quarter, eighth, etc.) the data signaling rate so that relatively lower cost memory devices may be used.

FIG. 9A illustrates a top view of a memory module topology including a plurality of integrated circuit memory devices and a plurality of integrated circuit buffer devices coupled to a connector interface. In an embodiment, memory module 900 includes a substrate 910 having a standard dual in-line memory module ("DIMM") form factor or other module form factor standards, such as small outline DIMM ("SO-DIMM") and very low profile DIMM ("VLP-DIMM"). In alternate embodiments, substrate 910 may be, but is not limited to, a wafer, printed circuit board ("PCB"), package substrate like BT epoxy, flex, motherboard, daughterboard or backplane, singly or in combination.

In an embodiment, memory module 900 includes pairs of memory devices 101a-b and buffer devices 100a-d disposed on a first side of substrate 910. In alternate embodiments, more or less memory devices and buffer devices are used. In an embodiment, pairs of memory devices 101c-d are also disposed on a second side of memory module 900 as shown in a side and bottom view of memory module 900 in FIGS. 9B and 9C. In an embodiment, each memory device and buffer device are housed in separate packages. In alternate embodiments, memory devices and buffer devices may be housed in MCP package embodiments described herein.

Memory module 900 includes connector interface 920 that has different interface portions for transferring data and control/address/clock signals. For example, a first side of memory module 900 includes connector interface portions 920a-d used to transfer data signals and a connector interface portion 930a used to transfer control/address signals. In an embodiment, connector interface portion 930a also transfers a clock signal and/or clock information. In an embodiment, a second side of memory module 900 including connector interface portions 920e-h are used to transfer data signals and a connector interface portion 930b is used to transfer control/address signals. In an embodiment, connector interface portion 930b also transfers a clock signal and/or clock information.

In an embodiment, connector interface 920 is disposed on an edge of substrate 910. In an embodiment, a memory module 900 is inserted into a socket 940 disposed on substrate 950. In an embodiment, substrate 950 is a main board or PCB with signal paths 960a-b for transferring signals on substrate 950. In an embodiment, signal paths 960a and 960b are signal traces or wires. In an embodiment, signal paths 960a and 960b are coupled to other sockets disposed on substrate 950 that may have another memory module inserted and/or coupled to a master.

In an embodiment, connector interface portions include at least one contact or conducting element, such as a metal surface, for inputting and/or outputting an electrical signal. In alternate embodiments, a contact may be in the form of a ball, socket, surface, signal trace, wire, a positively or negatively doped semiconductor region and/or pin, singly or in combination. In an embodiment, a connector interface as described herein, such as connector interface 920, is not limited to physically separable interfaces where a male connector or interface engages a female connector (or socket 940) or interface. A connector interface also includes any type of physical interface or connection, such as an interface used in a system-in-a-package ("SIP") where leads, solder balls or connections from a memory module are soldered to a circuit board.

In an alternate embodiment, memory module 900 is included in an embedded memory subsystem, such as one in a computer graphics card, video game console or a printer. In an alternate embodiment, memory module 900 is situated in a personal computer or server.

In an embodiment, a master communicates with memory modules illustrated in FIGS. 1-9 and 16-17. A master may transmit and/or receive signals to and from the memory modules illustrated in FIGS. 1-9 and 16-17. A master may be a memory controller, peer device or slave device. In embodiments, a master is a memory controller, which may be an integrated circuit device that contains other interfaces or functionality, for example, a Northbridge chip of a chipset. A master may be integrated on a microprocessor or a graphics processor unit ("GPU") or visual processor unit ("VPU"). A master may be implemented as a field programmable gate array ("FPGA"). Memory modules, signal paths, and a master may be included in various systems or subsystems such as personal computers, graphics cards, set-top boxes, cable modems, cell phones, game consoles, digital television sets (for example, high definition television ("HDTV")), fax machines, cable modems, digital versatile disc ("DVD") players or network routers.

In an embodiment, a master, memory modules and signal paths are in one or more integrated monolithic circuits disposed in a common package or separate packages.

FIG. 10 is a block diagram illustrating an embodiment of a device 1000 having a plurality of integrated circuit memory devices 101a-d and a buffer 100a. Here, data (read and/or write) may be transferred between the plurality of integrated circuit memory devices 101a-d and buffer 100a on a signal path 1006 (data). Signal path 1006 is a signal path situated internal to device 1000 and corresponds to signal paths 1113a-d and 1114 shown in FIG. 11. Signal path 1006 is a bus for providing bidirectional data signals between a plurality of integrated circuit memory devices 101a-d and buffer 100a. An example of bidirectional data signals includes signals traveling from one or more of integrated circuit memory devices 101a-d to buffer 100a and also signals traveling from buffer 100a to one or more of integrated circuit memory devices 101a-d. Signal path 1005 is a signal path internal to device 1000 and corresponds to signal paths 1116a-d and 1117 shown in FIG. 11. Signal path 1005 is a bus for providing unidirectional control/address/clock signals from a buffer 100a to a plurality of integrated circuit memory devices 101a-d. In an example of a unidirectional bus, signals travel in only one direction, i.e., in this case, from only buffer 100a to one or more of integrated circuit memory devices 101a-d. Signal path 1005 includes individual control signal lines, for example, a row address strobe line, column address strobe line, chip select line, etc., and address signal lines. Signal path 1005 may include a fly-by clock line to transfer a clock signal from buffer 100a to integrated circuit memory devices 101a-d. Signal path 1005 may transfer a clock signal from one or more integrated circuit memory devices 101a-d to buffer 100a.

In an embodiment, buffer 100a communicates with a serial presence detect ("SPD") device to store and retrieve parameters and configuration information regarding device 1000 and/or memory module 900. In an embodiment, an SPD 1002 is a non-volatile storage device. Signal path 1004 couples SPD 1002 to buffer 100a. In an embodiment, signal path 1004 is an internal signal path for providing bidirectional signals between SPD 1002 and buffer 100a.

In an embodiment, SPD 1002 is an EEPROM device. However, other types of SPD 1002 are possible, including but not limited to a manual jumper or switch settings, such as pull-up or pull-down resistor networks tied to a particular logic level (high or low), which may change state when a memory module is added or removed from a system.

In an embodiment, SPD 1002 is a memory device that includes registers that stores configuration information that can be easily changed via software during system operation, allowing a high degree of flexibility, and making configuration operations that are transparent to an end user.

In an embodiment illustrated in FIG. 18, functionality of the SPD mentioned above may be integrated into buffer device 100a using a register set, such as configuration register set 1881. Referring to FIG. 18, SPD logic and interface 1820c may be preconfigured with information pertaining to the buffer and memory devices connected to the buffer, or may store information pertaining to only one of the memory devices or the buffer device 100a. Control inputs to the buffer may determine when a storage node within the register set will sample the information to preload or preconfigure the SPD logic and interface 1820c. The term register may apply either to a single-bit-wide register or multi-bit-wide register.

In an embodiment illustrated by FIG. 10, SPD 1002 stores information relating to configuration information of memory module 900 or a memory system. For example, configuration information may include repair and redundancy information to repair a defective memory device, defective memory cells or peripheral circuits on a memory device, and/or signal path. In an embodiment, SPD configuration information includes memory module population topology, such as a number, a position and a type of memory device in a package and/or on a memory module, or rank, if any. SPD configuration information may include an amount of memory capacity of one or more memory modules and/or timing information to levelize signals between memory modules and a master device in a memory system. In an embodiment, SPD configuration information includes a serialization ratio for interfaces in a buffer and/or information regarding configuring the width of a buffer. In an embodiment, SPD configuration information includes a first value that represents the desired width of buffer device 100a or includes multiple values that represent the range of possible widths of the buffer device 100a, and a second value that represents the desired width of interface 1820b as illustrated in FIG. 18.

In an embodiment, SPD configuration information includes timing information or parameters for accessing memory devices, such as a time to access a row or the memory device, a time to access a column of the memory device, a time between a row access and a column access, a time between a row access and a precharge operation, a time between a row sense applied to a first bank of a memory array and a row sense applied to a second bank of the memory array and/or a time between a precharge operation applied to a first bank in a memory array and a precharge operation applied to a second bank of the memory array.

In an embodiment, the stored timing information may be expressed in terms of time units where a table of values maps specific time units to specific binary codes. During an initialization or calibration sequence, a master or a buffer may read SPD configuration information and determine the proper timing information for one or more memory devices. For example, a master may also read information representing the clock frequency of a clock signal from an SPD 1002, and divide the retrieved timing information by a clock period of a clock signal. (The clock period of the clock signal is the reciprocal of the clock frequency of the clock signal). Any remainder resulting from this division may be rounded up to the next whole number of clock cycles of the clock signal.

Signal paths 120a and 121, as shown in FIG. 10, are coupled to buffer 100a. In an embodiment, signal path 120a transfers unidirectional control/address/clock signals to buffer 100a. In an embodiment, signal path 121 transfers bidirectional or unidirectional data signals to and from buffer 100a. Other interconnect and external connect topologies may also be used for device 1000 in alternate embodiments. For example, buffer 100a may be coupled to a single multi-drop control bus, a split multi-drop control bus, or a segmented multi-drop bus.

In an embodiment, device 1000 has two separate power sources. Power source V1 supplies power to one or more memory devices (memory devices 101a-d) on memory module 900. Power source V2 supplies power to one or more buffers (buffer 100a) on memory module 900. In an embodiment, the buffer 100a has internal power regulation circuits to supply power to the memory devices 101a-d.

Figure 11:
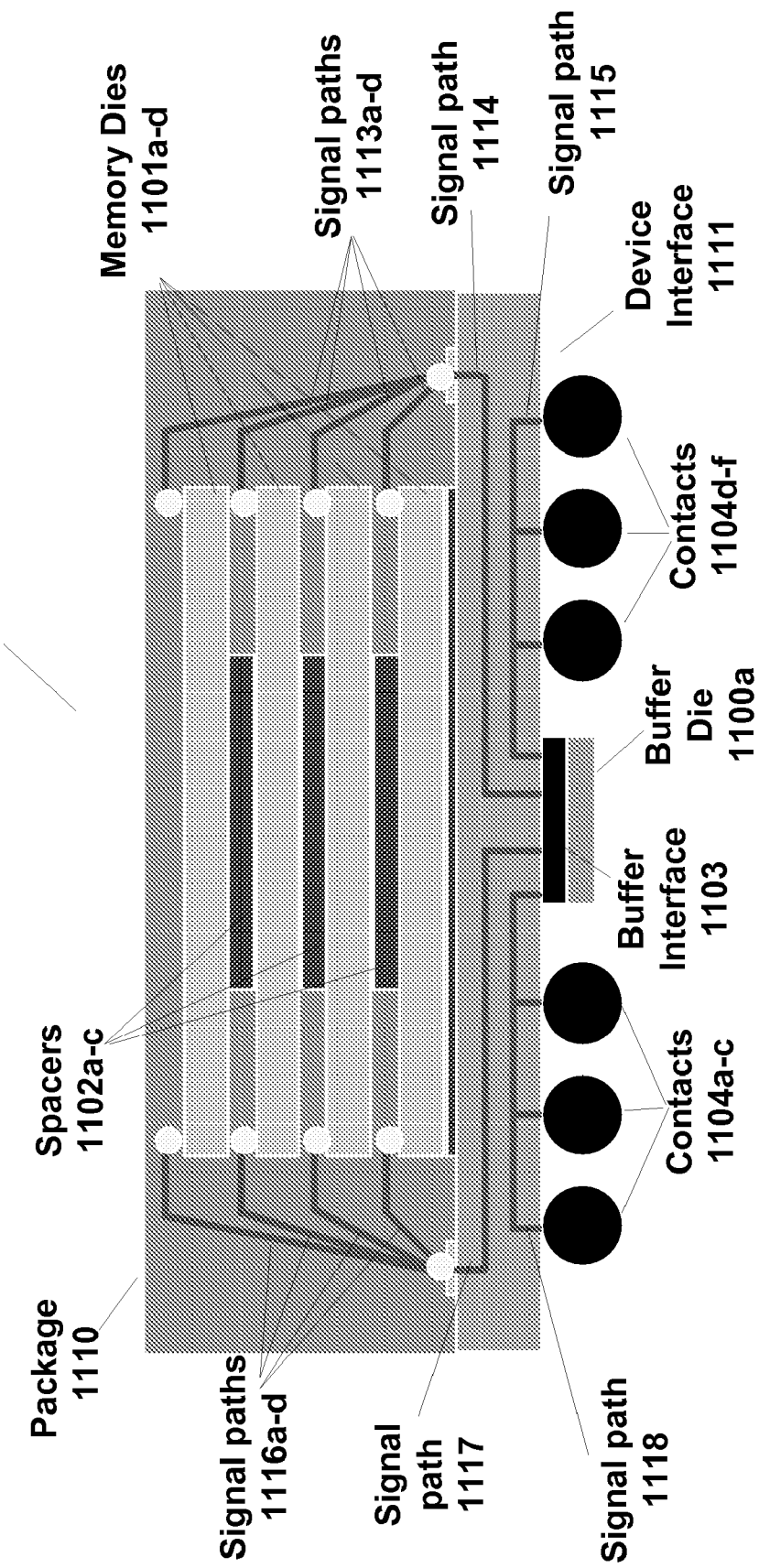
FIG. 11 illustrates a multi-chip package ("MCP") device having a plurality of integrated circuit memory dies and an integrated circuit buffer die.

FIG. 11 illustrates a device 1100 including a plurality of integrated circuit memory dies 1101a-d and a buffer die 1100a housed in or upon a common package 1110 according to embodiments. As described herein in other embodiments and illustrated in FIGS. 12-15 and 35, a plurality of integrated circuit memory dies 1101a-d and buffer die 1100a are disposed in multiple package type embodiments. For example, a plurality of integrated circuit memory dies 1101a-d and a buffer die 1100a may be stacked, on a flexible tape, side-by-side or positioned in separate packages on a device substrate. Buffer die 1100a is used to provide signals, including control/address/clock information and data, between a plurality of integrated circuit memory dies 1101a-d and a device interface 1111 that includes contacts 1104a-f. In an embodiment, one or more contacts 1104a-f is similar to contacts of connector interface 920. Contacts 1104a-f are used to couple device 1100 to substrate 910, and in particular to signal paths 120a and 121, of memory module 100 in an embodiment. Device interface 1111 also includes signal paths 1118 and 1115 to transfer signals between contacts 1104a-f and buffer 100a via buffer interface 1103. Signals are then transferred between a plurality of memory dies 1101a-d and buffer die 1100a via buffer interface 1103 and signal paths 1117 (disposed in device interface 1111) and 1116a-d as well as signal paths 1114 (disposed in device interface 1111) and 1113a-d. In an embodiment, spacers 1102a-c are positioned between integrated circuit memory dies 1101a-d. In an embodiment, spacers 1102a-c are positioned to dissipate heat. Similarly, buffer die 1100a is disposed away from a plurality of integrated circuit memory dies 1101a-d to alleviate heat dissipation near the memory devices. In an embodiment, signal paths are coupled to each other and integrated circuit memory dies 1101a-d by a solder ball or solder structure.

Figure 12:
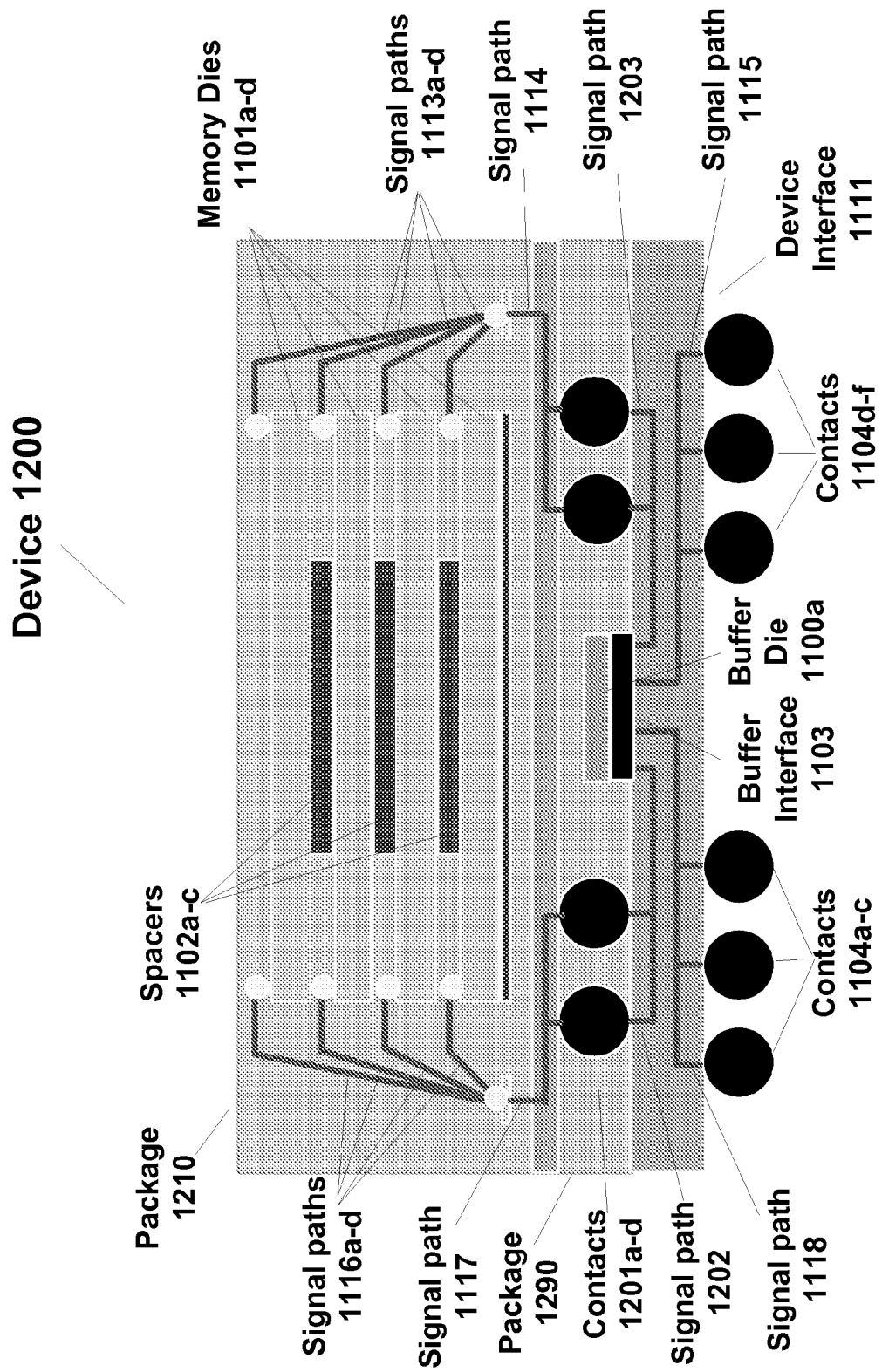
FIG. 12 illustrates a device having a plurality of integrated circuit memory dies and a buffer die.

FIG. 12 illustrates a stacked package device 1200 having a package 1210 containing a plurality of integrated circuit memory dies 1101a-d and a separate package 1290 having a buffer die 1100a. Both packages 1210 and 1290 are stacked and housed to make device 1200. In an embodiment, a plurality of integrated circuit memory dies has separate packages and is stacked on package 1290. Device 1200 has similar components illustrated in FIG. 11. Buffer die 1100a communicates with a plurality of integrated circuit memory dies 1101a-d as described herein. Device 1200 has memory dies 1101a-d stacked upon buffer die 1100a and separated by contacts 1201a-d. In an embodiment, contacts 1201a-d are solder balls that couple signal paths 1117 and 1114 to signal paths 1202 and 1203 that are coupled to buffer interface 1103.

Figure 13:
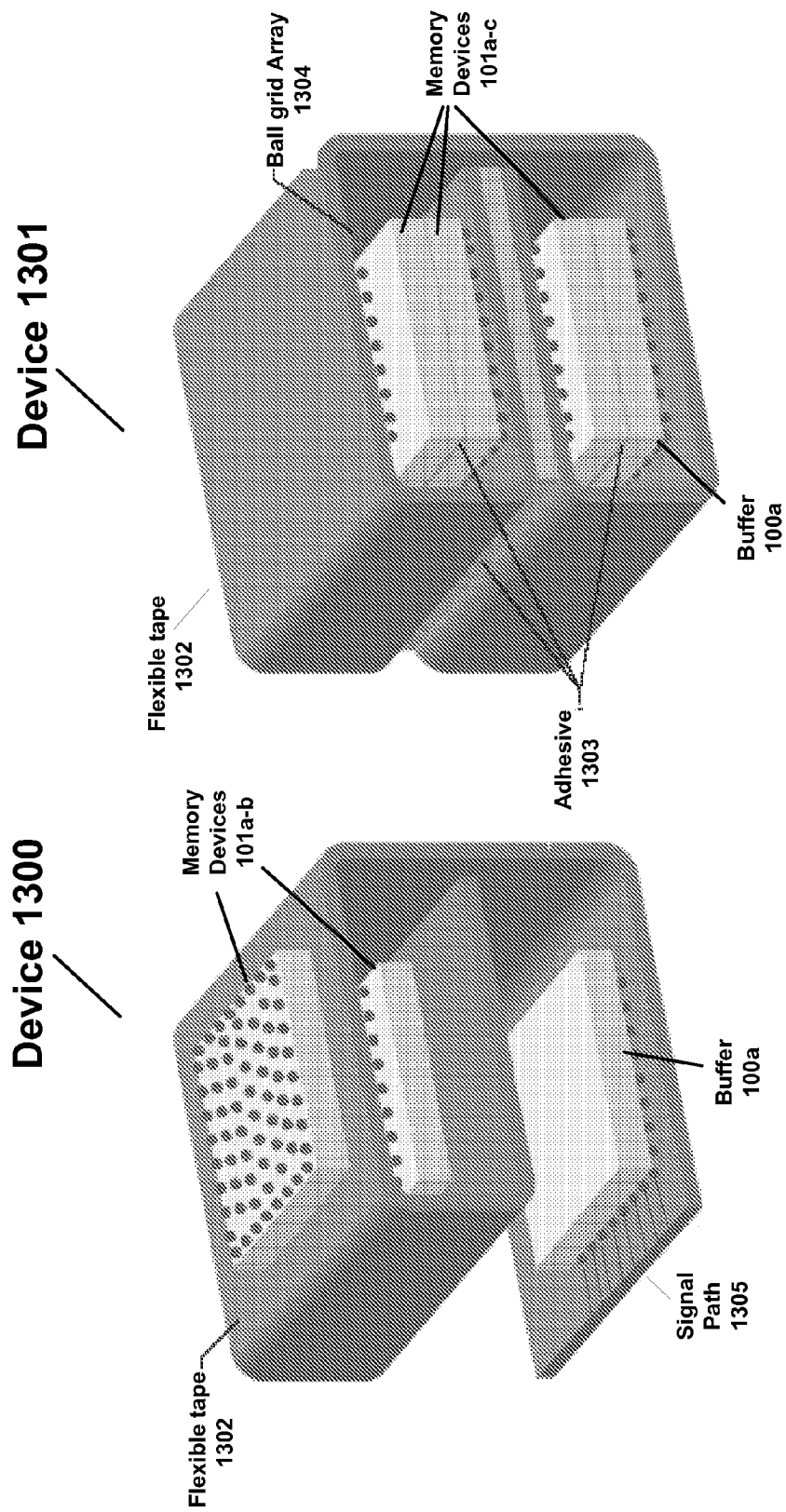
FIG. 13 illustrates a device having a plurality of integrated circuit memory devices and a buffer device that are disposed on a flexible tape.

FIG. 13 illustrates devices 1300 and 1301 having a plurality of integrated circuit memory devices 101a-b (101a-c in device 1301) and a buffer device 100a that are disposed on a flexible tape 1302 according to embodiments. Buffer device 100a communicates with a plurality of integrated circuit memory devices as described herein. Signal path 1305 disposed on or in flexible tape 1302 transfers signals between a plurality of integrated circuit memory devices 101a-c and buffer 100a. Contacts, such as a grid array of balls 1304, couple each integrated circuit memory device in a plurality of integrated circuit memory devices 101a-c and a buffer 100a to signal path 1305 in flexible tape 1302 in an embodiment. Adhesive 1303 may be used to couple a plurality of integrated circuit memory devices 101a-c to each other and to a buffer 100a in an embodiment. Device 1300 and 1301 are disposed in common package in an embodiment.

Figure 14:
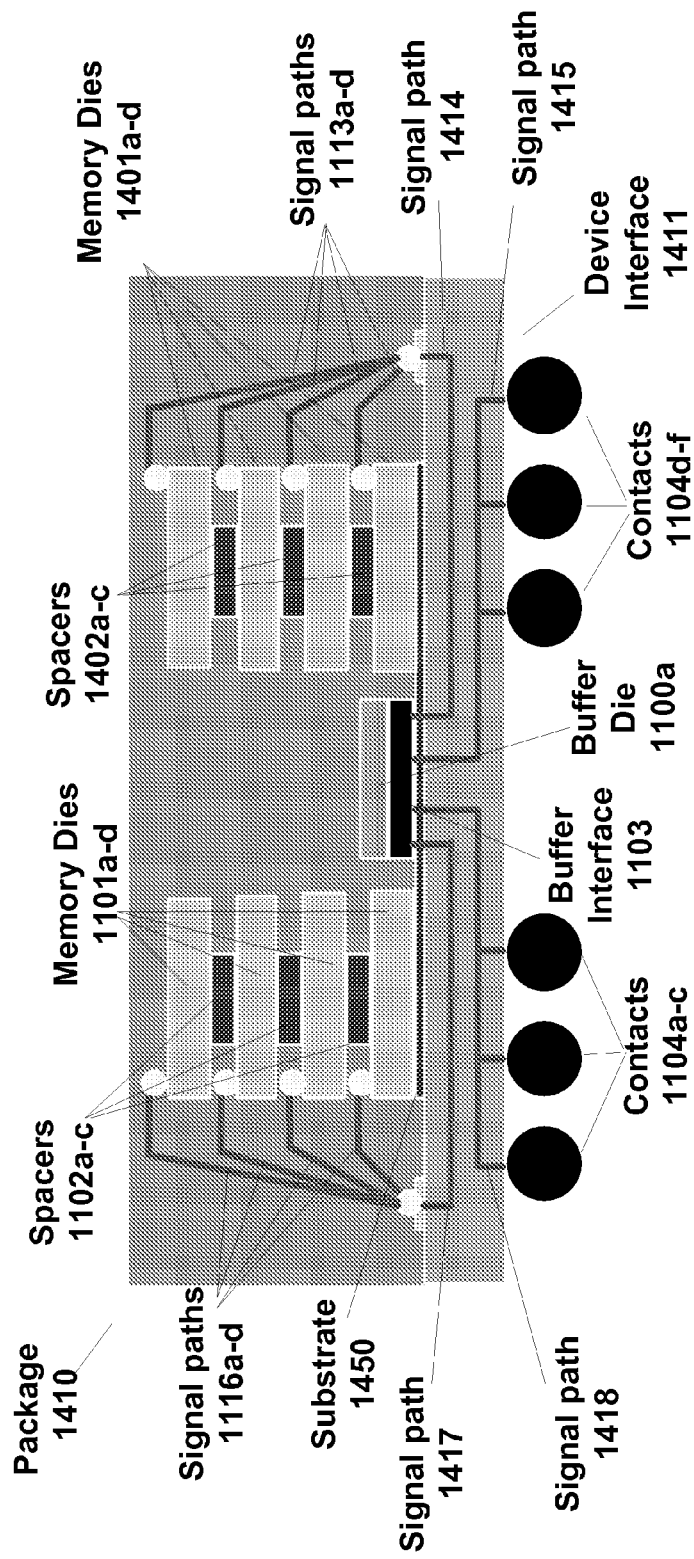
FIG. 14 illustrates a device having a plurality of integrated circuit memory dies and a buffer die that are disposed side-by-side and housed in a package.

FIG. 14 illustrates a device 1400 having a plurality of integrated circuit memory dies 1101a-d and 1401a-d and a buffer die 1100a that are disposed side-by-side and housed in a package 1410. Device 1400 has similar components illustrated in FIG. 11. Buffer die 1100a communicates with a plurality of integrated circuit memory dies 1101a-d and 1401a-d as described herein. In an embodiment, a plurality of integrated circuit memory dies 1101a-d and 1401a-d and a buffer die 1100a are disposed side-by-side on a substrate 1450 that is coupled to device interface 1411. A plurality of integrated circuit memory dies 1401a-d is separated by spacers 1402a-c. In an embodiment, a single integrated circuit memory die 1101d and a single integrated circuit memory die 1401d are disposed side-by-side with buffer die 1100a. Device interface 1411 includes contacts 1104a-f. Signals are transferred between buffer interface 1103 and contacts 1104a-f by signal paths 1418 and 1415. Signals are transferred between buffer interface 1103 and signal paths 1116a-d (or integrated circuit memory dies 1101a-d) by signal path 1417. Similarly, signals are transferred between buffer interface 1103 and signal paths 1113a-d (or integrated circuit memory dies 1401a-d) by signal path 1414.

Figure 15:
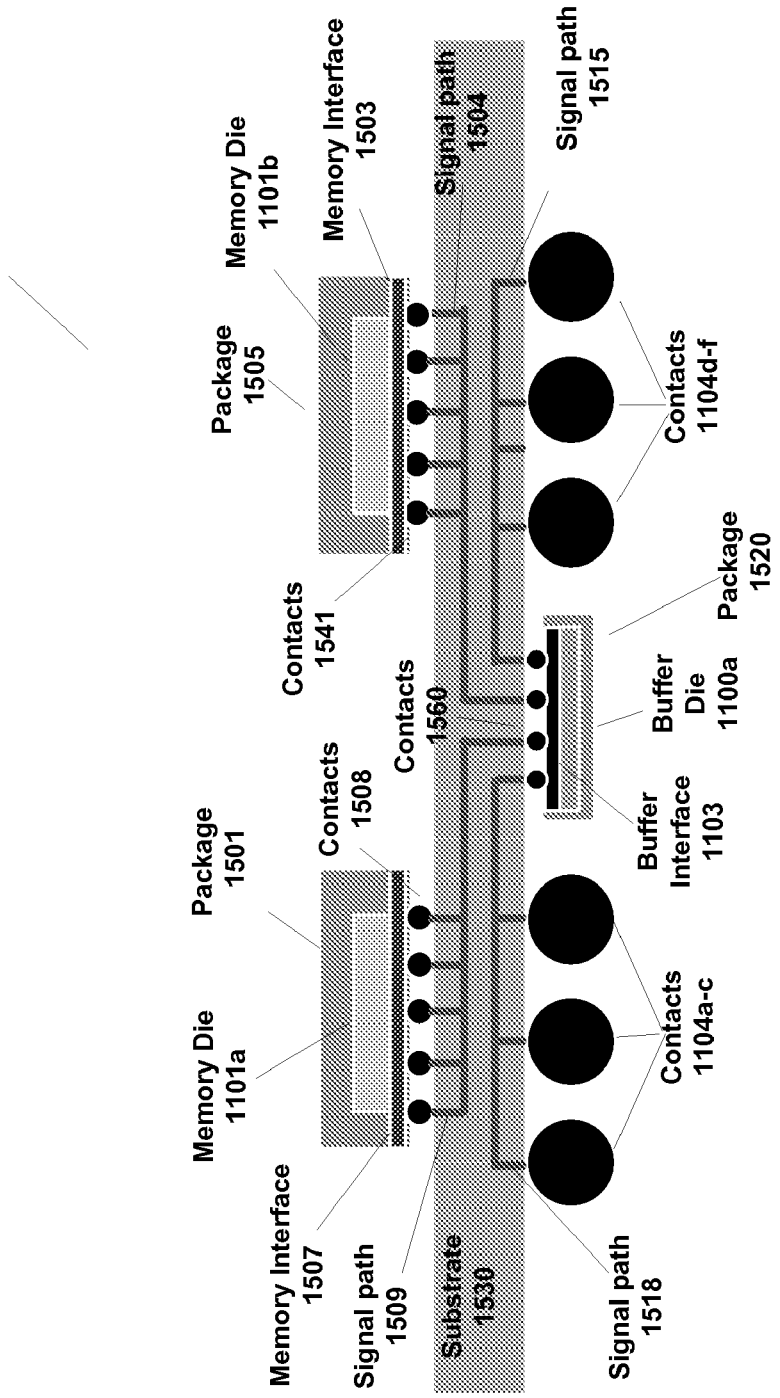
FIG. 15 illustrates a device having a plurality of integrated circuit memory dies and a buffer die that are housed in separate packages and integrated together into a larger package-on-a-package ("POP") device.

FIG. 15 illustrates a device 1500 having a plurality of integrated circuit memory dies 1101a-b and a buffer die 1100a that are housed in separate packages 1501, 1505 and 1520, respectively. Device 1500 has similar components illustrated in FIG. 11. Buffer die 1100a communicates with integrated circuit memory dies 1101a-b as described herein. Integrated circuit memory dies 1101a-b and a buffer die 1100a are disposed on substrate 1530 that includes signal paths 1504, 1509, 1515 and 1518. Integrated circuit memory die 1101a includes memory interface 1507 having contacts 1508. Integrated circuit memory die 1101b includes memory interface 1503 having contacts 1541. Buffer die 1100a includes a buffer interface 1103 having contacts 1560. Signals are transferred between buffer interface 1103 and contacts 1104a-f by signal paths 1515 and 1518. Signals are transferred between buffer interface 1103 and integrated circuit memory die 1101a by signal path 1509 via memory interface 1507 and contacts 1508. Similarly, signals are transferred between buffer interface 1103 and integrated circuit memory die 1101b by signal path 1504 via memory interface 1503 and contacts 1541. As described herein, device 1500 is coupled to a memory module 900 via contacts 1104a-f.

Figure 16:
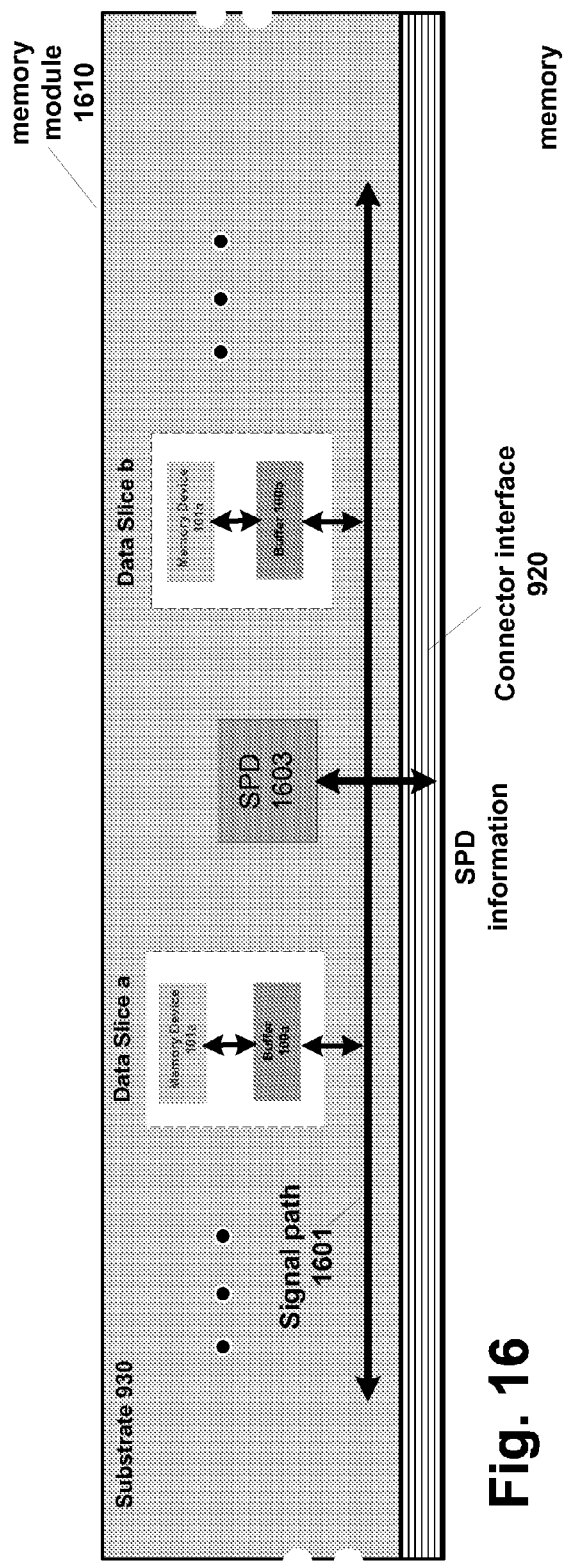
FIG. 16 illustrates a memory module topology including a serial presence detect device ("SPD")

FIG. 16 illustrates a memory module having an SPD 1603 according to an embodiment. Memory module 1610 includes a plurality of integrated circuit memory devices (or dies) and buffer devices (or dies) disposed on substrate 930 along with SPD 1603. FIG. 16 illustrates a memory module 1610 having a single SPD 1603 that can be accessed by each buffer device 100a-b positioned on substrate 930. Signal path 1601 allows access to SPD 1603 from connector interface 920 and one or more buffers 100a-b. In an embodiment, signal path 1601 is a bus. SPD 1603 may have configuration and/or parameter information written to or read by a master by way of connector interface 920 and signal path 1601. Likewise, buffers 100a-b may write to or read from SPD 1603 via signal path 1601.

Figure 17:
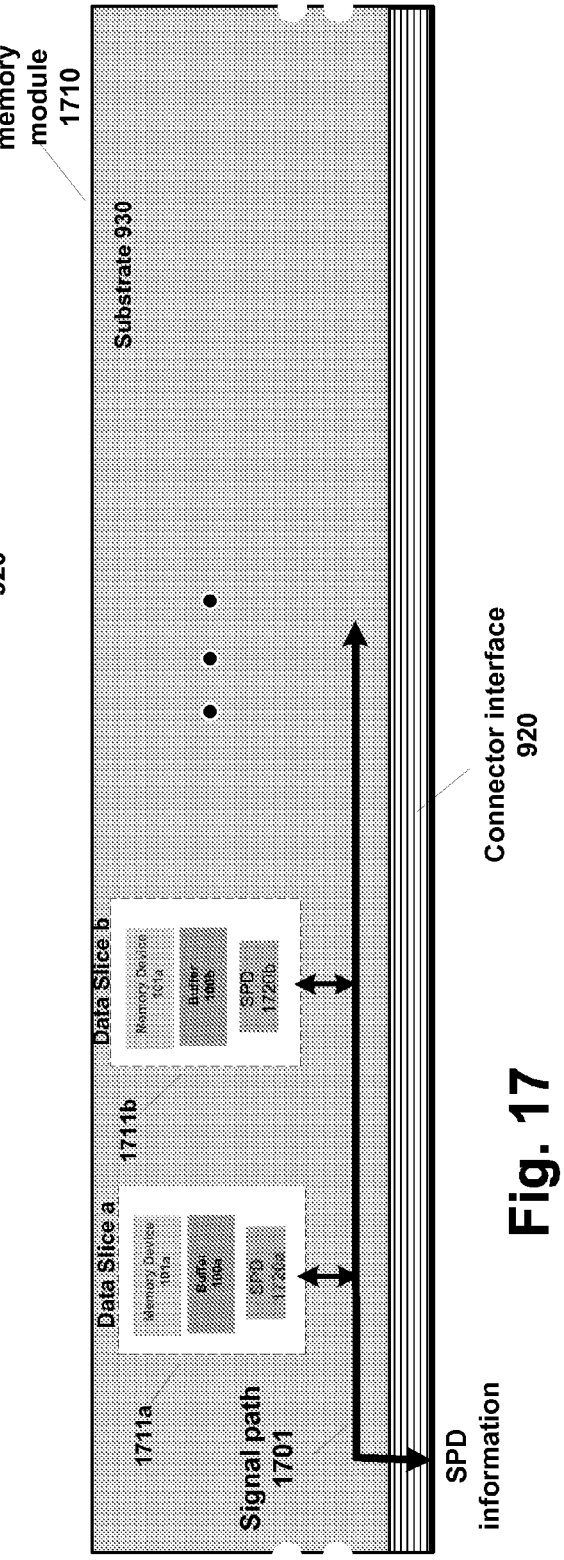
FIG. 17 illustrates a memory module topology with each data slice having an SPD.

FIG. 17 illustrates a memory module 1710 with each device 1711a-b or data slice a-b having an associated SPD 1720a-b, buffer device (or die) 100a-b and at least one integrated circuit memory device 101a (or die) according to an embodiment. The plurality of buffers 100a-b and associated plurality of SPDs 1720a-b are disposed on substrate 930. Configuration and/or parameter information is accessed from SPDs 1720a-b using signal path 1701, which is coupled, to connector interface 920 and each SPD 1720a-b. In particular, signal path 1701 couples SPD 1720a-b of device 1711a-b to connector interface 920. In an embodiment, signal path 1701 is a bus. In an alternate embodiment, signal path 1701 couples SPD 1720a and SPD 1720b in a daisy chain or serial topology. In an embodiment, one or more buffer devices 100a-b of devices 1711a-b may access (read and/or write) respective SPDs 1720a-b. Likewise, a master may access (read and/or write) respective SPDs 1720a-b using signal path 1701. In an embodiment, configuration and/or parameter information is transferred using a header field or other identifier so that SPDs coupled in a daisy chain may forward the SPD information to the intended destination SPD.

FIG. 18 illustrates a block diagram of a buffer device 100a (or die, such as buffer die 1100a) according to embodiments. Buffer 100a includes buffer interface 1103a, interfaces 1820a-c, redundancy and repair circuit 1883, multiplexer 1830, request and address logic circuit 1840, data cache and tags circuit 1860, computations circuit 1865, configuration register set 1881, and clock circuit 1870, singly or in combination.

In a memory read operation embodiment, buffer 100a receives control information (including address information) that may be in a packet format from a master on signal path 121 and in response, transmits corresponding signals to one or more, or all of memory devices 101a-d on one or more signal paths 1005. One or more of memory devices 101a-d may respond by transmitting data to buffer 100a which receives the data via one or more signal paths 1006 and in response, transmits corresponding signals to a master (or other buffer). A master transmits the control information via one or more signal paths 121 and receives the data via one or more signal paths 120a.

By bundling control and address information in packets, protocols required to communicate to memory devices 101a-d are independent of the physical control/address interface implementation.

In a memory write operation embodiment, buffer 100a receives control information (including address information) that may be in a packet format from a master on signal path 121 and receives the write data for one or more memory devices 101a-d that may be in a packet format from a master on signal path 120a. Buffer 100a then transmits corresponding signals to one or more, or all of memory devices 101a-d on one or more signal paths 1006 so that the write data may be stored.

A master transmits the control/address/clock information via one or more signal paths 121 and transmits the write data via one or more signal paths 120a.

In an embodiment, simultaneous write and/or read operations may occur for different memory devices in memory devices 101a-d.

In an embodiment, control information that is provided to buffer 100a causes one or more memory operations (such as write and/or read operations) of one or more memory devices 100a-d, while the same control information may be provided to buffer 100b which causes the same memory operations of one or more memory devices 100a-d associated with buffer 100b. In another embodiment, the same control information may be provided to buffer 100a and buffer 100b, yet different memory operations occur for the one or more memory devices 100a-d associated with each buffer 100a-b.

In an embodiment, buffer interface 1103a couples signal paths 121 and 120a to buffer 100a as shown in FIG. 10. In an embodiment, buffer interface 1103a corresponds to buffer interface 1103 shown in FIGS. 11, 12, 14 and 15. In an embodiment, buffer interface 1103a includes at least one transceiver 1875 (i.e. transmit and receive circuit) coupled to signal path 120a to transmit and receive data and at least one receiver circuit 1892 coupled to signal path 121 to receive control/address/clock information. In an embodiment, signal paths 121 and 120a include point-to-point links. Buffer interface 1103a includes a port having at least one transceiver 1875 that connects to a point-to-point link. In an embodiment, a point-to-point link comprises one or a plurality of signal lines, each signal line having no more than two transceiver connection points. One of the two transceiver connection points is included on buffer interface 1103a. Buffer interface 1103a may include additional ports to couple additional point-to-point links between buffer 100a and other buffer devices on other devices and/or memory modules. These additional ports may be employed to expand memory capacity as is described in more detail below. Buffer 100a may function as a transceiver between a point-to-point link and other point-to-point links. In an embodiment, buffer interface 1103a includes a repeater circuit 1899 to repeat data, control information and/or a clock signal. In an embodiment, buffer interface 1103a includes a bypass circuit 1898 to transfer signals between connector interface portions.

In an embodiment, termination 1880 is disposed on buffer 100*a* and is connected to transceiver 1875 and signal path 120*a*. In this embodiment, transceiver 1875 includes an output driver and a receiver. Termination 1880 may dissipate signal energy reflected (i.e., a voltage reflection) from transceiver 1875. Termination 1880, as well as other termination described herein, may be a resistor or capacitor or inductor, singly or a series/parallel combination thereof. In alternate embodiments, termination 1880 may be external to buffer 100*a*. For example, termination 1880 may be disposed on a substrate 910 of a memory module 900 or on a package used to house buffer 100*a*.

Interface 1820*a* includes at least one transmitter circuit 1893 coupled to signal path 1005 to transmit control/address/clock information to one or more memory devices. In an embodiment, interface 1820*a* includes a transceiver that may transfer control/address/clock information between buffers disposed on a common memory module or different memory modules.

Interface 1820*b* includes a transceiver 1894 coupled to signal path 1006 to transfer data between buffer 100*a* and one or more memory devices 101*a-d* as illustrated in FIG. 10. SPD logic and interface 1820*c* includes a transceiver 1896 coupled to signal path 1004 to transfer configuration and/or parameter information between buffer 100*a* and an SPD 1002 as illustrated in FIG. 10. In an embodiment, interface 1820*c* is used to transfer configuration and/or parameter information as illustrated in FIGS. 16 and 17.

According to an embodiment, multiplexer 1830 may perform bandwidth-concentrating operations between buffer interface 100*a* and interface 1820*b* as well as route data from an appropriate source (i.e. target a subset of data from memory devices, internal data, cache or write buffer). The concept of bandwidth concentration involves combining the (smaller) bandwidth of each data path coupled to a memory device in a multiple data signal path embodiment to match the (higher) overall bandwidth utilized by buffer interface 1103*a*. In an embodiment, multiplexing and demultiplexing of throughput between the multiple signal paths that may be coupled to interface 1820*b* and buffer interface 1103*a* is used. In an embodiment, buffer 101*a* utilizes the combined bandwidth of multiple data paths coupled to interface 1820*b* to match the bandwidth of interface buffer interface 1103*a*.

In an embodiment, data cache and tags circuit 1860 (or cache 1860) may improve memory access time by providing storage of most frequently referenced data and associated tag addresses with lower access latency characteristics than those of the plurality of memory devices. In an embodiment, cache 1860 includes a write buffer that may improve interfacing efficiency by utilizing available data transport windows over an external signal path to receive write data and address/mask information. Once received, this information is temporarily stored in a write buffer until it is ready to be transferred to at least one memory device over interface 1820*b*.

Computations circuit 1865 may include a processor or controller unit, a compression/decompression engine, etc., to further enhance the performance and/or functionality of buffer 100*a*. In an embodiment, computations circuit 1865 controls the transfer of control/address/clock information and data between buffer interface 1103*a* and interfaces 1820*a-c*.

Clock circuit 1870 may include a clock generator circuit (e.g., Direct Rambus® Clock Generator), which may be incorporated onto buffer 101*a* and thus may eliminate the need for a separate clock generating device.

In an alternate embodiment, clock circuit 1870 include clock alignment circuits for phase or delay adjusting an internal clock signal with respect to an external clock signal, such as a phase lock loop ("PLL") circuit or delay lock loop ("DLL") circuit. Clock alignment circuits may utilize an external clock from an existing clock generator, or an internal clock generator to provide an internal clock, to generate internal synchronizing clock signals having a predetermined temporal relationship with received and transmitted data and/or control information.

In an embodiment, clock circuit 1870 receives a first clock signal having a first frequency via signal path 121 and generates a second clock signal (via interface 1820*a*) to memory device 101*a* using the first clock signal and also generates a third clock signal (via interface 1820*a*) to memory device 101*b* using the first clock signal. In an embodiment, the second and third clock signals have a predetermined temporal (phase or delay) relationship with the first clock signal.

In an embodiment, a transmit circuit (such as in transceivers 1875, 1896 and 1894 shown in FIG. 18) transmits a differential signal that includes encoded clock information and a receiver circuit (such as in transceiver 1875, 1896 and 1894) receives a differential signal that includes encoded clock information. In this embodiment, a clock and data recovery circuit (such as clock circuit 1870) is included to extract the clock information encoded with the data received by the receiver circuit. Likewise, clock information may be encoded with data transmitted by the transmit circuit. For example, clock information may be encoded onto a data signal, by ensuring that a minimum number of signal transitions occur in a given number of data bits.

In an embodiment, a transceiver 1875 transmits and receives a first type of signal (for example, a signal having specified voltage levels and timing), while transceivers 1894 (and/or transmit circuit 1893) transmits and receives a second different type of signal. For example, transceiver 1875 may transmit and receive signals for a DDR2 memory device and transceivers 1894 may transmit and receive signals for a DDR3 memory device.

In an embodiment, the control information and/or data that is provided to buffer 100*a* (by way of signal paths 121 and 120) may be in a different protocol format or have different protocol features than the control information and/or data provided to one or more memory devices 100*a-d* from buffer 100*a*. Logic (for example computation circuit 1865) in buffer 100*a* performs this protocol translation between the control information and/or data received and transmitted. A combination of the different electrical/signaling and control/data protocol constitute an interface standard in an embodiment. Buffer 100*a* can function as a translator between different interface standards—one for the memory module interface (for example connector interface 920) and another for one or more memory devices 100*a-d*. For example, one memory module interface standard may require reading a particular register in a particular memory device disposed on the memory module. Yet, a memory module may be populated with memory devices that do not include the register required by the memory module interface standard. In an embodiment, buffer 100*a* may emulate the register required by the memory module interface standard and thus allow for the use of memory devices 100*a-d* that operate under a different interface standard. This buffer functionality, combined with the module topology and architecture, enables a memory module to be socket compatible with one interface standard, while using memory devices with a different interface standard.

In an embodiment, buffer 100*a* includes a redundancy and repair circuit 1883 to test and repair the functionality of memory cells, rows or banks of a memory device, entire memory devices (or periphery circuits) and/or signal paths between buffer 100*a* and memory devices 101*a-d*. In an embodiment, redundancy and repair circuit 1883 periodically, during a calibration operation and/or during initialization, tests one or more of memory devices 101*a-d* by writing a predetermined plurality of values to a storage location in a selected memory device (for example, using transceiver 1894 and a look-up table storing the predetermined values) using a selected data path and then reading back the stored predetermined plurality of values from the selected memory device using the selected data path. In an embodiment, when the values read from the storage location of the selected memory device do not match the values written to the storage location, redundancy and repair circuit 1883 eliminates access by buffer 100*a* to the selected memory device and/or selected signal path. In an embodiment, a different signal path to a different memory device may be selected and this testing function may be performed again. If selecting the different signal path results in an accurate comparison of read predetermined values to the predetermined values in redundancy and repair circuit 1883 (or a pass of the test), the different memory address to a different memory location, within or to another memory device, is selected or mapped thereafter. Accordingly, future write and/or read operations to the defective memory location will not occur.

In an embodiment, any multiplexed combination of control information (including address information) and data intended for memory devices 101*a-d* coupled with buffer 100*a* is received via buffer interface 1103*a*, which may, for example extract the address and control information from the data. For example, control information and address information may be decoded and separated from multiplexed data on signal path 120*a* and provided on signal path 1895 to request and address logic circuit 1840 from buffer interface 1103*a*. The data may then be provided to configurable serialization/deserialization circuit 1891. Request and address logic circuit 1840 generates one or more control signals to transmitter circuit 1893.

Interfaces 1820*a* and 1820*b* include programmable features in embodiments. A number of control signal lines and/or data signal lines between buffer 100*a* and memory devices 101*a-d* are programmable in order to accommodate different numbers of memory devices. Thus, more dedicated control signal lines are available with an increased number of memory devices. Using programmable dedicated control lines and/or data lines avoids any possible load issues that may occur when using a bus to transfer control signals between memory devices and a buffer 100*a*. In another embodiment, additional data strobe signals for each byte of each memory device may be programmed at interface 1820*b* to accommodate different types of memory devices, such as legacy memory devices that require such a signal. In still a further embodiment, interfaces 1820*a* and 1820*b* are programmable to access different memory device widths. For example, interfaces 1820*a* and 1820*b* may be programmed to connect to 16"×4" width memory devices, 8"×8" width memory devices or 4"×16" width memory devices. Likewise, buffer interface 1103*a* has a programmable width for signal path 120*a*.

Configurable serialization/deserialization circuit 1891 performs serialization and deserialization functions depending upon a stored serialization ratio. As a memory device access width is reduced from its maximum value, memory device access granularity (measured in quanta of data) is commensurately reduced, and an access interleaving or multiplexing scheme may be employed to ensure that all storage locations within memory devices 101*a-d* can be accessed. The number of signal paths 1006 may be increased or decreased as the memory device access width changes. Signal path 1006 may be subdivided into several addressable subsets. The address of the transaction will determine which target subset of signal path 1006 will be utilized for the data transfer portion of the transaction. In addition, the number of transceiver, transmitter and/or receiver circuits included in interfaces 1820*a* and 1820*b* that are employed to communicate with one or more memory devices 101*a-d* may be configured based on the desired serialization ratio. Typically, configuration of the transceivers may be effectuated by enabling or disabling how many transceivers are active in a given transfer between one or more memory devices 101*a-d* and buffer interface 1103*a*. In an embodiment, a data rate of transferring data at buffer interface 1103*a* is a multiple or ratio of a data rate of transferring data on one or more signal paths 1006 coupled to memory devices 101*a-d*.

Buffer 100*a* provides a high degree of system flexibility. New interface standards of memory devices may be phased in to operate with a master or a memory system that supports older interface standards by modifying buffer 100*a*. In an embodiment, a memory module may be inserted using an older memory module interface or socket, while newer generation memory devices may be disposed on the memory module. Backward compatibility with existing generations of memory devices may be preserved. Similarly, new generations of masters, or controllers, may be phased in which exploit features of new generations of memory devices while retaining backward compatibility with existing generations of memory devices. Similarly, different types of memory devices that have different costs, power requirements and access times may be included in a single common package for specific applications.

FIG. 19 illustrates an integrated circuit memory device 1900 (or a memory die) in an embodiment. Integrated circuit memory device 1900 corresponds to one or more integrated circuit memory devices 101*a-d* in embodiments. Integrated circuit memory device 1900 includes a memory core 1900*b* and a memory interface 1900*a*. Signal paths 1950*a-b*, 1951*a-b*, 1952 and 1953 are coupled to memory interface 1900*a*. Signal paths 1950*a-b* transfer read and write data. Signal paths 1951*a-b* transfer address information, such as a row address and a column address in packets, respectively. Signal path 1952 transfers control information. Signal path 1953 transfers one or more clock signals. In an embodiment, signal paths 1950*a-b* correspond to signal path 120*a* shown in FIG. 10 and signal paths 1951*a-b*, 1952 and 1953 correspond to signal path 121 in FIG. 10.

Memory interface 1900*a* includes at least one transmitter and/or receiver for transferring signals between memory device 1900 and signal paths 1950*a-b*, 1951*a-b*, 1952 and 1953. Write demultiplexer ("demux") 1920 and read multiplexer ("mux") 1922 are coupled to signal path 1950*a*, while write demux 1921 and read mux 1923 are coupled to signal path 1950*b*. Write demux 1920-21 provide write data from signal paths 1950*a-b* to memory core 1900*b* (in particular sense amplifiers 0-2*a* and 0-2*b*). Read mux 1922-23 provide read data from memory core 1900*b* to signal paths 1950*a-b* (in particular sense amplifiers Na and Nb).

Demux and row packet decoder 1910 is coupled to signal path 1951*a* and Demux and column packet decoder 1913 is coupled to signal path 1951*b*. Demux and row packet decoder 1910 decodes a packet and provides a row address to row decoder 1914. Demux and Column packet decoder 1913 provides a column address and mask information to column and mask decoder 1915.

Control registers 1911 are coupled to signal path 1952 and provide control signals to row decoder 1914 and column and mask decoder 1915 in response to register values.

A clock circuit is coupled to signal path 1953 to provide a transmit clock signal TCLK and a receive clock signal RCLK in response to one or more clock signals transferred on signal path 1953. In an embodiment, write demux 1920 and 1921 provide write data from signal paths 1950*a-b* to memory core 1900*b* in response to an edge of receive clock signal RCLK. In an embodiment, read mux 1922 and 1923 provide read data from memory core 1900*b* to signal paths 1950*a-b* in response to an edge of a transmit clock signal TCLK. In an embodiment, the clock circuit generates a clock signal on signal path 1953 (to a buffer device) that has a temporal relationship with read data that are output on signal paths 1950*a-b*.

Row decoder 1914 and column and mask decoder 1915 provide control signals to memory core 1900*b*. For example, data stored in a plurality of storage cells in a memory bank is sensed using sense amplifiers in response to a row command. A row to be sensed is identified by a row address provided to row decoder 1914 from demux and row packet decoder 1910. A subset of the data sensed by a sense amplifier is selected in response to a column address (and possible mask information) provided by demux and column packet decoder 1913.

A memory bank in memory banks 0-N of memory core 1900*b* includes a memory array having a two dimensional array of storage cells. In embodiments, memory banks 0-N include storage cells that may be DRAM cells, SRAM cells, FLASH cells, ferroelectric RAM ("FRAM") cells, magnetoresistive or magnetic RAM ("MRAM") cells, or other equivalent types of memory storage cells. In an embodiment, integrated circuit memory device 1900 is a DDR integrated circuit memory device or later generation memory device (e.g., DDR2 or DDR3). In an alternate embodiment, integrated circuit memory device 1900 is an XDR™ DRAM integrated circuit memory device or Direct Rambus® DRAM ("DRDRAM") memory device. In an embodiment, integrated circuit memory device 1900 includes different types of memory devices having different types of storage cells housed in a common package.

Figure 20A:
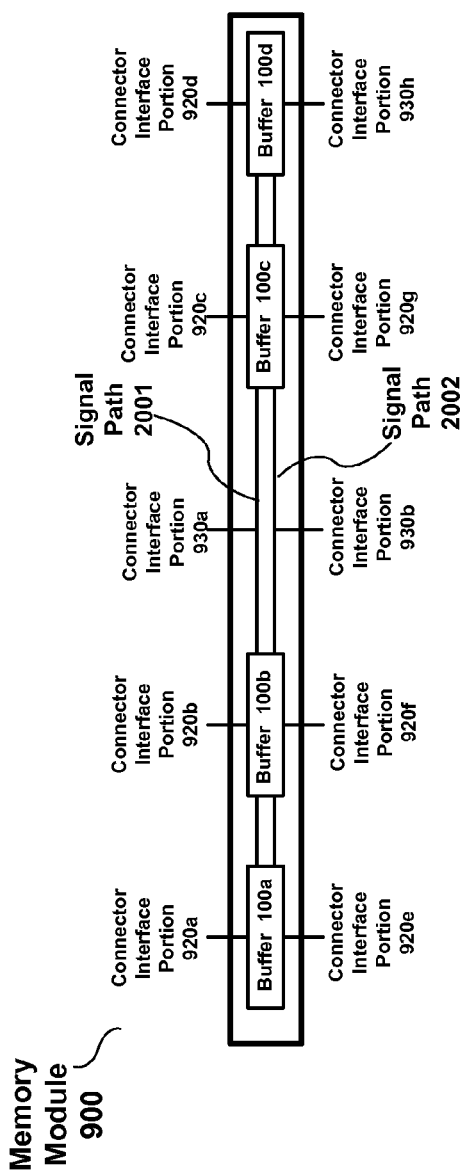
FIGS. 20A-B illustrate signal paths between memory module interface portions and a plurality of integrated circuit buffer devices.
Figure 20B:
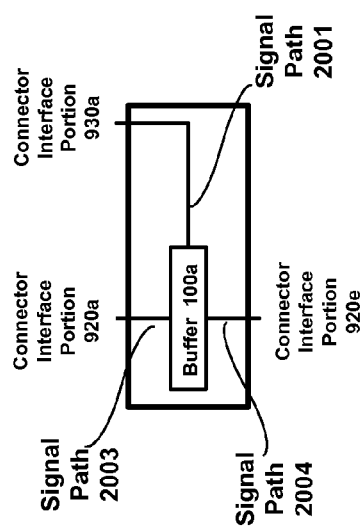

FIGS. 20A-B illustrate signal paths between memory module interface portions and a plurality of integrated circuit buffer devices. In particular, FIG. 20A illustrates how each buffer device 100*a-d* has signal paths for data signals coupled to each connector interface portion 920*a-h*. In an embodiment, FIGS. 20A-B illustrate signal paths between buffer devices and connector interfaces of memory module 900 that include a plurality of memory devices as shown in FIGS. 9A-C. For example, FIG. 20B which shows an expanded section of FIG. 20A, illustrates how data signal paths 2003 and 2004 provide data signals between connector interface portions 920*a* and 920*e* and buffer device 100*a*. FIG. 20A also illustrates how signal paths for control/address signals, such as control/address signal paths 2001 and 2002, couple connector interface portions 930*a* and 930*b* to buffer devices 100*a-d*. In an embodiment, each signal path 2001 and 2002 is a multi-drop bus as shown in FIG. 1.

FIGS. 21A-D illustrate memory system point-to-point topologies including a master 2101 and at least one memory module having a plurality of integrated circuit memory devices (The plurality of memory devices on respective memory modules are not illustrated in FIGS. 21A-D, 22A-C, 23A-C and 24A-B for clarity). In an embodiment, FIGS. 21A-D, 22A-C, 23A-C and 24A-B illustrate signal paths between memory modules, such as memory module 900 as shown in FIGS. 9A-C, and other memory modules and/or masters. FIGS. 21A-D illustrate expanding memory capacity and bandwidth as well as different configurations. In particular, master 2101 is coupled to interfaces (such as sockets) 2102 and 2103 by signal paths 2120, 2121*a-b*, 2122 and 2123 in Dynamic Point-to-Point ("DPP") system 2100*a*. In an embodiment, master 2101, interfaces 2102 and 2103 as well as signal paths 2120, 2121*a-b*, 2122 and 2123 are disposed on a substrate, such as a printed circuit board ("PCB"). In an embodiment, memory modules may be inserted and/or removed (unpopulated) from interfaces 2102 and 2103. In an embodiment, signal paths 2120, 2121*a-b*, 2122 and 2123 are signal traces on a PCB. In an embodiment, signal paths 2120 and 2121*a-b* provide data between data signal paths on a memory module, such as signal paths 120*a* and 120*b* shown in FIG. 1, and master 2101. In an embodiment, signal paths 2122 and 2123 provide control/address information to the memory modules (via interfaces 2102 and 2103 and in particular connector interface portions 930*b* of the memory modules) from master 2101. In particular, control/address information is provided from signal paths 2122 and 2123 to a signal path on the memory modules, such as signal path 121 shown in FIG. 1.

Figure 21B:
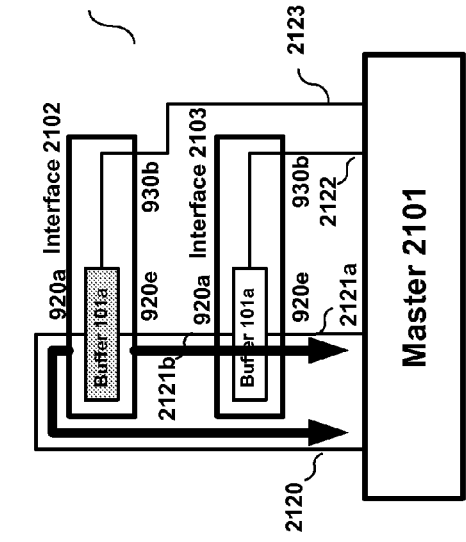
FIGS. 21A-D illustrate memory system point-to-point topologies including a master and at least one memory module (shown as buffer 101a) having a plurality of integrated circuit memory devices.
Figure 21D:
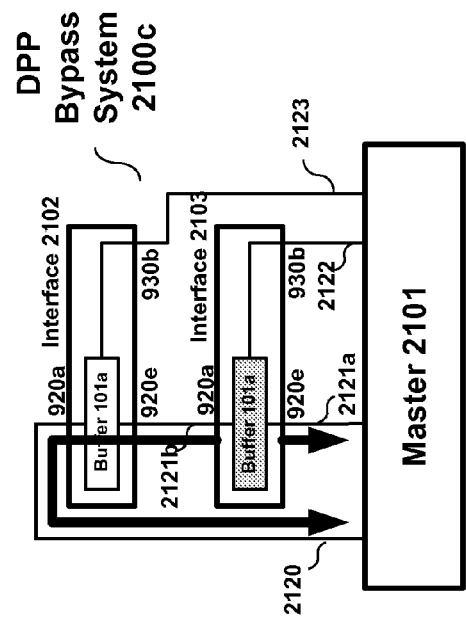
Figure 21A:
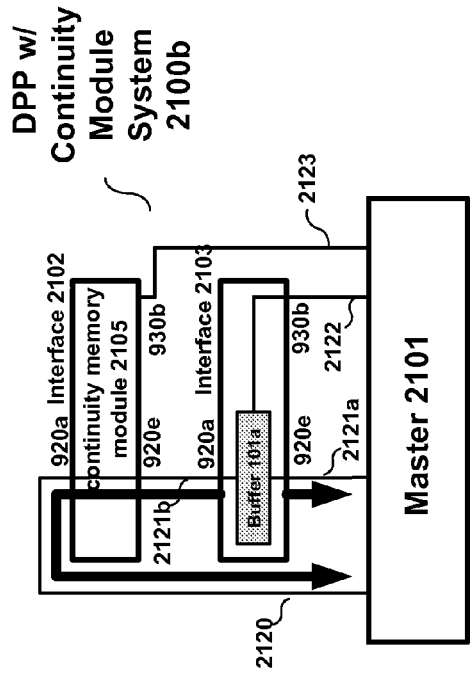

FIG. 21A illustrates a DPP system 2100*a* that simultaneously accesses two buffer devices in memory modules coupled to interfaces 2102 and 2103. In response to control and address information provided on signal paths 2122 and 2123 from master 2101, the two buffers 101*a* output data simultaneously from connector interface portions 920*a* and 920*e*, respectively, onto signal paths 2120 and 2121*a*, that are coupled to master 2101. In an embodiment, signal paths 2120 and 2121*a* are point-to-point links. In an embodiment, a point-to-point link includes one or a plurality of signal lines, each signal line generally having two transceiver connection points, each transceiver connection point coupled to a transmitter circuit, receiver circuit or transceiver circuit. For example, a point-to-point link may include a transmitter circuit coupled at or near one end and a receiver circuit coupled at or near the other end. The point-to-point link may be synonymous and interchangeable with a point-to-point connection or a point-to-point coupling.

In an embodiment, the number of transceiver points along a signal line may distinguish between a point-to-point link and a bus. For example, a point-to-point link generally includes only two transceiver connection points while a bus generally includes more than two transceiver points. In some instances a point to point link can be mixed with bussed signal lines, where the bussed single lines may be used to provide sideband functionality such as maintenance, initialization or test.

Several embodiments of point-to-point links include a plurality of link topologies, signaling, clocking and signal path types. Embodiments having different link architectures include simultaneous bi-directional links, time-multiplexed bi-directional links and multiple unidirectional links. Voltage or current mode signaling may be employed in any of these link topologies.

FIG. 21B illustrates a DPP with Continuity Module system 2100*b* for accessing a buffer device 101*a* in a memory module coupled to interface 2103 while a continuity memory module 2105 is coupled to interface 2102. In an embodiment, master 2101 outputs a single set of control/address information on signal paths 2122 and 2123. Data is output from connector interfaces 920*a* and 920*e* of the memory module coupled to interface 2103 in response to the single set of control/address information. Data is provided to master 2101 on signal path 2120 via signal path 2121*b* and a bypass circuit in continuity memory module 2105. The bypass circuit passes the data from connector interface portion 920*e* to connector interface portion 920*a* in continuity memory module 2105. Data is also provided to master 2101 by signal path 2121*a*.

Figure 21C:
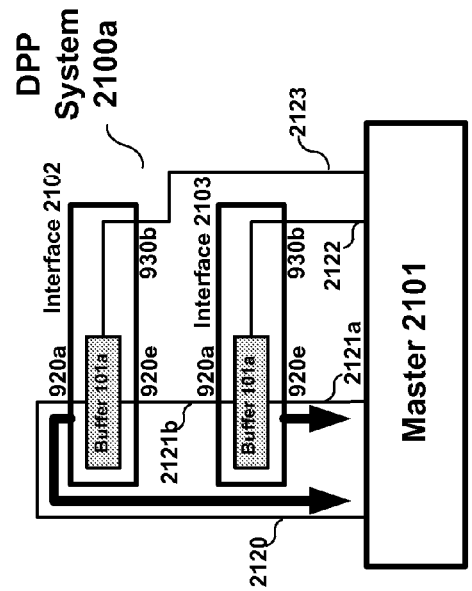

FIG. 21C illustrates a DPP bypass system 2100c similar to system 2100b except that a buffer device 101a (rather than continuity memory module 2105) in a memory module includes a bypass circuit for passing the data from connector interface portion 920e to connector interface portion 920a of the memory module inserted in interface 2102.

FIG. 21D illustrates a DPP bypass system 2100d similar to system 2100c except that data is accessed from buffer device 101a of the memory module coupled to interface 2102 and buffer device 101a of the memory module coupled to interface 2103 includes a bypass circuit for passing the data from connector interface portion 920a to connector interface portion 920e.

In an embodiment, a clock signal or clock information is provided on signal paths 2122 and 2123, on a separate signal path from a clock source or master 2101, or along the data signal paths 2121a-b.

Figure 22A:
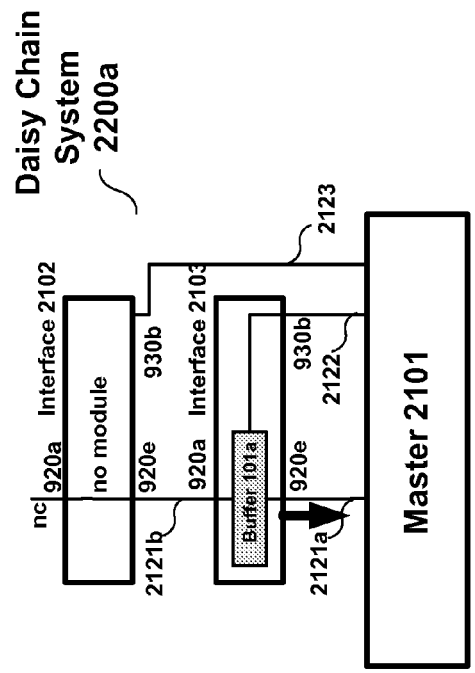
FIGS. 22A-C illustrate memory system daisy chain topologies including a master and at least one memory module having a plurality of integrated circuit memory devices.
Figure 22C:
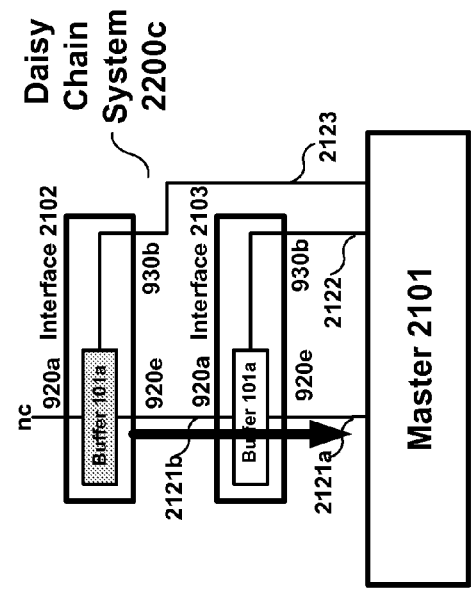
Figure 22B:
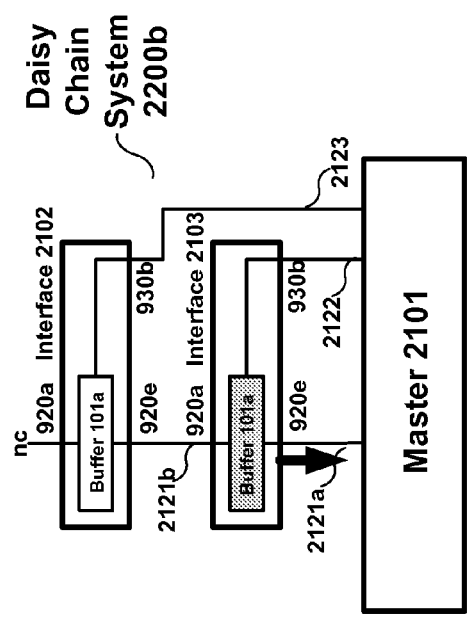

FIGS. 22A-C illustrate memory system daisy chain topologies including a master 2101 and at least one memory module having a plurality of integrated circuit memory devices. In particular, FIGS. 22A-C illustrate how half of the bandwidth, as compared to system 2100a-d, is obtained when accessing a single memory module in an embodiment. FIG. 22A illustrates a Daisy Chain system 2200a that includes a buffer 101a in a memory module coupled to interface 2103 that provides data (by way of connector interface portion 920e) on signal path 2121a in response to a single set of control/address information output by master 2101 onto signal paths 2122 and 2123. No module is coupled to interface 2102.

FIG. 22B illustrates a Daisy Chain system 2200b that is similar to system 2200a except a memory module is coupled to interface 2102.

FIG. 22C illustrates a Daisy Chain system 2200c similar to system 2200b except that data accessed from a buffer device 101a in a memory module is coupled to interface 2102 rather than interface 2103. Buffer device 101a in a memory module coupled to interface 2103 provides a bypass circuit to allow data to be received at interface portion 920a and output at interface portion 920e of the memory module coupled to interface 2103. Data is thus passed from data path 2121b to data path 2121a and ultimately to master 2101.

FIGS. 23A-C and 24A-B illustrate memory system topologies including a master to provide control/address information to a plurality of integrated circuit buffer devices. In particular, FIG. 23A illustrates a Dedicated/Fly-by system 2300a that includes a master 2101 that provides control/address information to memory modules 2301a and 2301b (in particular to integrated circuit buffer devices 101a-d on each memory module) by signal paths 2311 and 2310, respectively. In an embodiment, signal paths 2310 and 2311 are separate and carry control/address information for each respective memory module. In an embodiment, signal path 2311 does not pass through or include a signal path in memory module 2301b. In an embodiment, signal path 2311 does not pass through or include an interface, such as a socket, used for memory module 2301b. The double headed arrow in FIGS. 23A-C, 24A-B and 25A-B illustrate the data information (read and write data) transferred on separate data paths between memory modules 2301a-b (and in particular from buffer devices) and master 2101. In an embodiment, a clock signal or clock information is provided on signal paths 2310 and 2311, on a separate signal path from a clock source or master 2101, or along the data signal paths.

Signal path 2311 is terminated by termination 2350a and signal path 2310 is terminated by termination 2350b. In an embodiment, the impedance of termination 2350a matches the impedance of a portion of the signal path 2311 (multi-drop bus 2320a) on memory module 2310a, (Z0) and the impedance of termination 2350b approximately matches the impedance of a portion of the signal path 2310 (multi-drip bus 2320b) on memory module 2301b (Z1). In an embodiment, impedance Z0 approximately equals impedance Z1. In embodiments, terminations 2350a and 2350b, singly or in combination, are disposed on memory module, buffer devices or packages used to house buffer devices. FIG. 23B illustrates a Stub/Fly-by system 2300b similar to system 2300a except that a single signal path 2320 provides control/address information from master 2101 to memory modules 2301a and 2301b (in particular to integrated circuit buffer devices 101a-d on each memory module). In an embodiment, memory modules 2301a and 2301b include stubs/internal signal paths (multi-drop bus) 2320a-b coupled to a single common signal path 2320 that are disposed on memory modules 2301a-b. In an embodiment, a portion of signal path 2320 passes through or includes an interface, such as a socket, used for memory module 2301b. Memory modules 2301a and 2301b are terminated similar to system 2300a.

FIG. 23C illustrates a Serpentine system 2300c similar to system 2300a except that a single signal path 2320 provides control/address information from master 2101 to memory modules 2301a and 2301b (in particular to integrated circuit buffer devices 101a-d on each memory module) without using stubs on respective memory modules as illustrated in FIG. 23B. In an embodiment, a single signal path 2330 couples master 2101 to memory modules 2301a and 2301b. In an embodiment signal path 2330 includes a first external signal path portion between master 2101 and memory module 2301b; a second signal path portion disposed on the memory module 2301b and coupled to the first signal path portion as well as to respective buffer devices 101a-d; a third external signal path portion 2331 coupled to the second signal path portion and also coupled to memory module 2301a; and a fourth signal path portion disposed on the memory module 2301a and coupled to the third signal path portion 2331 as well as to respective buffer devices 101a-d on memory module 2301a. Termination 2350a, in an embodiment, is not disposed on memory module 2301a in order to ensure that memory modules are interchangeable. Termination 2350a may be disposed on a PCB or elsewhere in a system.

FIG. 24A illustrates a Dedicated/Tree system 2400a similar to system 2300a except that memory modules 2401a-b include buffer devices 101a-d that are coupled by way of a tree structure/topology signal path 2413. A tree structure/topology may also be referred to as a "forked," "T" or "hybrid T" topology. In particular, memory module 2401a is coupled to signal path 2311 by signal path 2413a disposed on memory module 2401a that then branches in to signal paths 2413b and 2413c. Signal path 2413b then is coupled to buffer devices 101a and 101b by branches or signal paths 2413d and 2413e. Signal path 2413c, likewise, is coupled to buffer devices 101c and 101d by branches or signal paths 2413f and 2413g. In an embodiment, memory module 2401b has a similar tree structure signal path 2413 to couple buffer devices 101a-d to signal path 2310.

FIG. 24B illustrates a Stub/Tree system 2400b similar to system 2400a shown in FIG. 24A that includes tree structure signal path 2413 in memory modules 2401a-b. System 2400b illustrates signal path 2320 including stubs/signal paths 2320a and 2320b that couple master 2101 to memory modules 2401a and 2401b, respectively. Stub/signal path 2320a is coupled to signal path 2413a disposed on memory module 2401a and stub/signal path 2320b is coupled to signal path 2413a disposed on memory module 2401b.

In embodiments, termination may be disposed on buffers 101a-d, memory modules 2401a-b and/or elsewhere in a system, such as on a PCB.

Figure 25A:
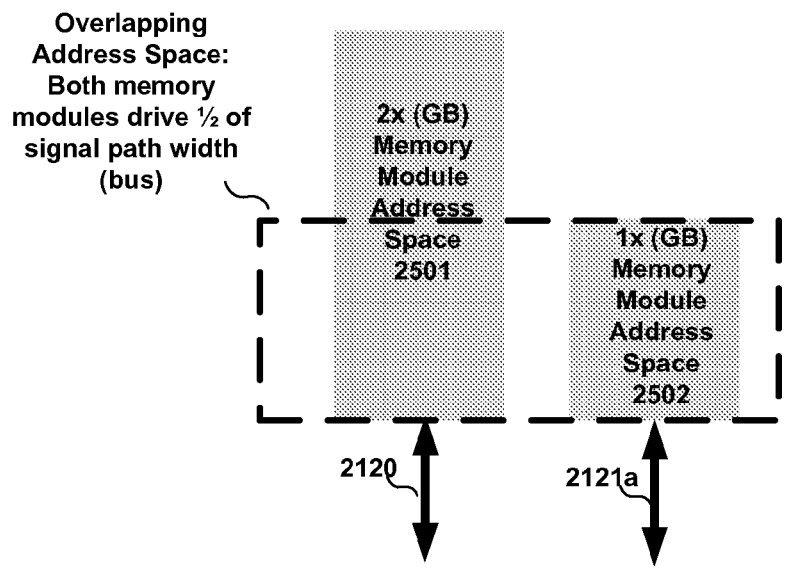
FIGS. 25A-B illustrate memory modules having different sized address spaces, or memory capacity.
Figure 25B:
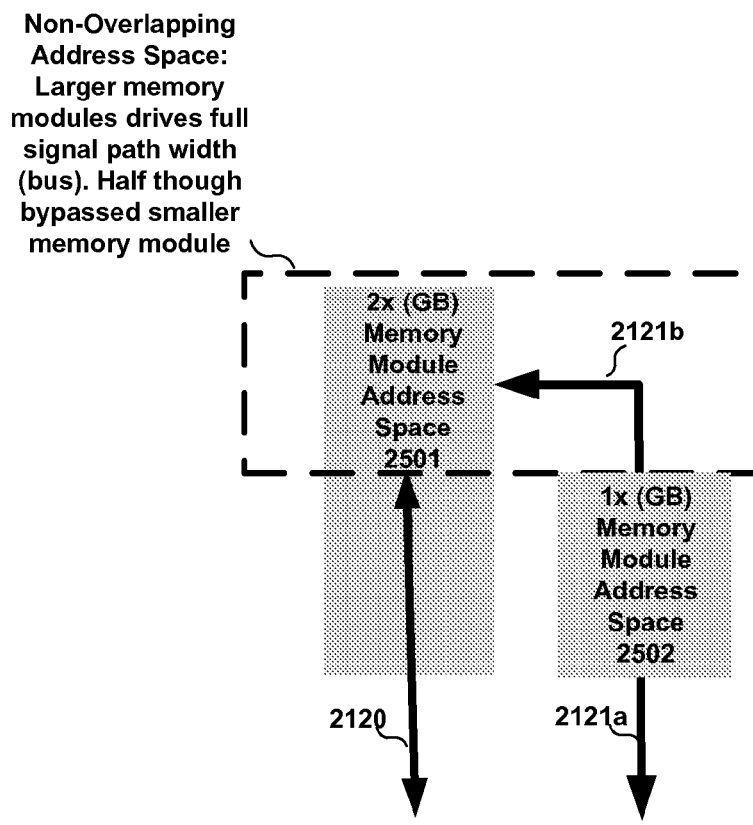

FIGS. 25A-B illustrate memory modules having different memory capacity or different sized address spaces. In particular, memory module address space 2501 on a first memory module is larger than memory module address space 2502 on a second memory module. In an embodiment, memory module address space 2501 is twice as large as memory module address space 2502. For example, memory module address space 2501 may store 2 gigabyte (GB) of information and memory module address space 2502 may store 1 GB of information. Increasing the number or density of integrated circuit memory devices disposed on a memory module may increase address space.

FIG. 25A illustrates how half (or portion) of the available signal path width, for example half of a bus width, is used to access the first half of memory module address space 2501 (overlapping address space) while the other half of the available signal path width is used to access memory module address space 2502.

FIG. 25B illustrates how a larger capacity memory module is able to use a full signal path by accessing a first half (or portion) of the available signal path width coupled directly to the larger capacity memory module and by way of accessing a second half (or portion) of the available signal path width coupled to the smaller capacity memory module using bypassing through the smaller capacity memory module. FIGS. 26-29 illustrate how non-overlap address space of a larger memory module may be accessed in various embodiments.

Figure 26A:
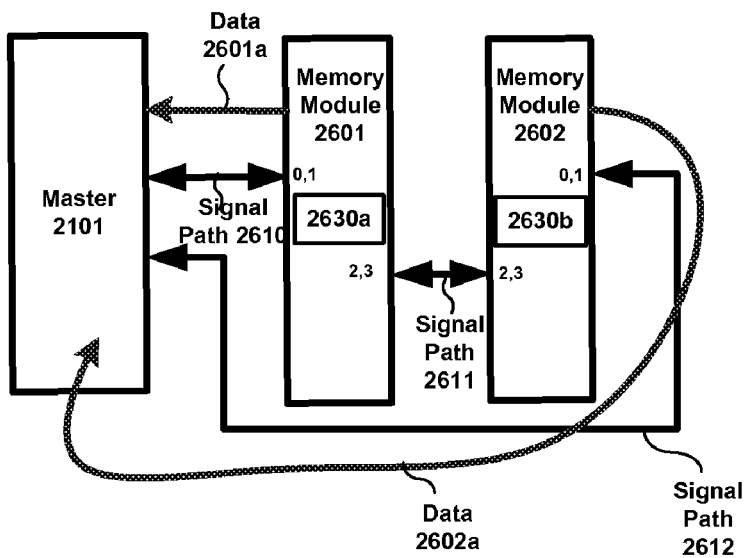
FIGS. 26A-B illustrate a memory system including a master and two memory modules operating during a first and second mode of operation (bypass mode)
Figure 26B:
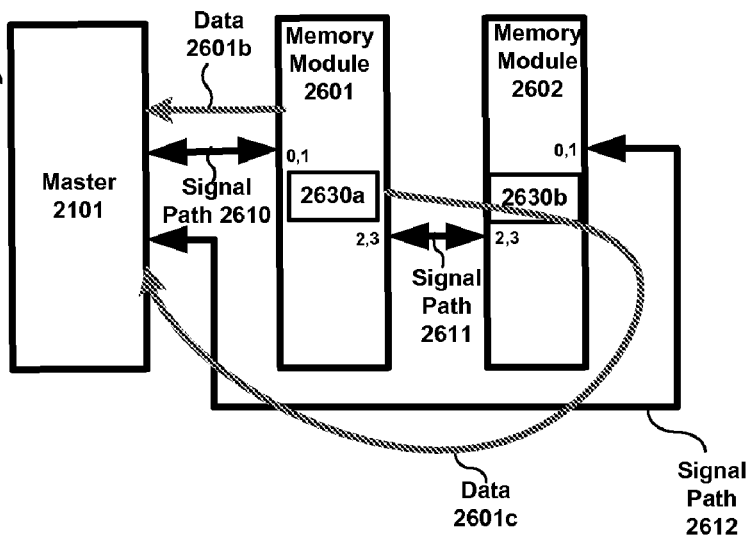

FIGS. 26A-B illustrate a system 2600 to access different sized/capacity (address space) memory modules during different modes of operation, a first mode of operation and a second mode of operation (or bypass mode). System 2600 includes a master 2101 coupled to memory module 2601 by signal path 2610 and memory module 2602 by signal path 2612. Memory modules 2601 and 2602 are coupled by signal path 2611. In an embodiment, memory modules 2601 and 2602 represent memory modules including integrated circuit memory devices and buffer devices as described herein. In an embodiment, memory module 2601 has a larger address space than memory module 2602. In an embodiment, signal paths 2610-2612 are point-to-point links that provide read/write data. In embodiments, control/address/clock information is provided on separate signal paths as described herein. Memory modules 2601 and 2602 may include bypass circuits 2630a-b.

In a first mode of operation (or a non-bypass mode) illustrated in FIG. 26A, read data 2601a (stored in an overlapping address space) is provided on signal path 2610 to master 2101 from memory module 2601 in response to control/address information provided by master 2101 to memory module 2601. Similarly, read data 2602a (stored in an overlapping address space) is provided on signal path 2612 to master 2101 from memory module 2602 in response to control/address information provided by master 2101 to memory module 2602. In the first mode of operation, signal path 2611 is not used.

In a second mode of operation (or a bypass mode) illustrated in FIG. 26B, read data 2601b (stored in a non-overlapping address space of memory module 2601) is provided on signal path 2610 to master 2101 from memory module 2601 in response to control/address information provided by master 2101 to memory module 2601. Read data 2601c (stored in a non-overlapping address space of memory module 2601) is provided on signal path 2611 to memory module 2602 in response to control/address information provided by master 2101 to memory module 2601. Bypass circuit 2630b then provides read data 2601c to signal path 2612 and eventually to master 2101.

Write data from master 2101 may be provided to memory modules 2601 and 2602 similar to how read data is obtained during a first and second mode of operation.

In embodiments, modes of operation are determined in response to a control signal from master 2101, or other circuit or in response to reading configuration information stored in a separate storage circuit in a device, such as an SPD device or register on the buffer or controller device, disposed on system 2600. Modes of operation may be determined at initialization, periodically or during calibration of system 2600.

In embodiments, bypass circuits 2630a-b (as well as bypass circuits 2630c-d shown in FIG. 27) correspond to bypass circuit 2900 as described below and shown in FIG. 29 and/or bypass circuit 1898 shown in FIG. 18. In embodiments, these bypass circuits can be incorporated on the buffer devices on the module.

Figure 27:
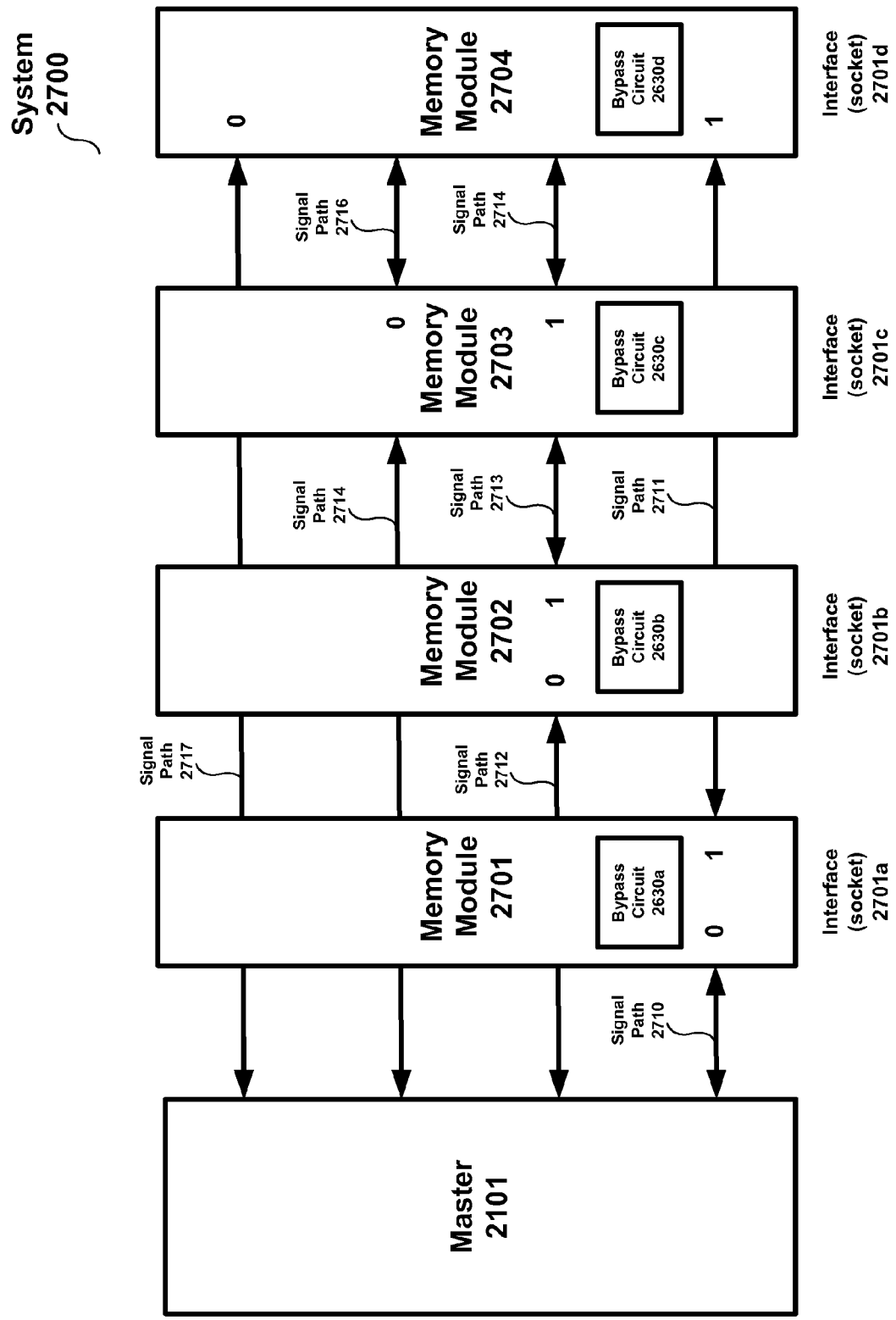
FIG. 27 illustrates a memory system including a master and at least four memory modules.

FIG. 27 illustrates a system 2700 including master 2101 coupled to at least four memory modules 2701-2704 by way of interfaces 2701a-d. In an embodiment, interfaces 2701a-d are female sockets disposed on a substrate, such as a backplane, motherboard or PCB, to receive male edge interfaces of memory modules 2701-2704. In an embodiment, memory modules 2701-2704 represent memory modules including integrated circuit memory devices and buffer devices as described herein as well as at least one of bypass circuits 2630a-d.

Master 2101 is coupled to memory module 2701 by signal path 2710. Signal path 2711 couples memory module 2701 to memory module 2704. In an embodiment, bypass circuit 2630a allows read and write data to be transferred between signal paths 2711 and 2710 either to or from master device 2101 in response to control/address information provided to memory module 2704.

Master 2101 is coupled to memory module 2702 by signal path 2712. Signal path 2713 couples memory module 2702 to memory module 2703. Signal path 2714 couples memory module 2703 to memory module 2704. In an embodiment, bypass circuits 2630b and 2630c allow read and write data to be transferred between signal paths 2712 and 2713, as well as signal paths 2713 and 2714, either to or from master device 2101 in response to control/address information provided to memory modules 2702-04.

Master 2101 is coupled to memory module 2703 by signal path 2714. Signal path 2716 couples memory module 2703 to memory module 2704. In an embodiment, bypass circuit 2630c allows read and write data to be transferred between signal paths 2714 and 2716 either to or from master device 2101 in response to control/address information provided to memory modules 2703-04.

Master 2101 is coupled to memory module 2704 by signal path 2717. In an embodiment, read and write data is transferred on signal path 2717 to or from master device 2101 in response to control/address information provided to memory module 2704.

FIGS. 28A-B illustrate a system 2700 to access different capacity/sized (address space) memory modules during different modes of operation that is similar in operation to that of system 2600. FIG. 28A illustrates accessing data in a first mode of operation, such as accessing read data from different sized memory modules that may be disposed in interfaces 2701a-d. Table 2810 illustrates how different sized memory modules may be disposed in respective interfaces 2701a-d during a first mode of operation. For example, interfaces 2701*a-d* may be coupled to all "small" sized memory modules as indicated by the first row of Table 2810. Alternatively, interface 2701*a* may be coupled to a "large" sized memory module; interface 2701*b* may be coupled to a "small" sized memory module; interface 2701*c* may be coupled to a "large" sized memory module; and interface 2701*d* may be coupled to a "small" sized memory module, as indicated by the second from last row of Table 2810.

In a first mode of operation (non-bypass mode) as illustrated by FIG. 28A, data 2810*a* is provided on signal path 2717; data 2820*a* is provided on signal path 2714; data 2830 is provided on signal path 2712; and data 2840 is provided on signal path 2710.

Table 2820 illustrates how different sized memory modules may be disposed in respective interfaces 2701*a-d* during a second mode of operation (bypass mode). For example, interfaces 2701*c-d* may be coupled to "small" sized memory modules and interfaces 2701*a-b* include bypass circuits 2802 and 2801 as indicated by the first row of Table 2820. Alternatively, interface 2701*c* may be coupled to a "large" sized memory module; and interface 2701*d* may be coupled to a "small" sized memory module. Interfaces 2701*a-b* include bypass circuits 2802 and 2801, as indicated by Table 2820.

In a second mode of operation (bypass mode) as illustrated by FIG. 28B, read data 2810*b* is provided on signal path 2717 and read data 2810*c* is provided on signal paths 2711 and 2710 (via bypass circuit 2802). Read data 2820*b* is provided on signal path 2714 and read data 2820*c* is provided on signal paths 2713 and 2712 (via bypass circuit 2801).

In embodiments, bypass circuits 2801 and/or 2802 are disposed in a continuity module, integrated circuit buffer device, interface (for example a socket) and/or memory module. In an embodiment, bypass circuits 2801 and 2802 are conductive elements, such as metal traces or wires that may be disposed manually on an interface or memory module. In an embodiment, bypass circuits 2801 and 2802 correspond to bypass circuit 2900 shown in FIG. 29.

Figure 29:
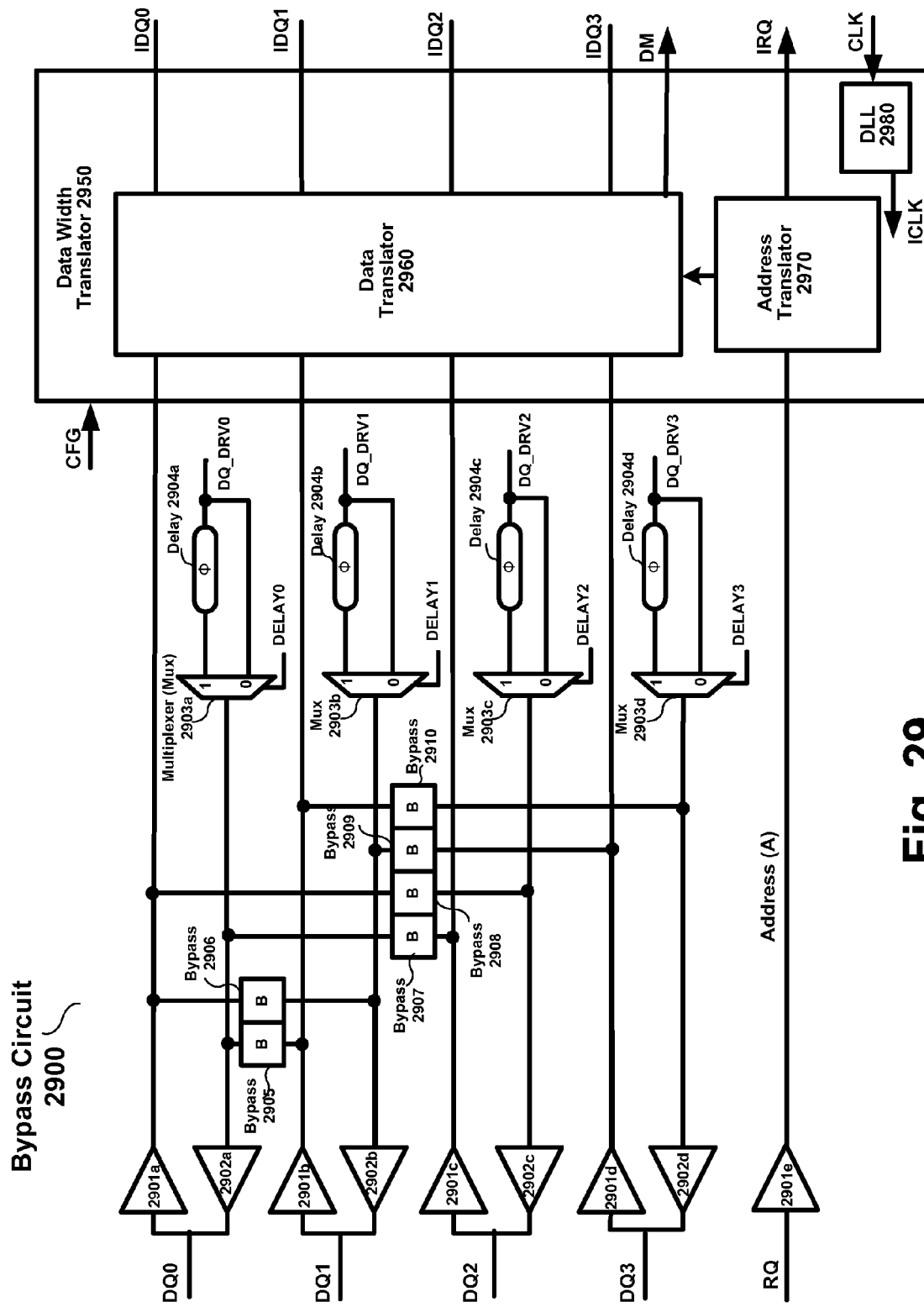
FIG. 29 illustrates a bypass circuit.

FIG. 29 illustrates a bypass circuit 2900 used in a write operation according to an embodiment. Bypass circuit 2900 includes receiver and transmitter circuits 2901*a-e* and 2902*a-d* coupled to a signal path including signal paths DQ[0:3] and RQ. In an embodiment, bypass circuit 2900 is included in an integrated circuit buffer device, such as corresponding to bypass circuit 1898 in buffer interface 1103*a*, disposed on a memory module and/or corresponding to bypass circuits 2630*a-d* shown in FIGS. 26A-B and 27. For example, signal paths DQ[0:1] are coupled to connector interface portion 920*a* and signal paths DQ[2:3] are coupled to connector interface portion 920*b* as shown in FIGS. 20A-B. In an embodiment, signal paths DQ[0:1] are coupled to an adjacent master or memory module and signal paths DQ[2:3] are coupled to a memory module in a memory system.

Receiver circuits 2901*a-d* receive write data signals from signal paths DQ[0:3] and provide write data to data width translator circuit 2950 and/or back out to a signal path by way of transmitters 2902*a-d* and bypass elements 2905-2910. Receiver circuit 2901*e* receives write address signals from signal path RQ and provides write addresses to data width translator circuit 2950. Receiver circuit 2901*a* is coupled to bypass elements 2906 and 2908 to reroute received data signals to transmitter circuits 2902*b* and 2902*c* in response to control signals (not shown) provided to bypass elements 2906 and 2908. Receiver circuit 2901*b* is coupled to bypass elements 2905 and 2910 to reroute received data signals to transmitter circuits 2902*a* and 2902*d* in response to control signals (not shown) provided to bypass elements 2905 and 2910. Receiver circuit 2901*c* is coupled to bypass element 2907 to reroute received data signals to transmitter circuit 2902*a* in response to control signals (not shown) provided to bypass element 2907. Receiver circuit 2901*d* is coupled to bypass element 2909 to reroute received data signals to transmitter circuit 2902*b* in response to control signals (not shown) provided to bypass element 2909.

As can be seen, write data may be rerouted from a single signal path DQ0 to another single signal path DQ1. Write data may be also rerouted from two signal paths DQ0 and DQ1 to signal paths DQ2 and DQ3.

In an embodiment, bypass elements 2905-2910 function independently as respective switches to allow a signal (represented by a voltage level) to be passed from a receiver circuit to a transmitter circuit. In an embodiment, bypass elements 2905-2910 are semiconductors such as negative and/or positive-channel metal-oxide (NMOS/PMOS) semiconductors with a control signal (such as a voltage) provided to a gate of the semiconductor while a source and/or a drain is coupled to a transmitter and/or receiver circuit. In an alternate embodiment, other types of semiconductors or switches may be used. In an embodiment, control signals (not shown) provided to bypass elements 2905-2910 are provided by master 2101 or from a programmable register, such as an SPD device. In an embodiment, control signals are provided by a master after reading memory capacity information of memory modules stored in one or more SPD devices. In an embodiment, control signals provided to bypass elements may be provided in response to a manual jumper, programmable fuse or register. In an embodiment, control signals provided to bypass elements may be provided by one or more integrated circuit buffer devices in response to one or more integrated circuit buffer devices reading a received address/control information. For example, when an address is received that identifies a memory location that is not provided on a particular memory module (non-overlapping address space or smaller capacity memory module), control signals are provided to bypass elements from the integrated circuit buffer device that received the address/control information (in a bypass mode) to enable data to be rerouted from the larger capacity memory module to another destination, such as a master.

In an embodiment, bypass elements 2905-2910 may be disposed before or left of receiver and transmitter circuits 2901*a-d* and 2902*a-d* as well as in or after (right of) data width translator circuit 2950 (for example, after a clock barrier or boundary). Bypass elements 2905-2910 may be disposed in a master, an interface (such as a socket) and/or a memory module (outside of a buffer device). Bypass elements 2905-2910 may also be disposed internal to an integrated circuit buffer, as opposed to an interface of an integrated circuit buffer device, or in an integrated circuit memory device.

In an embodiment, rerouted write data may be resynchronized by a transmitter circuit using a different or the same clock signal that is used by the receiver circuit in receiving the read data. Also, write data that has been rerouted by bypass elements may be transmitted in a fast analog mode.

Stored read data from integrated circuit memory devices disposed on a memory module are provided on signal paths DQ_DRV[0:3] by way of an integrated circuit buffer device. Read data is levelized or delays are provided to the read data by a selector circuit, such as multiplexers (mux) 2903*a-d*, and delay circuits 2904*a-d* in response to DELAY[0:3] control signals. Signal paths DQ_DRV[0:3] are input to delay circuits 2904*a-d* and a first input ("0 input") of mux 2903*a-d*, while an output of delay circuits 2904*a-d* is provided to a second input ("1 input") of mux 2903*a-d*. DELAY[0:3] control signals select an output of mux 2903*a-d* or whether a delay is introduced into read data on signal paths DQ_DRV[0:3]. In an embodiment, delay circuits 2904*a-d* may introduce a programmable delay in response to a control signal (not shown). Control signals provided to delay circuits 2904*a-d* as well as DELAY[0:3] control signals may be provided similar to control signals provided to bypass elements 2905-2910 as described above.

In an embodiment, delay circuits 2904*a-d* are inverters, registers and/or a series of inverters and/or registers that may introduce programmable delay to a read signal on signal paths DQ_DRV[0:3]. The amount of delay provided to read data by delay circuits 2904*a-d* may be longer than the amount of time for providing read data to delay circuits 2904*a-d*, or longer than a data cycle time.

In an embodiment, multiplexers 2903*a-d* and delay circuits 2904*a-d* may be disposed before or left of receiver and transmitter circuits 2901*a-d* and 2902*a-d*. For example, multiplexers 2903*a-d* and delay circuits 2904*a-d* may be disposed in a master, interface (such as a socket) and/or memory module. In an embodiment, multiplexers 2903*a-d* and delay circuits 2904*a-d* may be disposed in data width translator circuit 2950 and/or left of data width translator circuit 2950. For example, multiplexers 2903*a-d* and delay circuits 2904*a-d* may be disposed internal to an integrated circuit buffer, as opposed to an interface of an integrated circuit buffer device, or in an integrated circuit memory device.

Levelization or the amount of delay (if any) provided to read data on signal paths DQ_DRV[0:3] is dependent upon the signal path (between a memory module and a master) used by a system to provide the read data to the master (or flight time or amount of time to transfer read data from a memory module to a master and/or another memory module). For example in a system 2600 shown in FIG. 26B, delay is introduced into data 2601*b* so that data 2601*b* arrives at master 2101 at the approximate same time data 2601*c* arrives at master 2101 because data 2601*c* travels a longer path (as compared to data 2601*b*) on signal paths 2611 and 2612 as well as through memory module 2602 (or at least through an integrated buffer device/interface of memory module 2602).

Data width translator circuit 2950 may be configurable to translate data of various widths into data suitable for a fixed-width memory die or device disposed on a memory module. Data width translator circuit 2950, in accordance with some embodiments, uses a data-mask signal to selectively prevent memory accesses to subsets of physical addresses. This data masking divides physical address locations of the memory die into two or more temporal subsets of the physical address locations, effectively increasing the number of uniquely addressable locations in a particular memory die. As used herein, the term "width" refers to the number of bits employed to represent data.

A data width translator circuit 2950 allows memory modules, such as memory modules 2601 and 2602, to vary the effective width of their external memory module interfaces without varying the width of the internal memory device/die interfaces. A memory system thus may support a first mode of operation and a second mode of operation (bypass mode). In the bypass mode of operation, memory module 2601 uses both signal path 2610 and signal paths 2611 and 2612 (via memory module 2602).

In accordance with an embodiment, data width translator circuit 2950 can translate data of width one, two, or four on signal paths DQ[0:3] into four-bit-wide data on signal path IDQ[0:3]. Address translator circuit 2970 translates address signals on signal path RQ to signal path IRQ which is coupled to one or more memory devices. This flexibility allows one or a combination of memory modules to be used in an extensible point-to-point memory topology. Similarly, data width translator circuit 2950 can translate data of width one, two, or four on signal paths IDQ[0:3] into four-bit-wide data on signal path DQ[0:3].

Data width translator circuit 2950 includes a data translator circuit 2960, an address translator circuit 2970, and a DLL 2980. DLL 2980 produces an internal differential clock signal ICLK locked (or having a temporal relationship) to a like-identified incoming differential clock signal CLK, typically from an associated master or a clock-generator device. Though not shown, a memory device disposed on a memory module may receive the same or a similar clock signal CLK from data width translator circuit 2950 or a master. Data translator circuit 2960 and address translator circuit 2970, responsive to a configuration signal CFG, translate the data on one, two, or four of data signal paths DQ[0:3] into four-bit-wide data on signal paths IDQ[0:3] for write cycles; and conversely translate four-bit-wide data on signal paths IDQ [0:3] into one, two, or four-bit-wide data on one or more of external signal paths DQ[0:3] for read cycles. In one embodiment, plugging a second memory module into a two-connector mother board automatically asserts configuration signal CFG, causing each of two memory modules to configure themselves as half-width (e.g., two bits instead of four) modules. In other embodiments, configuration signal CFG comes from a register on a memory module (e.g., within data width translator circuit 2950) that is addressable by a master and is set, such as via the BIOS, at boot time. In other embodiments, a configuration signal CFG is provided after reading values stored in a SPD device. In general, an external memory module interface conveys data signals of data-width N, an internal memory device interface conveys signals of data-width M, and configuration signal CFG is indicative of the ratio of N to M. Some embodiments use a PLL instead of DLL 2980.

Figure 30A:
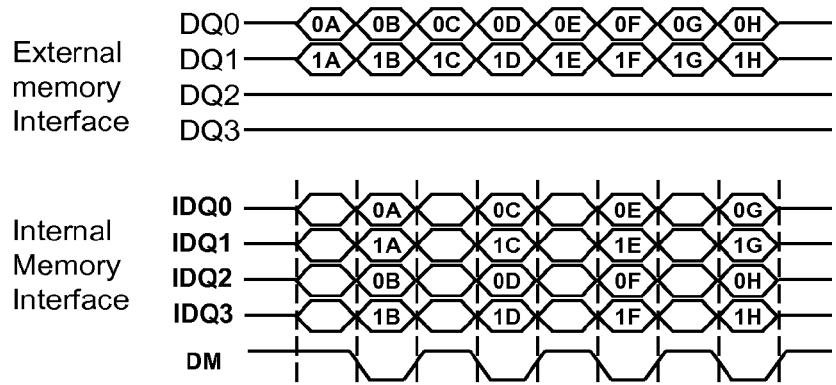
FIGS. 30A-B illustrate timing diagrams for an integrated circuit buffer device.
Figure 30B:
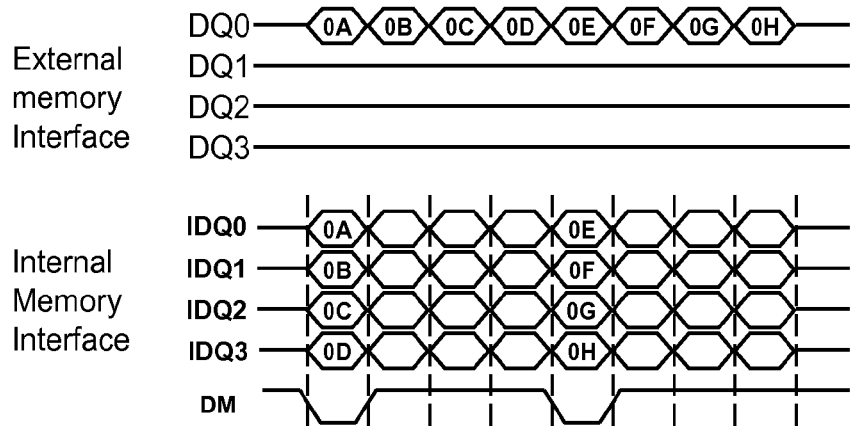

A fixed-width memory device disposed on a memory module may include a mask line/signal path or pin that can be used in support of partial-write operations. For example, double data rate "DDR" memory die include a data-mask pin DM and single data rate "SDR" memory die include a data-mask pin DQM. Memory modules detailed herein may employ data-mask functionality to create variable-width modules using fixed-width memory devices. In an embodiment, a data-mask signal DM is output from data translator circuit 2960 to one or more memory devices in order to synchronize write operations. FIGS. 30A-B, described below, illustrate a write operation using data width translator circuit 2950 in an embodiment.

In an embodiment, bypass circuit 2900 includes bypass elements 2905-2910 and not multiplexers 2903*a-d* and delay circuits 2904*a-d*. In an alternate embodiment, bypass circuit 2900 includes multiplexers 2903*a-d* and delay circuits 2904*a-d* and not bypass elements 2905-2910. For example, memory module 2601 shown in FIG. 26B, and in particular bypass circuit 2630*a*, may include multiplexers 2903*a-d* and delay circuits 2904*a-d* to provide a delay to data 2601*a* and not bypass elements 2905-2910. Conversely, memory module 2602, and in particular bypass circuit 2630*b*, may include bypass elements 2905-2910 to reroute data 2601*c* but not multiplexers 2903*a-d* and delay circuits 2904*a-d* to provide a delay. In an embodiment, bypass circuit 2900 is disposed in a memory system that does not include an integrated circuit buffer device.

FIGS. 30A-B illustrate a pair of timing charts 3000 and 3001 depicting the operation of a memory system, or memory module, using data width translator circuit 2950 in a first mode of operation and a second mode of operation (bypass mode). Data to be written to a common address A in a single memory device disposed on a memory module may be transmitted over external signal paths DQ[0:3] as four eight-symbol bursts (a single eight-symbol burst 0A-0H on signal path DQ0 is shown in FIG. 30B) and an address A on signal path RQ. For example, signal path DQ0 conveys eight binary symbols 0A through 0H for storage at physical address location A in a fixed width memory device on the memory module. In embodiments, the three remaining signal paths DQ[1:3] likewise may convey eight symbols for storage at address location A. When all signal paths DQ[0:3] are used, the total number of symbols to be stored at a given address A may be thirty-two (four times eight). Data width translator circuit 2950 may convey the thirty-two symbols and corresponding address A to a memory device via signal paths IDQ[0:3] and IRQ. The burst length can be longer or shorter in other embodiments.

In an embodiment, data width translator circuit 2950 uses mask signal DM to divide the addressed physical locations in a fixed-width memory device into subsets of memory locations addressed separately in the time domain, a process that may be referred to as "time slicing." For example, a most significant bit(s) (MSB(s)), or any other bits in address A, causes data translator circuit 2960 (via a signal from address translator circuit 2970 to data translator circuit 2960) to assert a mask signal DM (DM=1) to block writes to a first set of locations having address A, and then de-asserts mask signal DM (DM=0) to allow writes to the second set of locations having address A. This process then may repeat.

FIG. 30A illustrates how data provided from two external signal paths DQ[0:1] is output on signal paths IDQ[0:3] by data width translator circuit 2950 in a bypass mode of operation (i.e. memory modules 2701 and 2702 are bypassed as illustrated in FIGS. 27 and 28B). In an embodiment, signal path DQ0 is included in signal path 2717 and signal path DQ1 is included in signal path 2711. Data 0A-0H is provided on signal path 2717 from master 2101 while data 1A-1H is also provided by master 2101 on signal path 2711 via memory module 2701 and signal path 2710.

In an embodiment, the address space in memory module 2704 (i.e. memory devices) is bisected in the time domain. One of the external address bits of address A is employed to assert mask signal DM every other time slot. In this embodiment, the MSB of the external address A is zero, so mask signal DM is deasserted for every time slot MSB=0 to allow writes during those time slots.

FIG. 30B illustrates how data provided from an external signal path DQ0 (or signal paths DQ[0:3]) is output on signal paths IDQ[0:3] by data width translator circuit 2950 in a non-bypass mode of operation (i.e. data is provided to each of the memory modules/sockets as illustrated in FIGS. 27 and 28A). In an embodiment, signal path DQ0 is included in signal path 2717. Data 0A-0H is provided on signal path 2717 from master 2101. Similarly, other data may be provided from master 2101 to memory modules 2701-2703 on signal paths DQ1, DQ2 and DQ3 that are included in signal paths 2710, 2712 and 2714.

Figure 31:
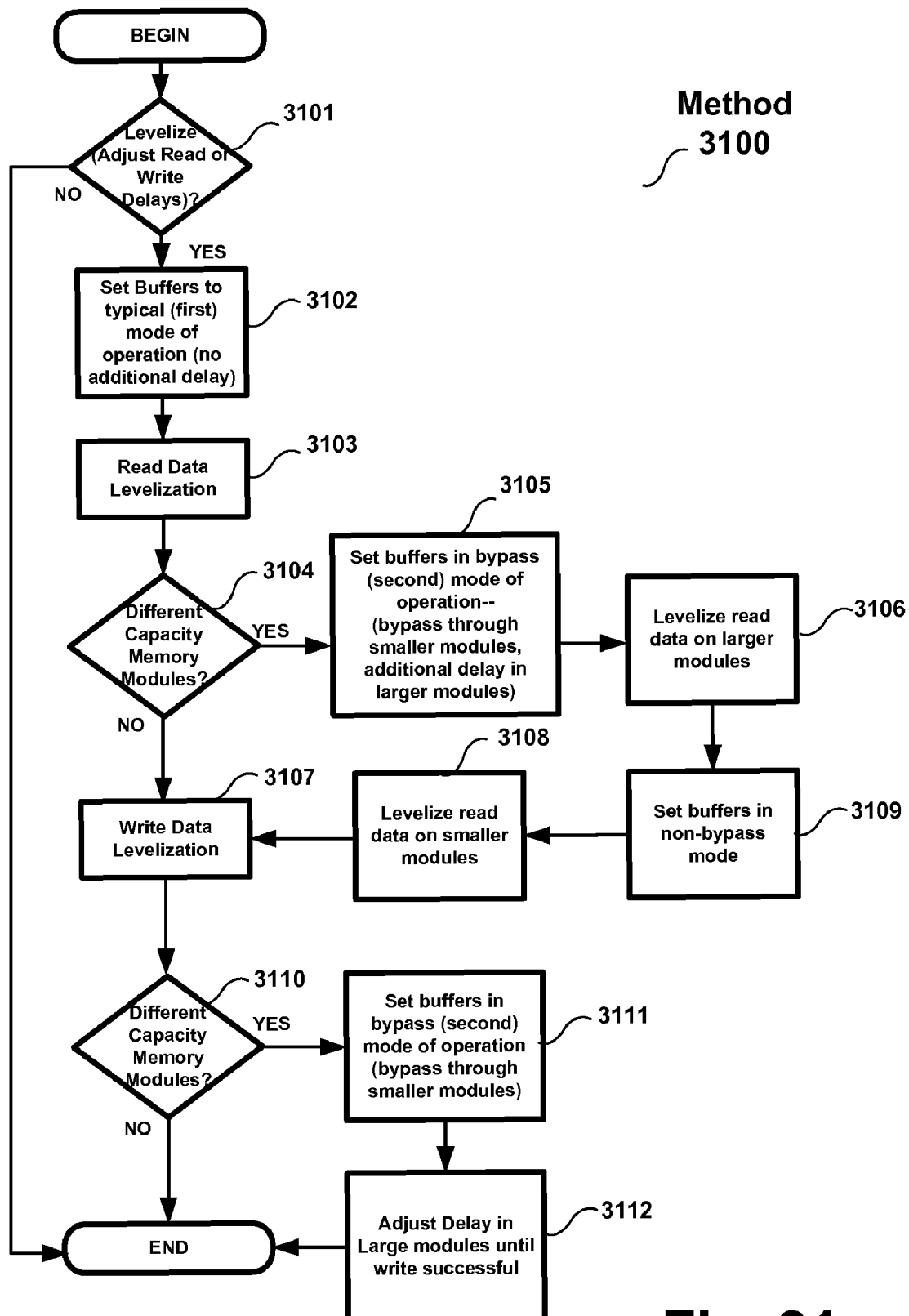
FIG. 31 illustrates a method to levelize memory modules according to an embodiment.

FIG. 31 illustrates a method 3100 to adjust read and write data delays in a system including memory modules having different capacity and a bypass circuit. In embodiments, logic blocks illustrated in FIGS. 31 and 40 are carried out by hardware, software or a combination thereof. In embodiments, logic blocks illustrated in FIGS. 31 and 40 illustrate actions or steps. In embodiments, the circuits and/or systems illustrated herein, singly or in combination, carry out the logic blocks illustrated in FIGS. 31 and 40. Other logic blocks that are not shown may be included in various embodiments.

Similarly, logic blocks that are shown may be excluded in various embodiments. Also, while methods 3100 and 4000 shown in FIGS. 31 and 40 are described in sequential logic blocks, steps or logic blocks of methods 3100 and 4000 are completed very quickly or almost instantaneously.

Method 3100 begins at logic block 3101 where a determination is made whether to levelize or adjust delays to read and write data in a memory system. In an embodiment, this determination may be made at initialization, periodically or during calibration (testing). If levelization is not desired, method 3100 ends. Otherwise, integrated circuit buffer devices are set to a typical or first mode of operation as illustrated by logic block 3102. In an embodiment, a control signal from a master, such as master 2101 shown in FIG. 26A-B, generates a control signal to memory modules, and in particular to integrated circuit buffer devices of the memory modules to operate in a first mode of operation which includes providing read and write data on separate signal paths (signal paths 2610 and 2612) to or from a master as illustrated in FIG. 26A. In the first mode of operation, no additional delay is provided to read and write data, as compared to the second mode of operation described below.

Logic block 3103 illustrates levelizing read data or providing delays to read data to take into account different flight times or distances the read data must travel on different signal paths in reaching a master. For example, signal path 2612 has a longer signal path than signal path 2610. Therefore, in order for read data 2601a and 2602a from both memory modules 2601 and 2602 to reach master 2101 at the approximate same time, a delay should be introduced into the read data 2601a to account for the longer flight time or distance of signal path 2612. In an embodiment, delays are provided in response to delay values stored in registers on the integrated circuit memory devices and programmed by the master. In alternate embodiments, delays corresponding to respective memory modules are provided and programmed in the master. Test symbols or test data may be written and read from the integrated circuit memory devices to determine the programming of the delay values.

A determination is then made whether a memory system includes different capacity memory modules as illustrated by logic block 3104. If different capacity memory modules are not present, control transitions to logic block 3107. Otherwise, control transitions to logic block 3105. In an embodiment, the determination illustrated by logic block 3104 may be completed by a master reading configuration information of a system stored in an SPD.

Integrated circuit buffer devices are then set to a second mode of operation (bypass mode) as illustrated in logic block 3105. In an embodiment, the bypass mode of operation is set by providing control signals to a bypass circuit in an integrated circuit buffer device, for example bypass elements 2905-2910 in a bypass circuit 2900 as illustrated in FIG. 29.

Read data from a larger capacity memory module is then levelized as illustrated by logic block 3106. For example, delays are added to read data 2601b of memory module 2601 (larger capacity) as illustrated in FIG. 26B. In an embodiment, Delay[0:3] control signals are provided to multiplexers 2903a-d to select additional delay to data signal on signal path DQ_DRV[0:3] of bypass circuit 2900 shown in FIG. 29. The delay provided in logic block 3106 is in addition to any delay provided in logic block 3103.

Integrated circuit buffers in a smaller capacity memory module are set to a first mode of operation (or a non-bypass mode) as illustrated by logic block 3109. For example, memory module 2602 in FIG. 26A has an integrated circuit buffer device that is set to a typical mode of operation.

Read data levelization for the smaller capacity memory module is then performed as illustrated by logic block 3108.

Write data levelization for data written to memory modules is performed in logic block 3107.

A determination is then made whether a memory system includes different capacity memory modules as illustrated by logic block 3110. If different capacity memory modules are not present, method 3100 ends. Otherwise, control transitions to logic block 3111. In an embodiment, the determination illustrated by logic block 3110 may be completed by a master reading configuration information of a system stored in a SPD.

Integrated circuit buffer devices are then set to a second mode of operation (bypass mode) as illustrated in logic block 3111. In an embodiment, the bypass mode of operation is set by providing control signals to a bypass circuit in an integrated circuit buffer device, for example bypass elements 2905-2910 in a bypass circuit 2900 as illustrated in FIG. 29.

Write data to larger capacity memory modules is then levelized (in addition to the write data levelization illustrated in logic block 3107) as illustrated by logic block 3112. In an embodiment, additional write delays are added, in response to stored write delay values, to the write data at a master, integrated circuit buffer device and/or memory device. Delays to write data may be selected based on whether write data is transferred through a memory module having an integrated circuit buffer device in a bypass mode of operation. For example, write data provided to memory module 2601 on signal path 2610 from master 2101 may be delayed compared to write data provided to memory module 2601 on signal paths 2612 and 2611 (by way of bypass circuit 2630*b*) from master 2101 so that the write data may arrive at approximately the same time.

FIGS. 32A-E, 33A-B, 34 and 35 illustrate at least a portion of memory system topologies including an integrated circuit buffer device 3201 to provide control/address information (RQ) to a plurality of integrated circuit memory devices 101*a-d* as well as transferring data (DQ) between the integrated circuit buffer device 3201 and the plurality of integrated circuit memory devices 101*a-d*. While each of FIGS. 32A-E, 33A-B, 34 and 35 illustrate one or more signal paths to transfer either control/address information (RQ) or data (DQ), other topologies or signal paths in other Figures may be combined and used to transfer control/address information (RQ) and/or data (DQ). For example, FIG. 33A illustrates a fly-by topology having signal paths 3310 and 3310*a-d* that may be used for transferring control/address information (RQ); while data (DQ) may be transferred using a point-to-point (or segmented) topology or signal paths 3410-3413 shown in FIG. 34. Numerous other topology combinations may likewise be used in embodiments.

While topologies are illustrated with memory modules 3200*a-e*, 3300*a-b* and 3400, these illustrated topologies in FIGS. 32A-E, 33A-B and 34 may be used without a memory module. For example, topologies illustrated in FIGS. 32A-E, 33A-B and 34 may be used in an MCP or SIP embodiment. FIG. 35 illustrates a particular topology in MCP device 3500.

In embodiments, a master, such as master 2101 may provide control/address information and data to one or more integrated circuit buffer devices 3201 in a topology illustrated in FIGS. 32A-E, 33A-B and 34. In an embodiment, a clock signal or clock information is provided on signal paths from buffer device 3201 illustrated in FIGS. 32A-E, 33A-B and 34, or on a separate signal path from a clock source, master, buffer device, or along the data signal paths.

In embodiments, termination may be disposed on buffer 3201, memory modules 3200*a-e*, 3300*a-b* and 3400, signal paths, memory devices 101*a-d* and/or elsewhere in a system, such as on an PCB or substrate. In embodiments, termination for the signal paths in the topologies shown in FIGS. 32A-E, 33A-B and 34 may be similarly disposed as shown in FIGS. 2-4, 6-8 and 23A-C. For example, termination 420*a-d* shown in FIG. 4 may be similarly coupled to signal paths 3410-3413 shown in FIG. 34.

FIGS. 32A-E illustrate forked (data and control/address information) topologies between an integrated circuit buffer device 3201 and a plurality of integrated circuit memory devices 101*a-d*. With respect to FIG. 32A, buffer device 3201 is coupled to signal path 3210 disposed on memory module 3200*a* that then branches into signal paths 3210*a* and 3210*d*. Signal path 3210*a* then is coupled to memory devices 101*a* and 101*b* by branches or signal paths 3210*b* and 3210*c*. Signal path 3210*d*, likewise, is coupled to memory devices 101*c* and 101*d* by branches or signal paths 3210*e* and 3210*f*.

Figure 32B:
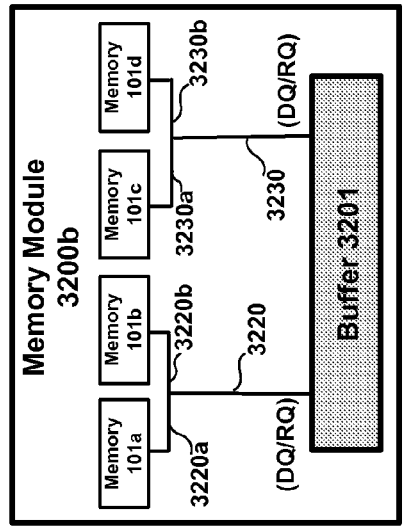
FIGS. 32A-E illustrate tree topologies (data and/or control/address information) between an integrated circuit buffer device and a plurality of integrated circuit memory devices.
Figure 32A:
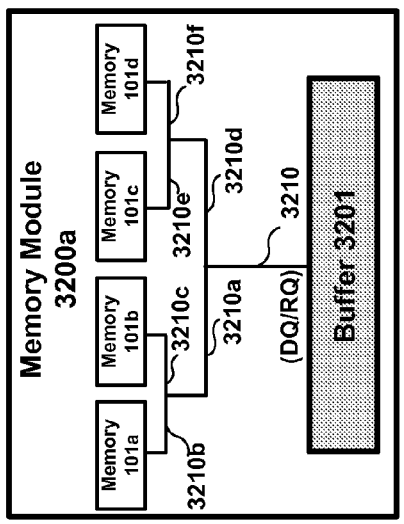

FIG. 32B illustrates a forked topology similar to the topology illustrated in FIG. 32A. Signal path 3220 branches into signal paths 3220*a* and 3220*b* that couple memory devices 101*a-b* to buffer device 3201. Similarly, signal path 3230 branches into signal paths 3230*a* and 3230*b* that couple memory devices 101*c-d* to buffer device 3201.

Figure 32E:
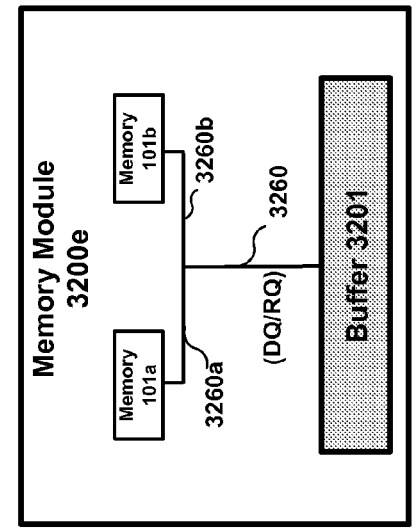
Figure 32D:
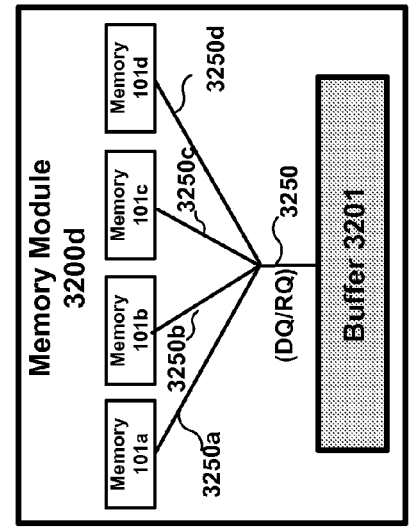
Figure 32C:
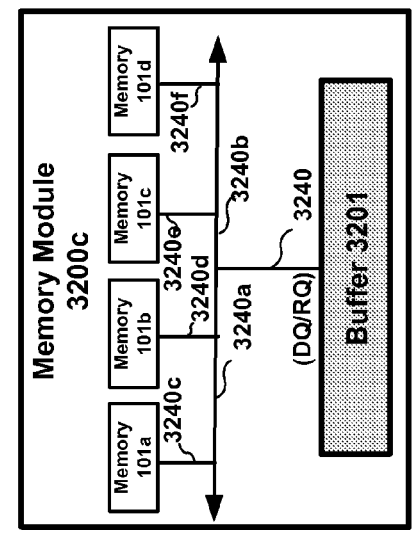

FIG. 32C illustrates a forked/multi-drop bus topology. Buffer device 3201 is coupled to signal path 3240 (or a stub) that branches into signal paths 3240*a* and 3240*b* (or a bus) that are coupled to signal paths (or stubs) 3240*c-f* coupled to memory devices 101*a-d*. Other memory devices may be coupled to signal paths 3240*a-b*.

FIG. 32D illustrates a star topology. Signal path 3250 branches into signal path 3250*a-d* from a common node that couples memory devices 101*a-d* to buffer device 3201.

FIG. 32E illustrates a forked topology similar to the topology illustrated in FIG. 32B. Signal path 3260 branches into signal paths 3260*a* and 3260*b* that couple memory devices 101*a-b* to buffer device 3201.

FIGS. 33A-B illustrate fly-by topologies (data and/or control/address information) between an integrated circuit buffer device 3201 and a plurality of integrated circuit memory devices 101*a-d*. FIG. 33A illustrates a stub/fly-by topology including a buffer device 3201 coupled to a signal path 3310 that is coupled to signal paths (stubs) 3310*a-d* that are coupled to memory devices 101*a-d*. FIG. 33B illustrates a split/stub/fly-by topology. A buffer device 3201 is coupled to a signal path 3320 that is coupled to signal paths (stubs) 3320*a-b* that are coupled to memory devices 101*a-b*. The buffer device 3201 is also coupled to a signal path 3330 that is coupled to signal paths (stubs) 3330*a-b* that are coupled to memory devices 101*c-d*. Split/stub/fly-by topologies may be divided/split into even further sections in embodiments.

FIG. 34 illustrates point-to-point (also known as segmented) topology (data and/or control/address information) between an integrated circuit buffer device 3201 and a plurality of integrated circuit memory devices 101*a-d*. Separate or segmented signal paths 3410-3413 (in particular point-to-point links) couple buffer device 3201 to memory devices 101*a-d*. A segmented topology for data using separate point-to-point links is also illustrated in FIGS. 38-39 described below.

FIG. 35 illustrates an MCP (or SIP) topology (data and/or control/address information) between an integrated circuit buffer die 1100*a* and a plurality of integrated circuit memory dies 1101*a-c*. Device 3500 includes a plurality of integrated circuit memory dies 1101*a-c* and a buffer die 1100*a* housed in or upon a common package 3510 according to embodiments. A plurality of signal paths 3501*a-c* are coupled to a signal path 3502 that provides data between the integrated circuit buffer die 1100a and the plurality of integrated circuit memory dies 1101a-c. Similarly, a plurality of signal paths 3503a-c are coupled to a signal path 3504 that provides control/address information from the integrated circuit buffer die 1100a to the plurality of integrated circuit memory dies 1101a-c. As described above, a plurality of integrated circuit memory dies 1101a-d and buffer die 1100a may be disposed with or without spacers and in multiple package type embodiments.

FIG. 36 is a block diagram of an integrated circuit buffer device 3600 (or a buffer die). Buffer device 3600, includes among other circuit components, interfaces 3601 and 3611, register set 3605, data path 3606, data path router 3610, command decode 3607 and address translation 3608. Buffer device 3600 also includes phase locked loop ("PLL") 3602, Joint Test Action Group or IEEE 1149.1 standard ("JTAG") interface 3603, Inter-IC ("I2C") interface 3604, pattern generator 3609 and internal memory array 3612 circuit components.

In a memory read operation, buffer device 3600 operates similar to buffer 100a shown in FIG. 18. Buffer device 3600 receives control information (including address information) that may be in a packet format from a master on signal path 121 and in response, transmits corresponding signals to one or more, or all of memory devices 101a-d on one or more signal paths 1005. In an embodiment, command decode 3607 and address translation 3608 output control signals to data path 3606, data path router 3610 and interface 3611 so that received read memory commands and received read addresses are decoded and translated to corresponding control/address signals output on signal path 1005. One or more of memory devices 101a-d may respond by transmitting read data to buffer device 3600 which receives the read data via one or more signal paths 1006 and in response, transmits corresponding signals to a master (or other buffer). In an embodiment, data path 3606 and data path router 3610 (in response to control signals) merge separate read data from more than one memory device into a single merged read data or read stream output at interface 3601.

In an embodiment, memory devices 101a-d are configured into memory ranks having segmented (point-to-point) signal paths 1006 and a shared fly-by bus signal path 1005 as illustrated in FIGS. 33A, 34, 38 and 39. A timing chart 3701 shown in FIG. 37B, and described in detail below, illustrates an operation of buffer device 3600 that may increase bandwidth by reducing a time bubble when buffer device 3600 is coupled to ranked memory by segmented signal paths as described below.

In a memory write operation embodiment, buffer 3600 operates similar to buffer 100a. Buffer 3600 receives control information (including address information) that may be in a packet format from a master on signal path 121 and receives the write data for one or more memory devices 101a-d that may be in a packet format from a master on signal path 120a. In an embodiment, command decode 3607 and address translation 3608 output control signals to data path 3606, data path router 3610 and interface 3611 so that received write memory commands and received write addresses are decoded and translated to corresponding control/address signals output on signal path 1005. Buffer 3600 then transmits corresponding signals to one or more, or all of memory devices 101a-d on one or more signal paths 1006 so that the write data may be stored. In an embodiment, data path 3606 and data path router 3610 (in response to control signals) segments or parses received write data into two or more write portions and directs the write portions to the appropriate signal paths 1006 (via interface 3611) so that the write portions will be stored in two or more memory devices. Accordingly, buffer 3600 may receive write data having an associated write address to a particular memory device and parses/segments the received write data into a plurality of different write data portions which are then routed to a plurality of different memory devices at a plurality of different write addresses for storage.

Interfaces 3601 and 3611 correspond to portions of interfaces 1103a and interfaces 1820a-b shown in FIG. 18. For example, interface 3601 may include one or more of transceiver 1875 and receiver circuit 1892 as well as termination 1880. Interface 3611 may include one or more of transceiver 1894 and transmitter circuit 1893. In an embodiment, interface 3611 includes circuits to interface with DDR3 memory devices and interface 3601 includes circuits to interface with DDR2 memory devices or other type of memory device.

In an embodiment, interface 3611 can be segmented into at least three different configurations or segmentation modes: 1) Four 4-bit interfaces (4×4), 2) Two 4-bit interfaces (2×4) or 3) Two 8-bit interfaces (2×8). The different configurations allow flexibility in memory module or memory stack configurations. Accordingly, buffer 3600 may interface with high-capacity or lower-capacity entry level memory modules or in particular memory devices. A four 4-bit interface may be used in high capacity memory modules. A two 8-bit interface may be used for low-cost memory modules. A two 4-bit interface may be used for low-cost memory modules that still support ECC.

The assignment of strobe pins to data pin groupings is adjusted depending upon the segmentation mode:

4×4 segmentation mode:

1 DQS[0]->DQ[3:0]

DQS[1]->DQ[7:4]

DQS[2]->DQ[11:8]

DQS[3]->DQ[15:12]

2×4 segmentation mode:

DQS[0]->DQ[3:0]

DQS[1]->DQ[7:4]

DQS[3:2], DQ[15:8] disabled

2×8 segmentation mode:

DQS[0]->DQ[7:0]

DQS[1]->DQ[15:8]

DQS[3:2] disabled

Interface 3601 enters segmentation modes in response to bit values stored in register set 3605 and/or one or more control signals from address translation 3608.

Data path router 3610 routes read and write data between data path 3606 and interface 3611. Control signals from command decode 3607 and address translation 3608 determine the routing of read/write data. Data path router also receives signals from pattern generator 3609 and internal memory array 3612. In a mode of operation that emulates operation with a memory device, all memory transactions are routed to and from internal memory array 3612 rather than interface 3611. Interface 3611 may be disabled during this mode of operation. In an embodiment, pattern generator 3609 is used as an alternate source of data (or test pattern of data) as well as a source for injecting ECC errors in modes of operation. The test pattern of data may be transmitted on either interface 3601 or interface 3611 or some portion of both simultaneously. Similarly, pattern generator 3609 may insert ECC errors on either interface 3601 or interface 3611 or some portion of both simultaneously. In an embodiment, data path router 3610 includes XOR logic used for ECC error injection. In embodiments, read and write data may proceed through data path 3606 in both directions simultaneously. Modes of operation of buffer 3600 may be entered by setting one or more bit values in multi-bit register set (or storage circuit) 3605.

Data path router 3610 includes a write data router 3610a and read data router 3610b. In an embodiment, write data router 3610a outputs write data in response to a WCLK clock signal while the read data router 3610b outputs read data in response to a RCLK clock signal (either the positive or negative edge of RCLK clock signal). The use of two clock domains may enable the buffer 3600 to reduce latency and/or operate at a higher data rate.

During a typical mode of operation, write data router 3610a receives write data and mask information from data path 3606 and then routes the write data (or portion of the write data) to one of four signal paths 1006 coupled to interface 3611. Similarly during a read operation, read data is received from one of four signal paths 1006 coupled to interface 3611 and routed to data path 3606.

Data path router 3610 includes a plurality of signal paths used to merge read data from different memory devices as well as parse write data into write data portions to be stored in multiple memory devices.

Command decode 3607 includes a decoder to output control signals to data path 3606, address translation 3608 and data path router 3610 in response to control information received by interface 3601 from signal path 121. In embodiments, the control information may include memory transaction commands, such as read or write commands. Other control information may include a command to activate a particular memory bank in a particular memory device or access information having a particular page size. In an embodiment, command decode 3607 may remap/translate a received bank address to a different bank address of one or more memory devices coupled to signal paths 1006.

Address translation circuit 3608 receives an address associated with a particular memory transaction command by way of signal path 121 and interface 3601. For example, address translation circuit 3608 receives an address for reading data associated with a read command for a particular memory device in a particular memory organization (for example, number of ranks, number of memory devices, number of banks per memory device, page size, bandwidth). Address translation 3608 then outputs control signals (or a translated address and/or control signals) to interface 3611 (and signal path 1005) so that the read data may be read from different memory devices (via signal paths 1006) because the memory organization coupled to interface 3611 is different than indicated in the read command. In an embodiment, address translation 3608 may include a storage circuit to store a look-up table for translating addresses. Similarly, write addresses associated with a write command are received by address translation 3608 which outputs control signals (translated write addresses) to interface 3611 and signal path 1006 so that the corresponding write data from data path 3606 may be written to one or more translated write addresses of memory devices coupled to signal paths 1006.

In an embodiment, information in a received row address field is used to output chip select signals. Buffer device 3600 outputs chip select information, such as chip select signals, from interface 3611 to one or more integrated circuit memory devices in response to information in a row address field received at interface 3601. One or more row address bit values may be remapped to chip select signals. For example, values of two particular row address bits may be used to generate four one-hot chip select signals from interface 3611 to four or more integrated circuit memory devices.

In an embodiment, information in a received row address field and received chip select signals are used to output chip select signals. Buffer device 3600 receives chip select information, such as chip select signals (via interface 3601) and information in row address fields to generate one or more chip select signals from interface 3611 to a plurality of integrated circuit memory devices. For example, two one-hot chip select signals received at interface 3601 along with two bit values in a row address field may be used to output eight chip select signals at interface 3611 to eight integrated circuit memory devices. Similarly, four received chip select signals may be used with one bit value in a row address field to output eight chip select signals from interface 3611.

In an embodiment, information in a bank address field is used to output chip select signals. Buffer device 3600 outputs chip select information from interface 3611 to one or more integrated circuit memory devices in response to the bank address information received at interface 3601. Unused bank address fields/pins at interface 3601 may be used to provide chip select information at interface 3611. For example, interface 3601 may have 5 bank address pins while four integrated circuit memory devices having 8 banks each are coupled to interface 3611. The lower 3 pins, BA[2:0], would identify a particular bank in a particular memory device while the upper two bits BA[4:3] are used to decode/output chip select signals. The four memory devices and buffer device 3600 then may emulate one large memory die with 32 memory banks rather than 4 memory dies having 8 banks each.

In an embodiment, multiple chip select signals may be output simultaneously from interface 3611 to multiple respective memory devices in response to information in a row address field, chip select information and/or bank address information, singly or in combination.

Address translation circuit 3608 includes one or more multiplexers to receive (via interface 3601) information in a row address field, chip select information and/or bank address information and outputs signals to interface 3611 that in turn outputs chips select signals in an embodiment.

One or more column address bit values may be re-tasked/remapped by buffer 3600 to perform time slicing, as described above, in an embodiment. For example, the functions (or portions thereof) of data width translator 2950 may be performed by address translator 3608, command decode 3607, data path 3606 and data path router 3610, singly or in combination. Also, bit values in a column address field may also be used to initiate memory device functions/operations. When information in a column address field are re-tasked and this re-tasking uses lower order bit values, the remaining address bit values may be shifted to fill the lowest order column address bit values output at interface 3611. For example, when bit values in column address A[4:3] in a column address field are remapped to time slice address bits, column address values in column address A[15:5] are shifted to column address A[13:3] to fill the lowest order column address bits.

In an embodiment, column address bit values may not be shifted when column address bit values are used to initiate a memory device operation. For example, a bit value in column address A[10] may be used to trigger an auto-precharge operation in a DDR3 memory device. When time slicing is used as described above, a bit value in column address bit A[10] would be mapped to column address bit A[10] (or not changed) while bit values in column addresses A[15:11] and A[9:5] are shifted to fill the gap caused by re-tasking bit values in column address A[4:3]. Another similar example of not shifting a particular column address value includes a bit value at column address A[12] used to trigger burst chop on column address cycles in a DDR3 memory device. In a burst chop mode of a DDR3 memory device, a portion of the read data (for example the last 4 bits of 8 bit output data) is masked or not output from an integrated circuit memory device.

Buffer device 3600 may remap column bit values used to initiate a memory device operation (i.e., auto-precharge, burst chop, read sequence ordering) to particular column address bit fields. For example, bit values in column address bits A[2:0] are used to define bit ordering from a DDR memory device. Data on each signal line coupled to an integrated circuit memory device will be returned in a different order depending on the column bit values at column address bits A[2:0]. When buffer device 3600 performs time slicing, these column bit values are reassigned to a different value to match a "time" address used to store data and to efficiently move data from an integrated circuit memory device to buffer device 3600. In an embodiment, data path 3606 rearranges the data (from data path router 3610) in response to control signals from address translation circuit 3608 which receives column bit address values at column address A[2:0].

When less data is needed by buffer device 3600 than expected by an integrated circuit memory device, such as in time slicing, the buffer device 3600 may use burst chop to save I/O power from the integrated circuit memory devices. This would be irrelevant of the value of a column address bit A[12] (BCN). The received BCN bit values may be stored in the data path 3605 or command decode circuit 3607 that outputs signals to chop the data as originally requested by way of interface 3601.

In an embodiment, received chip select information and bit values in a received row address fields may be used by buffer device 3600 to assign/remap column bit values in column addresses output at interface 3611.

Address translation circuit 3608 includes one or more multiplexers to receive (via interface 3601) information in a column address fields and reassign/re-task column address bit values during time slicing and/or otherwise as describe above.

Buffer device 3600 may receive row address values or chip select information that then may be used to configure a memory system that accesses different sized/capacity (address space) memory modules during different modes of operations as described above in regard to FIGS. 25-29. For example, row address values or chip select information may be used to select whether particular signal path widths are used in accessing different sized memory modules during different modes of operation as illustrated in FIGS. 25A-B. In another example, row address values or chip select information may be used to configure bypass circuit 2900 shown in FIG. 29, such as enabling or disabling bypass paths (i.e. via bypass elements 2905-2910) as well as selecting delay multiplexers (i.e. outputting appropriate DELAY[0:3] control signals) shown in FIG. 29.

In embodiments, buffer 3600 may include JTAG 3603 and/or I2C 3604 interfaces/circuits for accessing bit values in register set 3605. JTAG 3603 may include a port having test pins used during testing of buffer 3600. An I2C 3604 may be used for outputting or receiving bit values (by way of an I2C bus) for register set 3605 that outputs control signals to buffer device circuit components in response to stored bit values that may represent particular buffer configurations. In an embodiment, bit values in register set 3605 may be accessed (written/read) directly through interface 3601.

In an embodiment, register set 3605 corresponds to configuration register set 1881 shown in FIG. 18. In an embodiment, registers set 3605 stores one or more bit values that indicate memory system topology so that interface 3611 may be configured accordingly. For example, register set 3605 may include bit values that indicate a number of integrated circuit memory devices selected for a received memory transaction/operation. Buffer device 3600 then may configure interface 3611 (in response to register value) in order to match the bandwidth associated with interface 3601.

In an embodiment, register set 3605 may store one or more bit values indicating where to obtain information in received control information (i.e. a request packet) that may be used in determining/remapping and outputting chip select information or signals to one or more integrated circuit memory devices. As described below, information in row address fields, column address fields, bank address fields as well as received chip select signals may be used to decode and output predetermined chip select signals from integrated circuit buffer device 3600 to the plurality of integrated circuit memory devices.

In an embodiment, register set 3605 may store one or more bit values to indicate a number of signal paths (i.e. width), type of signal path topology, a number of signal lines per signal path and/or a number (or existence) of data signal strobe signal lines between integrated circuit buffer device 3611 (in particular interface 3611) and a plurality of integrated circuit memory devices.

In an embodiment, register set 3605 may store one or more bit values to indicate how received column, row and/or bank addresses are reordered and output from buffer device 3600.

PLL 3602 is used to synchronize the timing of receiving and/or transmitting read and write data both internally and externally to buffer 3600. In alternate embodiments, PLL 3602 may be another clock alignment circuit that corresponds to clock circuit 1870 shown in FIG. 18. In an embodiment, PLL 3602 outputs WCLK and RCLK clock signals in response to a clock source that may be provided to buffer 3600.

FIGS. 37A-B illustrate timing diagrams for an integrated circuit buffer device. In particular, FIG. 37A illustrates a timing chart 3700 that identifies when a buffer device, such as buffer device 3600, receives and outputs control/address information as well as receives and outputs read data when using a shared or command data signal path.

Control information, such as commands to activate a memory rank are illustrated by a shaded block $A_n$ that represents the amount of time control signals are provided on a control/address signal path (external (Ext.) RQ or internal (Int.) RQ signal paths) during cycles of a Clock signal. For example, shaded block $A_a$ on a row labeled Ext. RQ represents a buffer device receiving a command to activate a memory rank "a" on an Ext. RQ signal path during a first clock cycle of the Clock signal. Similarly a command to read a particular memory bank is illustrated by shaded blocks $R_n$ on signal paths Ext. RQ and Int. RQ. For example, timing chart 3700 illustrates how a read command $R_a$ is received by a buffer device via signal path Ext. RQ and a command $R_a$ is output a clock cycle later onto signal path Int. RQ. In alternate embodiments, more or less memory commands or control signals may be received and generated.

Similarly, read data transferred on signal paths Ext. DQ and Int. DQ to a memory controller or from a memory rank are illustrated by a shaded block labeled Read Data$_n$. Write data may be similarly transferred.

Signal path Ext. RQ refers to a signal path that provides control/address information from a memory controller to the buffer device. Signal path Int. RQ refers to a signal path that provides control/address information from the buffer device to a plurality of integrated circuit memory devices or memory rank. Signal path Ext. DQ refers to a signal path that provides Read Data$_n$ from the buffer device to the memory controller. Signal path Int. DQ refers to a signal path that provides Read Data$_n$ from a plurality of integrated circuit memory devices or memory rank to the buffer device. In an embodiment, Ext. RQ corresponds to signal path 121 and Int. RQ corresponds to signal path 1005; while Ext. DQ corresponds to signal path 120a and Int. DQ corresponds to signal path 1006.

Timing chart 3700 illustrates that when memory ranks are coupled to the same (or shared/common) signal path that transfers Read Data$_n$, a memory system may have to be more complicated and less efficient. In particular, a shared signal path among memory ranks for transferring Read Data$_n$ may require a memory controller to track accesses to memory ranks and insert bubbles when changing access to different memory ranks. A "bubble" or "time bubble" refers to an amount of idle time a memory controller must insert in transferring data when switching between memory transaction to the same memory rank. For example, a memory controller may have to insert a bubble or idle time when switching from accessing different memory ranks so as to allow the shared or common bus to settle (or allow time for tri-state drivers in a transceiver to switch to an alternate state as well as allow time for another preamble signal) or for noise to dissipate before initiating another memory rank access or (in the case of strobed memory devices) to allow for a strobe preamble. This insertion of bubbles reduces signal path utilization and may lower bandwidth on both internal and external signal paths.

FIG. 37B illustrates a timing chart 3701 that eliminates the need for a memory controller to track memory rank accesses and insert bubbles thereby reducing memory controller complexity and increasing bandwidth. Timing chart 3701 is similar to timing chart 3700 except rather than having a shared signal path for transferring data between a buffer device and memory ranks, segmented signal paths or dedicated signal paths Int. DQ(0)-(7) are provided between the buffer device and each memory rank (8 memory ranks). Bubbles are no longer present on the Ext. DQ signal path as Read Data$_{a-f}$ are provided on separate signal paths Int. DQ(0)-(7) from respective memory ranks.

FIG. 38 illustrates a system 3800 including a buffer device 3600 and a plurality of integrated circuit memory devices 101a-101n organized in different memory ranks (1-4). System 3800 may be included in a memory system including other buffer devices and/or memory controllers as described herein.

A "memory rank" or "rank" refers to a number of integrated circuit memory devices grouped to output a predetermined amount of data bits or blocks of data, such as 72 data bits (64 data bits plus 8 ECC bits provided by an ECC device), onto a signal path during a predetermined period of time. For example a dual rank system (using rank 1 and rank 2 shown in FIG. 38) may provide two 64 data bit blocks from two sets of integrated circuit memory devices, rank 1 and rank 2. In an embodiment, the integrated circuit memory devices may be ×4 memory devices (memory devices that produce 4 bits of data) or ×8 memory devices (memory devices that produce 8 bits of data). In this example, 8×8 memory devices could produce a 64 data bit block or 16×4 memory devices could produce a 64 data bit block. In embodiments, different numbers of ranks may be used.

Buffer device 3600 receives control/address information as well as data from a memory controller via signal paths 120a and 121. In an embodiment, interface 3601 as illustrated in FIG. 36, is used to receive control/address information and write data as well as output read data from integrated circuit memory devices in system 3800. Buffer device 3600 outputs translated (and/or decoded) control/address information as well as selected write data to integrated circuit memory devices 101a-n in memory ranks 1-4 using interface 3611 of buffer 3600.

Interface 3611 is coupled to signal paths 3801-3804 and signal path 3810. Signal paths 3801-3804 are segmented signal paths to transfer read and write data between buffer device 3600 and integrated circuit memory devices in ranks 1-4. Signal path 3801 is coupled to memory devices 101a-n in rank 1. Signal path 3802 is coupled to memory devices 101a-n in rank 2. Signal path 3803 is coupled to memory devices 101a-n in rank 3. Signal path 3804 is coupled to memory devices 101a-n in rank 4. In an embodiment, read and write data is transferred using a segmented topology as illustrated in FIG. 34.

In contrast, signal path 3810 provides control/address information to memory ranks 1-4 on a shared/common signal path 3810, such as a fly-by topology shown in FIG. 33A. Each memory device in each memory rank is coupled to shared signal path 3810. In embodiments, clock signals or clock information may be provided on either signal paths 3801-3804 or signal path 3810 or on another separate signal path.

FIG. 39 illustrates a system 3900 for accessing individual memory devices that function as respective memory ranks. System 3900 illustrates an embodiment similar to system 3800 except that memory devices 3901a-h are included in respective memory ranks. In an embodiment, memory devices 3900a-h are eight ×4 DDR3 memory devices. Accordingly, system 3900 is an eight rank system having respective segmented data signal paths. Segmented signal paths 3904a-h transfer data bits DQ [0:3] between data segment (segmentation) and merge circuit 3902 and respective memory devices 3901a-h. A data mask signal DM is provided to respective memory devices 3901a-h from data segment and merge circuit 3902. Similarly, clock signals or differential strobe signals DQS and DQSN are provided from data segment and merge circuit 3902 for synchronization of data signals. Control/address signals are provided on signal path 3903 that is a shared signal path similar to signal path 3810 shown in FIG. 38.

In an embodiment, data segment and merge circuit 3902 operates similar to one or more circuit components in buffer device 3600 shown in FIG. 36. Data segment and merge circuit 3902 merges read data from a plurality of memory devices 3901a-h onto a single signal path as a read data stream. Likewise, data segment and merge circuit 3902 segments a single write data from a single signal path into multiple write data output to multiple signal paths coupled to multiple memory devices 3901a-h. For example, data segment and merge circuit 3902 may include the functionality of data path circuit 3606, data path router 3610, command decode 3607 and address translation circuit 3608, singly or in combination. In an embodiment, mux control and RQ state information is provided by a control circuit, such as command decode 3607 and address translation circuit 3608 shown in FIG. 36. Mux control and RQ state information determines the source or destination of read/write data.

FIG. 40 illustrates a method 4000 of operation in an integrated circuit buffer device. In an embodiment, buffer device 3600 performs method 4000. Method 4000 begins at logic block 4001 where an integrated circuit buffer device is reset and/or power is provided. In logic block 4002, an integrated circuit buffer device receives first control information that indicates a read operation for a first memory organization. In an embodiment, a master provides the first control information to access a first memory configuration that includes a first predetermined number of memory devices, banks as well as predetermined page length/size and bandwidth. However, the buffer device interfaces with a second different memory organization that may include a second predetermined number of memory devices, banks as well as predetermined page length/size and bandwidth.

A virtual page size/length may be the size of data or memory block that may be used by a processor or memory controller. For example, if a process requests an operating system to allocate 64 bytes, but the page size is 4 KB, then the operating system must allocate an entire virtual page or 4 KB to the process. In embodiments, a physical page size/length may equal the amount of data provided by a memory rank or the amount of data bits available from a plurality of sense amplifiers in one or more banks of one of more integrated circuit memory devices in the memory rank. A virtual page size may equal a physical page size in an embodiment. A memory controller may be able to adjust the virtual page size but not the physical page size.

Logic blocks 4003 and 4004 illustrate outputting second and third control information to a first signal path coupled to first and second integrated circuit memory devices in the second memory organization.

Logic blocks 4005 and 4006 illustrate receiving first and second data from second and third signal paths coupled to the first and second integrated circuit memory devices in the second memory organization.

Logic block 4007 illustrates merging and output read data that includes the first and second read data from the integrated circuit buffer device in response to the first control information.

In an embodiment, one or more logic blocks 4002-4007 may be repeated.

Logic block 4008 illustrates ending method 4000 when power is removed. In alternate embodiments, method 4000 may end without power removed.

A method of operation of a buffer device that transfers write data performs similar steps illustrated in method 4000. However rather than receiving and outputting read data as illustrated by blocks 4005-4007, write data may be segmented and transferred to second and third signal paths in response to first control information.

Signals described herein may be transmitted or received between and within devices/circuits using signal paths and generated using any number of signaling techniques including without limitation, modulating the voltage or current level of an electrical signal. The signals may represent any type of control and timing information (e.g. commands, address values, clock signals, and configuration/parameter information) as well as data. In an embodiment, a signal described herein may be an optical signal.

A variety of signals may be transferred on signal paths as described herein. For example, types of signals include differential (over a pair of signal lines), non-return to zero ("NRZ"), multi-level pulse amplitude modulation ("PAM"), phase shift keying, delay or time modulation, quadrature amplitude modulation ("QAM") and Trellis coding.

In an embodiment employing multi-level PAM signaling, a data rate may be increased without increasing either the system clock frequency or the number of signal lines by employing multiple voltage levels to encode unique sets of consecutive digital values or symbols. That is, each unique combination of consecutive digital symbols may be assigned to a unique voltage level, or pattern of voltage levels. For example, a 4-level PAM scheme may employ four distinct voltage ranges to distinguish between a pair of consecutive digital values or symbols such as 00, 01, 10 and 11. Here, each voltage range would correspond to one of the unique pairs of consecutive symbols.

In an embodiment, a clock signal is used to synchronize events in a memory module and/or device such as synchronizing receiving and transmitting data and/or control information. In an embodiment, globally synchronous clocking is used (i.e., where a single clock frequency source is distributed to various devices in a memory module/system). In an embodiment, source synchronous clocking is used (i.e., where data is transported alongside a clock signal from a source to a destination such that a clock signal and data become skew tolerant). In an embodiment, encoding data and a clock signal is used. In alternate embodiments, combinations of clocking or synchronization described herein are used.

In embodiments, signal paths described herein include one or more conducting elements, such as a plurality of wires, metal traces (internal or external), signal lines or doped regions (positively or negatively enhanced), as well as one or more optical fibers or optical pathways, singly or in combination. In embodiments, multiple signal paths may replace a single signal path illustrated in the Figures and a single signal path may replace multiple signal paths illustrated in the Figures. In embodiments, a signal path may include a bus and/or point-to-point connection. In an embodiment, signal paths include signal paths for transferring control and data signals. In an alternate embodiment, signal paths include only signals paths for transferring data signals or only signal paths for transferring control signals. In still other embodiments, signal paths transfer unidirectional signals (signals that travel in one direction) or bidirectional signals (signals that travel in two directions) or combinations of both unidirectional and bidirectional signals.

It should be noted that the various circuits disclosed herein may be described using computer aided design tools and expressed (or represented) as data and/or instructions embodied in various computer-readable media, in terms of their behavior, register transfer, logic component, transistor, layout geometries, and/or other characteristics. Formats of files and other objects in which such circuit expressions may be implemented include, but are not limited to: formats supporting behavioral languages such as C, Verilog, and HLDL; formats supporting register level description languages like RTL; formats supporting geometry description languages such as GDSII, GDSIII, GDSIV, CIF, MEBES; and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described circuits may be processed by a processing entity (e.g., one or more processors) within the computer system in conjunction with execution of one or more other computer programs including, without limitation, netlist generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The foregoing description of several embodiments has been provided for the purposes of illustration and description. It is not intended to be exhaustive or to limit the embodiments to the precise forms disclosed. Modifications and variations will be apparent to practitioners skilled in the art. The embodiments were chosen and described in order to explain inventive principles and practical applications, thereby enabling others skilled in the art to understand various embodiments and with the various modifications as are suited to the particular use contemplated. It is intended that the scope of the invention be defined by the following claims and their equivalents.

What is claimed is:

1. A system comprising:
    an integrated circuit buffer device including:
        a first interface to receive write data and control information that indicates a write operation;
        a second interface to convey the write data and the control information; and
        a register to store a value that indicates a number of integrated circuit memory devices to receive, in response to the control information, the write data;
    a first integrated circuit memory device to store a first portion of the write data;
    a first signal path coupled to the second interface and the first integrated circuit memory device, the first signal path to convey the first portion of the write data from the integrated circuit buffer device to the first integrated circuit memory device;
    a second integrated circuit memory device to store a second portion of the write data;
    a second signal path coupled to the second interface and the second integrated circuit memory device, the second signal path to convey the second portion of the write data from the integrated circuit buffer device to the second integrated circuit memory device; and
    a third signal path coupled to the integrated circuit buffer device and the first and second integrated circuit memory devices, the third signal path to convey the control information from the integrated circuit buffer device to both the first and second integrated circuit memory devices.

2. The system of claim 1 wherein the control information received at the first interface includes information in an address field, that is used to generate a plurality of chip select signals, each chip select signal of the plurality of chip select signals to select access of a corresponding integrated circuit memory device of the first and second integrated circuit memory devices.

3. The system of claim 2 wherein the address field is selected from the group consisting of a column address field, row address field and a bank address field.

4. The system of claim 1 wherein the integrated circuit buffer device includes at least one register to store information indicating a number of signal paths, a number of signal lines included in each signal path of the number of signal paths and a number of data strobe signals included between the integrated circuit buffer device and each of the first and second integrated circuit memory devices.

5. The system of claim 1 wherein the integrated circuit buffer device includes at least one register to store information indicating a reordering of bit values in an address of the first control information.

6. The system of claim 1 wherein the control information received at the first interface includes a first address,
    wherein the integrated circuit buffer device outputs a second address to a memory location of the first integrated circuit memory device as the control information in response to the first address, and
    wherein the integrated circuit buffer device outputs a third address to a memory location of the second integrated circuit memory device as the control information in response to the first address.

7. The system of claim 1 wherein the integrated circuit buffer device, the first integrated circuit memory device, the second integrated circuit memory device, the first signal path, the second signal path and the third signal path are included on a memory module.

8. The system of claim 1 wherein the integrated circuit buffer device, the first integrated circuit memory device and the second integrated circuit memory device are dies included in a single package housing.

9. The system of claim 1 wherein:
    the integrated circuit buffer device is disposed in a first package housing;
    the first integrated circuit memory device is disposed in a second package housing; and
    the second integrated circuit memory device is disposed in a third package housing,
    wherein the second package housing is stacked on top of the first package housing, and the third package housing is stacked on top of the second package housing.

10. The system of claim 1 wherein:
    the first signal path is a first point to point link coupled between the integrated circuit buffer device and the first integrated circuit memory device;
    the second signal path is a second point to point link coupled between the integrated circuit buffer device and the second integrated circuit memory device; and
    the third signal path is a bus coupled to the integrated circuit buffer device and the first and second integrated circuit memory devices.

* * * * *